(12) United States Patent
Komuro et al.

(10) Patent No.: US 9,164,380 B2
(45) Date of Patent: Oct. 20, 2015

(54) RESIST COMPOSITION AND METHOD OF FORMING RESIST PATTERN

(71) Applicant: Tokyo Ohka Kogyo Co., Ltd., Kawasaki-shi (JP)

(72) Inventors: Yoshitaka Komuro, Kawasaki (JP); Yoshiyuki Utsumi, Kawasaki (JP); Akiya Kawaue, Kawasaki (JP); Toshiaki Hato, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 62 days.

(21) Appl. No.: 13/710,809

(22) Filed: Dec. 11, 2012

(65) Prior Publication Data

US 2013/0189619 A1 Jul. 25, 2013

(30) Foreign Application Priority Data

Dec. 14, 2011 (JP) ................. 2011-273759

(51) Int. Cl.
| G03F 7/004 | (2006.01) |
| G03F 7/039 | (2006.01) |
| G03F 7/20 | (2006.01) |
| G03F 7/30 | (2006.01) |

(52) U.S. Cl.
CPC .............. *G03F 7/0045* (2013.01); *G03F 7/004* (2013.01); *G03F 7/0046* (2013.01); *G03F 7/0392* (2013.01); *G03F 7/0397* (2013.01); *G03F 7/20* (2013.01); *G03F 7/2041* (2013.01); *G03F 7/30* (2013.01)

(58) Field of Classification Search
None
See application file for complete search history.

(56) References Cited

U.S. PATENT DOCUMENTS

| 5,945,517 | A | 8/1999 | Nitta et al. | |
| 6,153,733 | A | 11/2000 | Yukawa et al. | |
| 6,656,660 | B1* | 12/2003 | Urano et al. | 430/270.1 |
| 6,949,325 | B2 | 9/2005 | Li et al. | |
| 2001/0049073 | A1 | 12/2001 | Hada et al. | |
| 2003/0134223 | A1* | 7/2003 | Katano et al. | 430/191 |
| 2004/0110085 | A1 | 6/2004 | Iwai et al. | |
| 2006/0008736 | A1 | 1/2006 | Kanda et al. | |
| 2006/0078821 | A1 | 4/2006 | Shimizu et al. | |
| 2008/0187860 | A1 | 8/2008 | Tsubaki et al. | |
| 2009/0004598 | A1 | 1/2009 | Nakagawa et al. | |
| 2009/0317743 | A1 | 12/2009 | Shiono et al. | |
| 2010/0086873 | A1* | 4/2010 | Seshimo et al. | 430/281.1 |
| 2010/0233626 | A1 | 9/2010 | Shimizu et al. | |
| 2010/0295891 | A1* | 11/2010 | Goto et al. | 347/21 |
| 2010/0310985 | A1* | 12/2010 | Mori et al. | 430/270.1 |
| 2011/0223537 | A1 | 9/2011 | Ebata et al. | |
| 2012/0082936 | A1 | 4/2012 | Serizawa et al. | |
| 2012/0149916 | A1 | 6/2012 | Utsumi et al. | |
| 2014/0113236 | A1 | 4/2014 | Senzaki et al. | |

FOREIGN PATENT DOCUMENTS

| JP | A-06-266100 | 9/1994 |
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2002-131911 | 5/2002 |
| JP | A-2003-241385 | 8/2003 |
| JP | A-2005-336452 | 12/2005 |
| JP | A-2006-106693 | 4/2006 |
| JP | A-2006-259582 | 9/2006 |
| JP | A-2006-317803 | 11/2006 |
| JP | A-2006-343704 | 12/2006 |
| JP | A-2007-106717 | 4/2007 |
| JP | 2008-15247 * | 1/2008 |
| JP | A-2008-089710 | 4/2008 |
| JP | A-2008-292975 | 12/2008 |
| JP | A-2009-191055 | 8/2009 |
| JP | A-2009-209128 | 9/2009 |
| JP | A-2009-274963 | 11/2009 |
| JP | A-2010-002870 | 1/2010 |
| JP | A-2010-210953 | 9/2010 |
| JP | A-2010-250340 | 11/2010 |
| JP | A-2011-051945 | 3/2011 |
| JP | A-2011-170284 | 9/2011 |
| JP | A-2012-121838 | 6/2012 |
| WO | WO 2004/074242 A2 | 9/2004 |
| WO | WO 2010/029965 A1 | 3/2010 |
| WO | WO 2010/147079 A1 | 12/2010 |
| WO | WO 2012/169620 A1 | 12/2012 |

OTHER PUBLICATIONS

Machine-assited English translation of JP2008-15247, as provided by JPO (2008).*
Office Action in Japanese Patent Application No. 2011-273759, mailed May 19, 2015.
Anthracene-9-carboxylic acid(723-62-6)', Chemical Book, [online], [retrieved on May 13, 20 15], URL:http://www.chemicalbook.com/ProductMSDSDetailCB5711497.

* cited by examiner

*Primary Examiner* — Sin Lee
(74) *Attorney, Agent, or Firm* — Knobbe Martens Olson & Bear LLP

(57) ABSTRACT

A resist composition containing a base component (A) that exhibits changed solubility in a developing solution under action of acid, a photoreactive quencher (C), and an acid generator component (B) that generates acid upon exposure, and further containing an acid (G) having a pKa of 4 or less.

6 Claims, No Drawings

RESIST COMPOSITION AND METHOD OF FORMING RESIST PATTERN

BACKGROUND OF THE INVENTION

1. Field of the Invention

The present invention relates to a resist composition and a method of forming a resist pattern that uses the resist composition.

Priority is claimed on Japanese Patent Application No. 2011-273759, filed Dec. 14, 2011, the content of which is incorporated herein by reference.

2. Description of Related Art

In lithography techniques, for example, a resist film composed of a resist material is formed on a substrate, and the resist film is subjected to selective exposure followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization. Typically, these pattern miniaturization techniques involve shortening the wavelength (and increasing the energy) of the exposure light source. Conventionally, ultraviolet radiation typified by g-line and i-line radiation has been used, but nowadays KrF excimer lasers and ArF excimer lasers are starting to be introduced in the mass production of semiconductor elements. Furthermore, research is also being conducted into lithography techniques that use an exposure light source having a shorter wavelength (and a higher energy level) than these excimer lasers, such as extreme ultraviolet radiation (EUV), electron beam (EB), and X-ray.

Resist materials for use with these types of exposure light sources require lithography properties such as a high resolution capable of reproducing patterns of minute dimensions, and a high level of sensitivity to these types of exposure light sources. As a resist material that satisfies these conditions, conventionally a chemically amplified resist composition has been used, which includes an acid generator component that generates acid upon exposure, and a base component that exhibits changed solubility in a developing solution under the action of acid.

Numerous compounds have already been proposed for the acid generator component for chemically amplified resist compositions, including onium salt-based acid generators, oxime sulfonate-based acid generators, diazomethane-based acid generators, nitrobenzylsulfonate-based acid generators, iminosulfonate-based acid generators, and disulfone-based acid generators.

Resins (base resins) are typically used as the base components of chemically amplified resist compositions.

For example, in an alkali developing process where an alkali developing solution is used as a developing solution, a chemically amplified resist composition for forming a positive-type resist pattern typically contains an acid generator component and a resin component that exhibits increased solubility in an alkali developing solution under the action of acid. If the resist film formed using this resist composition is selectively exposed during formation of a resist pattern, then acid is generated from the acid generator component within the exposed portions, and the action of this acid causes an increase in the solubility of the resin component in an alkali developing solution, making the exposed portions soluble in the alkali developing solution. As a result, by performing alkali developing, the unexposed portions remain as a pattern, resulting in the formation of a positive-type pattern.

As the resin component, a resin that exhibits increased polarity under the action of acid is typically used. When the polarity of the resin is increased, the solubility in an alkali developing solution increases. On the other hand, when the polarity is increased, the solubility in an organic solvent decreases, and therefore if a solvent developing process that uses a developing solution containing an organic solvent (an organic developing solution) is employed instead of the alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is sometimes referred to as a negative-type developing process (for example, see Patent Document 1).

Currently, resins that contain structural units derived from (meth)acrylate esters within the main chain (acrylic resins) are widely used as base resins for chemically amplified resist compositions designed for use in ArF excimer laser lithography or the like, as they exhibit excellent transparency in the vicinity of 193 nm (for example, see Patent Document 2). Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

In order to improve the lithography properties and the like, the base resin typically includes a plurality of structural units. For example, in the case of an aforementioned resin component that exhibits increased polarity under the action of acid, typically, a base resin is used that contains a structural unit having an acid-decomposable group that decomposes under the action of the acid generated from the acid generator component, resulting in increased polarity, and also contains a structural unit having a polar group such as a hydroxyl group, and a structural unit having a lactone structure and the like.

One known technique for further improving the resolution is a lithography technique known as liquid immersion lithography (hereafter also referred to as "immersion exposure"), in which exposure (immersion exposure) is conducted in a state where the region between the objective lens of the exposure apparatus and the sample is filled with a liquid (an immersion medium) that has a larger refractive index than the refractive index of air.

By using immersion exposure, it is considered that higher resolutions equivalent to those obtained using a shorter wavelength light source or a higher NA lens can be achieved using the same exposure light source wavelength, with no reduction in the depth of focus. Furthermore, immersion exposure can be conducted using existing exposure apparatus. As a result, it is expected that immersion exposure will enable the formation of resist patterns of higher resolution and superior depth of focus at lower costs, and in the production of semiconductor elements, which requires enormous capital investment, immersion exposure is attracting considerable attention as a method that offers significant potential to the semiconductor industry, both in terms of cost and in terms of lithography properties such as resolution.

Immersion lithography is effective in forming patterns having all manner of shapes. Further, immersion exposure is capable of being used in combination with super-resolution techniques such as phase shift methods and modified illumination methods that are currently under investigation. Currently, techniques using an ArF excimer laser as the exposure source are the most actively researched immersion exposure techniques. Further, water is mainly being investigated as the immersion medium.

In recent years, the addition of a photoreactive quencher to a chemically amplified resist composition has also been proposed (for example, see Patent Documents 3 and 4). A photoreactive quencher is a salt formed from an anion and a cation, which, prior to exposure, has a quenching action that traps acid generated from the acid generator or the like via an ion exchange reaction, but which decomposes upon exposure, resulting in a loss of the quenching action. Accordingly, when a resist film formed using a chemically amplified resist composition containing such a photoreactive quencher is subjected to exposure, in the exposed portions, the photoreactive quencher loses its basicity relative to the acid generated from the acid generator or the like, whereas in the unexposed portions, the photoreactive quencher traps the acid, thereby suppressing the diffusion of acid from the exposed portions into the unexposed portions, resulting in improved lithography properties.

DOCUMENTS OF RELATED ART

Patent Documents

[Patent Document 1] Japanese Unexamined Patent Application, First Publication No. 2008-292975
[Patent Document 2] Japanese Unexamined Patent Application, First Publication No. 2003-241385
[Patent Document 3] Japanese Unexamined Patent Application, First Publication No. Hei 06-266100
[Patent Document 4] International Patent Publication No. 2010/147079

SUMMARY OF THE INVENTION

As pattern miniaturization continues to progress, better and better lithography properties are being demanded of resist materials.

Conventional chemically amplified resist compositions containing an added photoreactive quencher exhibit improved lithography properties compared with compositions not containing the photoreactive quencher, but suffer from a number of problems, including poor storage stability and a deterioration in the resist performance such as the lithography properties upon storage.

The present invention takes the above circumstances into consideration, with an object of providing a resist composition which exhibits good lithography properties and excellent storage stability, a method of forming a resist pattern that uses the resist composition, and a novel compound that is useful as the photoreactive quencher used in the resist composition.

As a result of intensive investigation, the inventors of the present invention discovered that the above object could be achieved by combining a photoreactive quencher with an acid having a high acidity with a pKa of 4 or less, and they were therefore able to complete the present invention.

In other words, a first aspect of the present invention is a resist composition containing a base component (A) that exhibits changed solubility in a developing solution under the action of acid, a photoreactive quencher (C), and an acid generator component (B) that generates acid upon exposure, and
further containing an acid (G) having a pKa of 4 or less.

A second aspect of the present invention is a method of forming a resist pattern, the method including: forming a resist film on a substrate using the resist composition of the first aspect, conducting exposure of the resist film, and developing the resist film to form a resist pattern.

The present invention is able to provide a resist composition which exhibits good lithography properties and excellent storage stability, and a method of forming a resist pattern that uses the resist composition.

DETAILED DESCRIPTION OF THE INVENTION

<<Resist Composition>>

The resist composition of the present invention includes a base component (A) (hereafter referred to as "component (A)") that exhibits changed solubility in a developing solution under the action of acid, a photoreactive quencher (C) (hereafter referred to as "component (C)"), an acid generator component (B) (hereafter referred to as "component (B)") that generates acid upon exposure, and an acid (G) (hereafter referred to as "component (O)") having a pKa of 4 or less.

When a resist film formed using this resist composition is subjected to selective exposure during formation of a resist pattern, acid is generated from the component (B), and that acid causes a change in the solubility of the component (A) in a developing solution. As a result, the solubility of the exposed portions of the resist film in a developing solution is changed, whereas the solubility of the unexposed portions in the developing solution remains unchanged, and therefore subsequent developing of the resist film can be used to form a resist pattern, by dissolving and removing either the exposed portions in the case of a positive-type pattern, or the unexposed portions in the case of a negative-type pattern.

In this description, a resist composition in which the exposed portions are dissolved and removed (to form a positive-type pattern) is referred to as a "positive-type resist composition", whereas a resist composition in which the unexposed portions are dissolved and removed (to form a negative-type pattern) is referred to as a "negative-type resist composition".

The resist composition of the present invention may be either a negative-type resist composition or a positive-type resist composition.

Further, the resist composition of the present invention may be used for either an alkali developing process in which an alkali developing solution is used for the developing treatment during formation of the resist pattern, or a solvent developing process in which a developing solution containing an organic solvent (an organic developing solution) is used for the developing treatment.

<Component (A)>

The component (A) is a base component that exhibits changed solubility in a developing solution under the action of acid.

Either a single organic compound typically used as a base component for a chemically amplified resist, or a mixture of two or more such organic compounds, can be used as the component (A).

The term "base component" refers to an organic compound capable of forming a film, and is preferably an organic compound having a molecular weight of 500 or more. When the organic compound has a molecular weight of 500 or more, the film-forming ability is improved, and a nano level resist pattern can be more easily formed.

The organic compounds having a molecular weight of 500 or more that can be used as the base component can be broadly classified into non-polymers and polymers.

In general, compounds which have a molecular weight of at least 500 but less than 4,000 may be used as non-polymers. Hereafter, the term "low molecular weight compound" is used to describe a non-polymer having a molecular weight of at least 500 but less than 4,000.

In terms of the polymers, typically, compounds which have a molecular weight of 1,000 or more may be used. In the following description, the term "polymeric compound" is used to describe a polymer having a molecular weight of 1,000 or more. In the case of a polymeric compound, the "molecular weight" refers to the weight-average molecular weight in terms of the polystyrene-equivalent value determined by gel permeation chromatography (GPC). Hereafter, a polymeric compound may be simply referred to as a "resin".

As the component (A), a resin component which exhibits changed solubility in a developing solution under the action of acid may be used, a low molecular weight compound which exhibits changed solubility in a developing solution under the action of acid may be used, or a combination of the two may be used.

In those cases where the resist composition of the present invention is a resist composition that forms a negative-type pattern in an alkali developing process, a base component that is soluble in an alkali developing solution is typically used as the component (A), and a cross-linking agent is also added to the composition.

The base component that is soluble in an alkali developing solution contains alkali-soluble groups such as a hydroxyl group, carboxyl group or sulfonamide group, and the cross-linking agent has a reactive group that is capable of reacting with these alkali-soluble groups. Accordingly, in this resist composition, when acid is generated from the component (B) upon exposure, the action of the acid causes cross-linking between the base component and the cross-linking agent, and the cross-linked portions become insoluble in an alkali developing solution. As a result, during resist pattern formation, by conducting selective exposure of a resist film obtained by applying the resist composition to a substrate, the exposed portions change to a state that is insoluble in the alkali developing solution, while the unexposed portions remain soluble in the alkali developing solution, meaning alkali developing can be used to form a resist pattern.

Generally, a resin that is soluble in an alkali developing solution (hereafter referred to as an "alkali-soluble resin") is used as the base component that is soluble in an alkali developing solution.

Examples of the alkali-soluble resin include a resin having a structural unit derived from at least one of an α-(hydroxyalkyl)acrylic acid and an alkyl ester of an α-(hydroxyalkyl) acrylic acid (preferably an alkyl ester having 1 to 5 carbon atoms), as disclosed in Japanese Unexamined Patent Application, First Publication No. 2000-206694; an acrylic resin or polycycloolefin resin having a sulfonamide group, and in which an atom other than a hydrogen atom or a substituent may be bonded to the carbon atom on the α-position, as disclosed in U.S. Pat. No. 6,949,325; an acrylic resin containing a fluorinated alcohol, and in which an atom other than a hydrogen atom or a substituent may be bonded to the carbon atom on the α-position, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582. These resins are preferable in that a resist pattern can be formed with minimal swelling.

The term "α-(hydroxyalkyl)acrylic acid" refers to, in an acrylic resin in which an atom other than a hydrogen atom or a substituent may be bonded to the carbon atom on the α-position, one or both of acrylic acid in which a hydrogen atom is bonded to the carbon atom on the α-position having the carboxyl group bonded thereto, and α-hydroxyalkyl acrylic acid in which a hydroxyalkyl group (preferably a hydroxyalkyl group of 1 to 5 carbon atoms) is bonded to the carbon atom on the α-position.

As the cross-linking agent, usually, an amino-based cross-linking agent such as a glycoluril having a methylol group or alkoxymethyl group, or a melamine-based cross-linking agent is preferable, as it enables formation of a resist pattern with minimal swelling. The amount added of the cross-linking agent is preferably within a range from 1 to 50 parts by weight, relative to 100 parts by weight of the alkali-soluble resin.

In those cases where the resist composition of the present invention is a resist composition which forms a positive-type pattern in an alkali developing process, but forms a negative-type pattern in a solvent developing process, a base component (A0) (hereafter referred to as "component (A0)") which exhibits increased polarity under the action of acid is preferably used as the component (A). By using the component (A0), the polarity of the base component changes upon exposure, and therefore favorable developing contrast can be achieved, not only in an alkali developing process, but also in a solvent developing process.

In those cases where an alkali developing process is used, the component (A0) is substantially insoluble in an alkali developing solution prior to exposure, but when acid is generated from the component (B) upon exposure, the action of the acid causes an increase in the polarity of the component (A0) that increases the solubility in the alkali developing solution. Accordingly, during resist pattern formation, by conducting selective exposure of a resist film obtained by applying the resist composition to a substrate, the exposed portions change from being substantially insoluble in an alkali developing solution to being soluble, while the unexposed portions remain substantially insoluble in an alkali developing solution, and therefore a contrast is achieved between the exposed portions and the unexposed portions, and a positive-type pattern can be formed by performing developing with an alkali developing solution.

Further, in those cases where a solvent developing process is used, the component (A0) exhibits good solubility in an organic developing solution prior to exposure, but when acid is generated from the component (B) upon exposure, the action of the acid causes an increase in the polarity of the component (A0) that reduces the solubility in the organic developing solution. Accordingly, during resist pattern formation, by conducting selective exposure of a resist film obtained by applying the resist composition to a substrate, the exposed portions change from being soluble in an organic developing solution to being substantially insoluble, while the unexposed portions remain soluble in an organic developing solution, and therefore developing with an organic developing solution can be used to achieve contrast between the exposed portions and the unexposed portions, and a negative-type pattern can be formed by performing developing with an organic developing solution.

In the resist composition of the present invention, the component (A) is preferably a base component (A0) (namely, a base component that exhibits increased polarity under the action of acid). In other words, the resist composition of the present invention is preferably a resist composition that functions as a positive-type composition in an alkali developing process, and functions as a negative-type composition in a solvent developing process.

The component (A0) may be a resin component (A1) (hereafter frequently referred to as "component (A1)") that exhibits increased polarity under the action of acid, a low molecular weight compound component (A2) (hereafter frequently referred to as "component (A2)") that exhibits increased polarity under the action of acid, or a mixture thereof {Component (A1)}

As the component (A1), a single resin component (base resin) typically used as a base component for a chemically amplified resist can be used alone, or two or more of such resin components can be mixed together.

The component (A1) preferably has a structural unit (a1) containing an acid-decomposable group that exhibits increased polarity under the action of acid.

In addition to the structural unit (a1), the component (A1) preferably also includes a structural unit (a2) containing an —SO$_2$-containing cyclic group or a lactone-containing cyclic group.

In addition to either the structural unit (a1) or a combination of the structural units (a1) and (a2), the component (A1) preferably also includes a structural unit (a3) containing a polar group.

[Structural Unit (a1)]

The structural unit (a1) is a structural unit containing an acid-decomposable group that exhibits increased polarity under the action of acid.

The term "acid-decomposable group" refers to a group exhibiting acid decomposability in which at least a part of the bonds within the structure of this acid-decomposable group may be cleaved by the action of acid.

Examples of acid-decomposable groups that exhibit increased polarity under the action of acid include groups which are decomposed by the action of acid to form a polar group.

Examples of the polar group include a carboxyl group, a hydroxyl group, an amino group and a sulfo group (—SO$_3$H). Among these groups, polar groups that contain an —OH within the structure (hereafter also referred to as "OH-containing polar groups") are preferable, a carboxyl group or a hydroxyl group is more preferable, and a carboxyl group is particularly desirable.

More specific examples of the acid-decomposable group include groups in which an aforementioned polar group is protected with an acid-dissociable group (such as groups in which the hydrogen atom of an OH-containing polar group is protected with an acid-dissociable group).

An "acid-dissociable group" is a group exhibiting acid dissociability in which at least the bond between the acid-dissociable group and the atom adjacent to this acid-dissociable group may be cleaved by the action of acid. It is necessary that the acid-dissociable group that constitutes the acid-decomposable group is a group which exhibits a lower polarity than the polar group generated by the dissociation of the acid-dissociable group. Thus, when the acid-dissociable group is dissociated under the action of acid, a polar group exhibiting a higher polarity than that of the acid-dissociable group is generated, thereby increasing the polarity. As a result, the polarity of the entire component (A1) is increased. Increasing the polarity causes a relative change in the solubility within a developing solution. For example, the solubility increases when the developing solution is an alkali developing solution, whereas the solubility decreases when the developing solution is an organic developing solution.

There are no particular limitations on the acid-dissociable group, and any of the groups that have been proposed as acid-dissociable groups for the base resins of chemically amplified resists can be used. Generally, groups that form either a cyclic or chain-like tertiary alkyl ester with the carboxyl group of the (meth)acrylic acid, and acetal-type acid-dissociable groups such as alkoxyalkyl groups are widely known.

Here, the term "tertiary alkyl ester" describes a structure in which an ester is formed by substituting the hydrogen atom of a carboxyl group with a chain-like or cyclic alkyl group, such that a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched acid-dissociable groups and acid-dissociable groups containing an aliphatic cyclic group.

Here, the term "aliphatic branched" refers to a branched structure having no aromaticity. The structure of the "aliphatic branched acid-dissociable group" is not limited to structures constituted of only carbon atoms and hydrogen atoms (not limited to hydrocarbon groups), but is preferably a hydrocarbon group. Further, the "hydrocarbon group" may be either saturated or unsaturated, but is preferably saturated.

Examples of the aliphatic branched acid-dissociable group include groups represented by the formula —C(R$^{71}$)(R$^{72}$)(R$^{73}$). In this formula, each of R$^{71}$ to R$^{73}$ independently represents a linear alkyl group of 1 to 5 carbon atoms. The group represented by the formula —C(R$^{71}$)(R$^{72}$)(R$^{73}$) preferably has 4 to 8 carbon atoms, and specific examples include a tert-butyl group, a 2-methyl-2-butyl group, a 2-methyl-2-pentyl group and a 3-methyl-3-pentyl group.

Among these, a tert-butyl group is particularly desirable.

The term "aliphatic cyclic group" refers to a monocyclic group or polycyclic group that has no aromaticity.

The aliphatic cyclic group within the "acid-dissociable group containing an aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the aliphatic cyclic group exclusive of substituents is not limited to structures constituted from only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group may be either a monocyclic group or a polycyclic group.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include alicyclic hydrocarbon groups in which one or more hydrogen atoms have been removed from a monocycloalkane such as cyclopentane or cyclohexane, or in which one or more hydrogen atoms have been removed from a polycycloalkane such as adamantane, norbornane, isobornane, tricyclodecane or tetracyclododecane. Further, in these alicyclic hydrocarbon groups, part of the carbon atoms that constitute the ring may be replaced with an ether group (—O—).

Examples of acid-dissociable groups containing an aliphatic cyclic group include:

(i) a group which forms a tertiary carbon atom on the ring structure of a monovalent aliphatic cyclic group in which a substituent (a group or an atom other than hydrogen) is bonded to the carbon atom to which an atom adjacent to the acid dissociable group (e.g., "—O—" within "—C(=O)—O— group") is bonded, and (ii) a group which have a monovalent aliphatic cyclic group, and a branched alkylene group containing a tertiary carbon atom that is bonded to the monovalent aliphatic cyclic group.

In a group of type (i) described above, as the substituent bonded to the carbon atom to which an atom adjacent to the acid dissociable group is bonded on the ring skeleton of the aliphatic cyclic group, an alkyl group can be mentioned. Examples of these alkyl groups include the same groups as those described below for $R^{14}$ in formulas (1-1) to (1-9) shown below.

Specific examples of groups of type (i) include groups represented by general formulas (1-1) to (1-9) shown below.

Specific examples of groups of type (ii) include groups represented by general formulas (2-1) to (2-6) shown below.

[Chemical Formula 1]

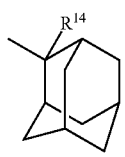

(1-1)

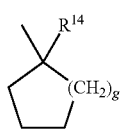

(1-2)

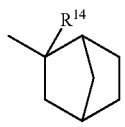

(1-3)

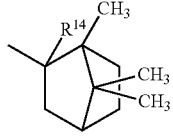

(1-4)

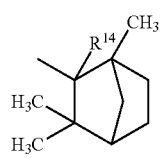

(1-5)

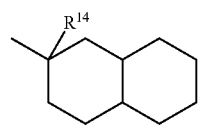

(1-6)

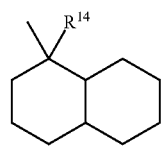

(1-7)

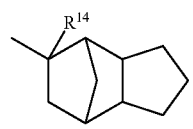

(1-8)

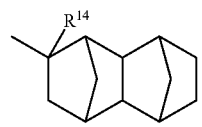

(1-9)

In the formulas above, $R^{14}$ represents an alkyl group, and g represents an integer of 0 to 8.

[Chemical Formula 2]

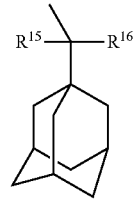

(2-1)

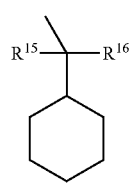

(2-2)

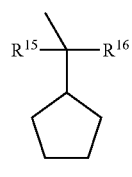

(2-3)

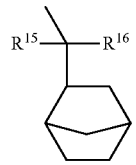

(2-4)

-continued (2-5)

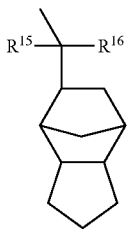

(2-6)

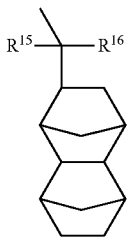

In the formulas above, each of $R^{15}$ and $R^{16}$ independently represents an alkyl group.

In formulas (1-1) to (1-9), the alkyl group represented by $R^{14}$ may be a linear, branched or cyclic group, and is preferably a linear or branched alkyl group.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

In formula (1-2), g is preferably an integer of 0 to 4, more preferably an integer of 1 to 4, and still more preferably 1 or 2.

In formulas (2-1) to (2-6), examples of the alkyl group for $R^{15}$ and $R^{16}$ include the same alkyl groups as those described above for $R^{14}$.

In formulas (1-1) to (1-9) and formulas (2-1) to (2-6), a portion of the carbon atoms that constitute the ring(s) may be replaced with an ethereal oxygen atom (—O—).

Further, in formulas (1-1) to (1-9) and (2-1) to (2-6), one or more of the hydrogen atoms bonded to the carbon atoms that constitute the ring may be substituted with a substituent. Examples of the substituent include an alkyl group of 1 to 5 carbon atoms, a fluorine atom and a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. The action of acid breaks the bond between the acetal-type acid-dissociable group and the oxygen atom to which the acetal-type, acid-dissociable group is bonded, thereby forming an OH-containing polar group such as a carboxyl group or a hydroxyl group.

Examples of acetal-type acid-dissociable groups include groups represented by general formula (p1) shown below.

[Chemical Formula 3]

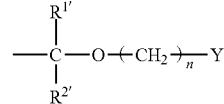

(p1)

In the formula, each of $R^{1\prime}$ and $R^{2\prime}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In formula (p 1), n is preferably an integer of 0 to 2, more preferably 0 or 1, and most preferably 0.

Specific examples of the alkyl group of 1 to 5 carbon atoms for $R^{1\prime}$ and $R^{2\prime}$ include linear or branched alkyl groups such as a methyl group, ethyl group, propyl group, isopropyl group, n-butyl group, isobutyl group, tert-butyl group, pentyl group, isopentyl group and neopentyl group. Of these, a methyl group or ethyl group is preferable, and a methyl group is the most desirable.

Examples of the alkyl group of 1 to 5 carbon atoms for Y include the same groups as those mentioned above for the alkyl group of 1 to 5 carbon atoms for $R^{1\prime}$ and $R^{2\prime}$.

Examples of the aliphatic cyclic group for Y include any of the multitude of monocyclic or polycyclic aliphatic groups that have been proposed for conventional ArF resists and the like. For example, the same aliphatic cyclic groups as those described above in connection with the "acid-dissociable group containing an aliphatic cyclic group" can be used.

In the group represented by general formula (p1), it is preferable that at least one of $R^{1\prime}$ and $R^{2\prime}$ is a hydrogen atom. In other words, a group represented by general formula (p1-1) shown below is preferable.

[Chemical Formula 4]

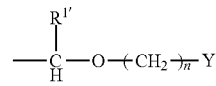

(p1-1)

In the formula, $R^{1\prime}$, n and Y are the same as defined above.

Additional examples of acetal-type acid-dissociable groups include groups represented by general formula (p2) shown below.

[Chemical Formula 5]

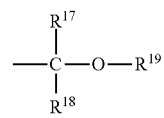

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

In formula (p2), the alkyl group for $R^{17}$ and $R^{18}$ may be either linear or branched. The alkyl group preferably contains 1 to 15 carbon atoms. The alkyl group for $R^{17}$ and $R^{18}$ is preferably an ethyl group or methyl group, and is most preferably a methyl group.

It is preferable that at least one of $R^{17}$ and $R^{18}$ is a hydrogen atom, and it is particularly desirable that one of $R^{17}$ and $R^{18}$ is a hydrogen atom, and the other is a methyl group.

The alkyl group for $R^{19}$ may be linear, branched or cyclic, and preferably contains 1 to 15 carbon atoms.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in the above formula (p2), each of $R^{17}$ and $R^{19}$ may independently represent a linear or branched alkylene group (and preferably an alkylene group of 1 to 5 carbon atoms), wherein the terminal of $R^{19}$ and the terminal of $R^{17}$ are bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. This cyclic group is preferably a 4- to 7-membered ring, and more preferably a 4- to 6-membered ring. Specific examples of the cyclic group include a tetrahydropyranyl group and a tetrahydrofuranyl group.

There are no particular limitations on the structural unit (a1), provided it contains an acid-decomposable group, but a structural unit derived from a compound having an ethylenic double bond and containing an acid-decomposable group is preferable.

Here, "a structural unit derived from a compound having an ethylenic double bond" describes a structural unit having a structure formed by cleavage of the ethylenic double bond in the compound having the ethylenic double bond, resulting in the formation of a single bond.

Examples of compounds having an ethylenic double bond include acrylic acid and esters thereof in which the hydrogen atom bonded to the carbon atom on the α-position may be substituted with a substituent, acrylamide and derivatives thereof in which the hydrogen atom bonded to the carbon atom on the α-position may be substituted with a substituent, vinyl aromatic compounds in which the hydrogen atom bonded to the carbon atom on the α-position may be substituted with a substituent, cycloolefins and derivatives thereof, and vinyl sulfonates. Among these compounds, acrylic acid and esters thereof in which the hydrogen atom bonded to the carbon atom on the α-position may be substituted with a substituent, acrylamide and derivatives thereof in which the hydrogen atom bonded to the carbon atom on the α-position may be substituted with a substituent, and vinyl aromatic compounds in which the hydrogen atom bonded to the carbon atom on the α-position may be substituted with a substituent are preferable.

The term "acrylate ester" describes a compound in which the hydrogen atom at the carboxyl group terminal of acrylic acid ($CH_2$=CH—COOH) has been substituted with an organic group.

In the present description, an acrylic acid or acrylate ester in which the hydrogen atom bonded to the carbon atom on the α-position is substituted with a substituent may also be referred to as an "α-substituted acrylic acid" or "α-substituted acrylate ester" respectively. Further, the generic term "(α-substituted) acrylic acid" may be used to describe either or both of acrylic acid and the α-substituted acrylic acid, and the generic term "(α-substituted) acrylate ester" may be used to describe either or both of the acrylate ester and the α-substituted acrylate ester.

Examples of the substituent bonded to the carbon atom on the α-position in an α-substituted acrylic acid or ester thereof include a halogen atom, an alkyl group of 1 to 5 carbon atoms, a halogenated alkyl group of 1 to 5 carbon atoms and a hydroxyalkyl group. Unless specified otherwise, the α-position (the α-position carbon atom) of a structural unit derived from an acrylate ester refers to the carbon atom having the carbonyl group bonded thereto.

Examples of the halogen atom for the α-position substituent include a fluorine atom, chlorine atom, bromine atom and iodine atom.

Specific examples of the alkyl group of 1 to 5 carbon atoms for the α-position substituent include linear and branched alkyl groups such as a methyl group, ethyl group, propyl group, isopropyl group, n-butyl group, isobutyl group, tert-butyl group, pentyl group, isopentyl group and neopentyl group.

Further, specific examples of the halogenated alkyl group of 1 to 5 carbon atoms for the α-position substituent include groups in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

The hydroxyalkyl group for the α-position substituent is preferably a hydroxyalkyl group of 1 to 5 carbon atoms, and specific examples include groups in which part or all of the hydrogen atoms of an aforementioned alkyl group of 1 to 5 carbon atoms have each been substituted with a hydroxyl group.

In the present invention, a hydrogen atom, an alkyl group of 1 to 5 carbon atoms or a halogenated alkyl group of 1 to 5 carbon atoms is preferably bonded to the α-position carbon atom of the (α-substituted) acrylic acid or ester thereof, and a hydrogen atom, an alkyl group of 1 to 5 carbon atoms or a fluorinated alkyl group of 1 to 5 carbon atoms is more preferable. From the viewpoint of industrial availability, a hydrogen atom or a methyl group is the most desirable.

The term "organic group" describes a group containing a carbon atom, and the group may also include atoms other than the carbon atom (such as a hydrogen atom, oxygen atom, nitrogen atom, sulfur atom and halogen atom (such as a fluorine atom or chlorine atom)).

There are no particular limitations on the organic group of the (α-substituted) acrylate ester, and examples include characteristic groups such as the aforementioned aromatic groups and polarity conversion groups, and the acid-decomposable groups described below, and characteristic group-containing groups containing one of these characteristic groups within the structure. Examples of the characteristic group-containing groups include groups in which a characteristic group mentioned above is bonded to a divalent linking group. Examples of the divalent linking group include the same groups as those described below for the divalent linking group for $Y^2$ in general formula (a1-3).

Examples of the "acrylamide and derivatives thereof" include acrylamides in which the hydrogen atom bonded to the carbon atom on the α-position may be substituted with a substituent (hereafter also referred to as an (α-substituted) acrylamide), and compounds in which one or both of the hydrogen atoms at the terminals of the amino group of an (α-substituted) acrylamide have each been substituted with a substituent.

Examples of the substituent which may be bonded to the carbon atom on the α-position in an acrylamide or derivative thereof include the same atoms and groups as those mentioned above as the substituent bonded to the carbon atom on the α-position in an aforementioned α-substituted acrylate ester.

The substituents that substitute one or both of the hydrogen atoms at the terminals of the amino group of an (α-substituted) acrylamide are preferably organic groups. There are no particular limitations on these organic groups, and examples include the same organic groups as those described above for the (α-substituted) acrylate ester.

Examples of compounds in which one or both of the hydrogen atoms at the terminals of the amino group of an (α-substituted) acrylamide have been substituted with a substituent include compounds in which the —C(=O)—O— group bonded to the α-position carbon atom in an (α-substituted) acrylate ester has been substituted with —C(=O)—N($R^b$)— (wherein le represents a hydrogen atom or an alkyl group of 1 to 5 carbon atoms).

In the above formula, the alkyl group for $R^b$ is preferably a linear or branched group.

A "vinyl aromatic compound" describes a compound having an aromatic ring and one vinyl group bonded to that aromatic ring, and examples include styrene and derivatives thereof, and vinylnaphthalene and derivatives thereof.

Examples of the substituent which may be bonded to the carbon atom on the α-position of the vinyl aromatic compound (namely, the carbon atom, among the carbon atoms within the vinyl group, that is bonded to the aromatic ring) include the same groups as those mentioned above as the substituent bonded to the carbon atom on the α-position in an aforementioned α-substituted acrylate ester.

Hereafter, the term "(α-substituted) vinyl aromatic compound" may be used to describe a vinyl aromatic compound in which the hydrogen atom bonded to the carbon atom on the α-position may be substituted with a substituent.

Examples of "styrene and derivatives thereof" include styrenes in which the hydrogen atom bonded to the carbon atom on the α-position may be substituted with a substituent, and in which the hydrogen atoms bonded to the benzene ring may each be substituted with a substituent other than a hydroxyl group (hereafter also referred to as "(α-substituted) styrene"), hydroxystyrenes in which the hydrogen atom bonded to the carbon atom on the α-position may be substituted with a substituent, and in which the hydrogen atoms bonded to the benzene ring may each be substituted with a substituent other than a hydroxyl group (hereafter also referred to as "(α-substituted) hydroxystyrene"), compounds in which the hydrogen atom of the hydroxyl group of an (α-substituted) hydroxystyrene has been substituted with an organic group, vinylbenzoic acids in which the hydrogen atom bonded to the carbon atom on the α-position may be substituted with a substituent, and in which the hydrogen atoms bonded to the benzene ring may each be substituted with a substituent other than a hydroxyl group or a carboxyl group (hereafter also referred to as "(α-substituted) vinylbenzoic acid"), and compounds in which the hydrogen atom of the carboxyl group of an (α-substituted) vinylbenzoic acid has been substituted with an organic group.

Hydroxystyrene is a compound in which a single vinyl group and at least one hydroxyl group are bonded to a benzene ring. The number of hydroxyl groups bonded to the benzene ring is preferably from 1 to 3, and most preferably 1. There are no particular limitations on the bonding position(s) of the hydroxyl group(s) on the benzene ring. When there is only one hydroxyl group, the bonding position of the vinyl group is preferably the para-position (4th position). When the number of hydroxyl groups is an integer of two or more, any arbitrary combination of bonding positions may be used.

Vinylbenzoic acid is a compound in which a single vinyl group is bonded to the benzene ring of benzoic acid. There are no particular limitations on the bonding position of the vinyl group on the benzene ring.

There are no particular limitations on the substituent other than a hydroxyl group or carboxyl group which may be bonded to the benzene ring of styrene or a derivative thereof, and examples include a halogen atom, an alkyl group of 1 to 5 carbon atoms, and a halogenated alkyl group of 1 to 5 carbon atoms. Examples of the halogen atom include a fluorine atom, chlorine atom, bromine atom and iodine atom, and a fluorine atom is particularly desirable.

In a compound in which the hydrogen atom of the hydroxyl group of an α-substituted) hydroxystyrene has been substituted with an organic group, there are no particular limitations on the organic group, and examples include the same organic groups as those described above for the organic group of an (α-substituted) acrylate ester.

In a compound in which the hydrogen atom of the carboxyl group of an α-substituted) vinylbenzoic acid has been substituted with an organic group, there are no particular limitations on the organic group, and examples include the same organic groups as those described above for the organic group of an (α-substituted) acrylate ester.

Examples of "vinylnaphthalene and derivatives thereof" include vinylnaphthalenes in which the hydrogen atom bonded to the carbon atom on the α-position may be substituted with a substituent, and in which the hydrogen atoms bonded to the naphthalene ring may each be substituted with a substituent other than a hydroxyl group (hereafter also referred to as "(α-substituted) vinylnaphthalene"), vinyl(hydroxynaphthalenes) in which the hydrogen atom bonded to the carbon atom on the α-position may be substituted with a substituent, and in which the hydrogen atoms bonded to the naphthalene ring may each be substituted with a substituent other than a hydroxyl group (hereafter also referred to as "(α-substituted) vinyl(hydroxynaphthalene)"), and compounds in which the hydrogen atom of the hydroxyl group of an (α-substituted) vinyl(hydroxynaphthalene) has been substituted with a substituent.

Vinyl(hydroxynaphthalene) is a compound in which a single vinyl group and at least one hydroxyl group are bonded to a naphthalene ring. The vinyl group may be bonded to the 1st position or 2nd position of the naphthalene ring. The number of hydroxyl groups bonded to the naphthalene ring is preferably from 1 to 3, and most preferably 1. There are no particular limitations on the bonding position(s) of the hydroxyl group(s) on the naphthalene ring. When the vinyl group is bonded to the 1st position or 2nd position of the naphthalene ring, the hydroxyl group(s) are preferably bonded to any of the 5th to 8th positions. In particular, when there is only one hydroxyl group, the hydroxyl group is preferably bonded to any one of the 5th to 7th positions of the naphthalene ring, and is more preferably bonded to the 5th or 6th position. When the number of hydroxyl groups is an integer of two or more, any arbitrary combination of bonding positions may be used.

Examples of the substituent which may be bonded to the naphthalene ring of the vinylnaphthalene or derivative therefore include the same substituents as those mentioned above for the substituent which may be bonded to the benzene ring of an α-substituted) styrene.

In a compound in which the hydrogen atom of the hydroxyl group of an α-substituted) vinyl(hydroxynaphthalene) has been substituted with an organic group, there are no particular limitations on the organic group, and examples include the same organic groups as those described above for the organic group of an (α-substituted) acrylate ester.

Examples of the structural unit (a1) include a structural unit (a11) derived from an acrylate ester in which the hydrogen atom bonded to the carbon atom on the α-position may be substituted with a substituent, and containing an acid-decomposable group, a structural unit (a12) derived from a hydroxystyrene in which the hydrogen atom bonded to the carbon atom on the α-position may be substituted with a substituent, in which the hydrogen atoms bonded to the benzene ring may be substituted with a substituent other than a hydroxyl group, and in which the hydrogen atom of the hydroxyl group is substituted with an acid-dissociable group or a substituent containing an acid-dissociable group, and a structural unit (a13) derived from a vinyl(hydroxynaphthalene) in which the hydrogen atom bonded to the carbon atom on the α-position may be substituted with a substituent, in which the hydrogen atoms bonded to the naphthalene ring may be substituted with a substituent other than a hydroxyl group, and in which the hydrogen atom of the hydroxyl group is substituted with an acid-dissociable group or a substituent containing an acid-dissociable group.

{Structural Unit (a11)}

The structural unit (a11) is a structural unit derived from an acrylate ester in which the hydrogen atom bonded to the carbon atom on the α-position may be substituted with a substituent and containing an acid-decomposable group.

Specific examples of the structural unit (a11) include structural units represented by general formula (a1-0-1) shown below and structural units represented by general formula (a1-0-2) shown below.

[Chemical Formula 6]

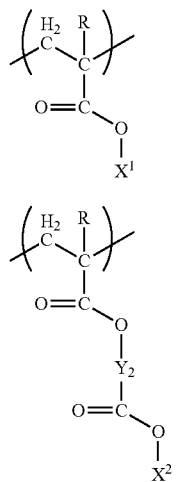

(a1-0-1)

(a1-0-2)

In the formulas, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In general formula (a1-0-1), examples of the alkyl group and halogenated alkyl group for R include the same groups as the alkyl groups of 1 to 5 carbon atoms and halogenated alkyl groups of 1 to 5 carbon atoms mentioned above for the substituent bonded to the carbon atom on the α-position within the description relating to the aforementioned α-substituted acrylate ester.

R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, a tertiary alkyl ester-type acid-dissociable group is preferable.

In general formula (a1-0-2), R is the same as defined for R in formula (a1-0-1).

$X^2$ is the same as defined for $X^1$ in formula (a1-0-1).

Although there are no particular limitations on the divalent linking group for $Y^2$, preferred examples include divalent hydrocarbon groups which may have a substituent, and divalent linking groups containing a hetero atom.

(Divalent Hydrocarbon Group which May have a Substituent)

The hydrocarbon group for the divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be either saturated or unsaturated. In general, the aliphatic hydrocarbon group is preferably saturated.

Specific examples of the aliphatic hydrocarbon group include a linear or branched aliphatic hydrocarbon group, and an aliphatic hydrocarbon group that includes a ring within the structure.

The linear or branched aliphatic hydrocarbon group preferably has 1 to 10 carbon atoms, more preferably 1 to 8 carbon atoms, and most preferably 1 to 5 carbon atoms.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent (a group or atom other than a hydrogen atom) that substitutes a hydrogen atom. Examples of the substituent include a fluorine atom, a fluorinated alkyl group of 1 to 5 carbon atoms, and an oxo group (=O).

Examples of the aliphatic hydrocarbon group that includes a ring within the structure include cyclic aliphatic hydrocarbon groups (groups in which two hydrogen atoms have been removed from an aliphatic hydrocarbon ring) which may contain a hetero atom-containing substituent within the cyclic structure, groups in which an aforementioned cyclic aliphatic hydrocarbon group is bonded to the terminal of a linear or branched aliphatic hydrocarbon group, and groups in which an aforementioned cyclic aliphatic hydrocarbon group is interposed within the chain of a linear or branched aliphatic hydrocarbon group. Examples of the linear or branched aliphatic hydrocarbon group include the same groups as those mentioned above.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which two hydrogen atoms have been removed from a monocycloalkane is preferable. The monocycloalkane preferably contains 3 to 6 carbon atoms, and specific examples include cyclopentane and cyclohexane. As the polycyclic aliphatic hydrocarbon group, a group in which two hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane.

The cyclic aliphatic hydrocarbon group may or may not have a substituent (a group or atom other than a hydrogen atom) that substitutes a hydrogen atom. Examples of the substituent include an alkyl group, alkoxy group, halogen atom, halogenated alkyl group, hydroxyl group and oxo group (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferred.

Examples of the halogenated alkyl group for the substituent include groups in which part or all of the hydrogen atoms of an aforementioned alkyl group have each been substituted with an aforementioned halogen atom.

In the cyclic aliphatic hydrocarbon group, a portion of the carbon atoms that constitute the cyclic structure may be substituted with a hetero atom-containing substituent. This hetero atom-containing substituent is preferably —O—, —C(=O)—O—, —S—, —S(=O)$_2$—, or —S(=O)$_2$—O—.

The aromatic hydrocarbon group as the divalent hydrocarbon group is a divalent hydrocarbon group having at least one aromatic ring, and may also have a substituent. There are no particular limitations on the aromatic ring, provided it is a cyclic conjugated system having 4n+2π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings has been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the divalent hydrocarbon group include groups in which two hydrogen atoms have been removed from an aromatic hydrocarbon ring or aromatic heterocyclic ring (namely, arylene groups or heteroarylene groups), groups in which two hydrogen atoms have been removed from an aromatic compound having two or more aromatic rings (such as biphenyl or fluorene), and groups in which one of the hydrogen atoms of a group having one hydrogen atom removed from an aforementioned aromatic hydrocarbon ring or aromatic heterocyclic ring (namely, an aryl group or heteroaryl group) has been substituted with an alkylene group (for example, groups in which one further hydrogen atom has been removed from the aryl group within an arylalkyl group such as a benzyl group, phenethyl group, 1-naphthylmethyl group, 2-naphthylmethyl group, 1-naphthylethyl group or 2-naphthylethyl group).

The alkylene group bonded to the aryl group or heteroaryl group preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic ring of an aforementioned aromatic hydrocarbon group may be substituted with a substituent. Examples of the substituent include an alkyl group, alkoxy group, halogen atom, halogenated alkyl group, hydroxyl group and oxo group (=O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group have each been substituted with an aforementioned halogen atom.

(Divalent Linking Group Containing a Hetero Atom)

Examples of the hetero atom in the "divalent linking group containing a hetero atom" include atoms other than a carbon atom or hydrogen atom, and specific examples include an oxygen atom, nitrogen atom, sulfur atom and halogen atom.

Examples of the divalent linking group containing a hetero atom include non-hydrocarbon linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)— and =N—, and combinations of at least one of these non-hydrocarbon linking groups with a divalent hydrocarbon group. Examples of the divalent hydrocarbon group include the same groups as those described above for the divalent hydrocarbon group which may have a substituent, and a linear or branched aliphatic hydrocarbon group is preferable.

In the above groups, the —NH— within —C(=O)—NH—, or an H within —NH— or —NH—C(=NH)— may be substituted with a substituent such as an alkyl group or an acyl group. The substituent preferably contains 1 to 10 carbon atoms, more preferably 1 to 8 carbon atoms, and most preferably 1 to 5 carbon atoms.

$Y^2$ is preferably a linear or branched alkylene group, a cyclic aliphatic hydrocarbon group, or a divalent linking group containing a hetero atom.

When $Y^2$ represents a linear or branched alkylene group, the alkylene group preferably contains 1 to 10 carbon atoms, more preferably 1 to 6 carbon atoms, still more preferably 1 to 4 carbon atoms, and most preferably 1 to 3 carbon atoms. Specific examples include the same linear alkylene groups and branched alkylene groups as those mentioned above, within the description of the "divalent hydrocarbon group which may have a substituent", for the linear or branched aliphatic hydrocarbon group.

When $Y^2$ represents a cyclic aliphatic hydrocarbon group, examples of the cyclic aliphatic hydrocarbon group include the same cyclic aliphatic hydrocarbon groups as those mentioned above, within the description for the "divalent hydrocarbon group which may have a substituent", for the "aliphatic hydrocarbon group that includes a ring within the structure".

As the cyclic aliphatic hydrocarbon group, a group in which two or more hydrogen atoms have been removed from cyclopentane, cyclohexane, norbornane, isobornane, adamantane, tricyclodecane or tetracyclododecane is particularly preferred.

When $Y^2$ represents a divalent linking group containing a hetero atom, preferred examples of the linking group include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, —S(=O)$_2$—O—, and groups represented by a general formula —$Y^{21}$—O—$Y^{22}$—, —[$Y^{21}$—C(=O)—O]$_{m'}$—$Y^{22}$— or —$Y^{21}$—O—C(=O)—$Y^{22}$— [wherein each of $Y^{21}$ and $Y^{22}$ independently represents a divalent hydrocarbon group which may have a substituent, O represents an oxygen atom, and m' represents an integer of 0 to 3].

When $Y^2$ represents —NH—, this H may be substituted with a substituent such as an alkyl group or an acyl group. The substituent (the alkyl group, an acyl group or the like) preferably has 1 to 10 carbon atoms, more preferably 1 to 8 carbon atoms, and most preferably 1 to 5 carbon atoms.

In the formulas —$Y^{21}$—O—$Y^{22}$—, —[$Y^{21}$—C(=O)—O]$_{m'}$—$Y^{22}$— and —$Y^{21}$—O—C(=O)—$Y^{22}$—, each of $Y^{21}$ and $Y^{22}$ independently represents a divalent hydrocarbon group which may have a substituent. Examples of the divalent hydrocarbon groups include the same groups as those described above for the "divalent hydrocarbon group which may have a substituent" within the description relating to the divalent linking group.

$Y^{21}$ is preferably a linear aliphatic hydrocarbon group, more preferably a linear alkylene group, still more preferably a linear alkylene group of 1 to 5 carbon atoms, and most preferably a methylene group or an ethylene group.

$Y^{22}$ is preferably a linear or branched aliphatic hydrocarbon group, and is more preferably a methylene group, an ethylene group or an alkylmethylene group. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula [$Y^{21}$—C(=O)—O]$_{m'}$—$Y^{22}$—, m' represents an integer of 0 to 3, preferably an integer of 0 to 2, more preferably 0 or 1, and most preferably 1. In other words, it is particularly desirable that the group represented by formula —[$Y^{21}$—C(=O)—O]$_{m'}$—$Y^{22}$— is a group represented by a formula —$Y^{21}$—C(=O)—O—$Y^{22}$—. Among such groups, groups represented by a formula —(CH$_2$)$_{a'}$—C(=O)—O—(CH$_2$)$_{b'}$— are particularly preferred. In this formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

The divalent linking group containing a hetero atom for $Y^2$ is preferably an organic group composed of a combination of at least one non-hydrocarbon group and a divalent hydrocarbon group. Among such groups, linear groups containing an oxygen atom as the hetero atom, for example, groups containing an ether linkage or ester linkage are preferable, groups represented by one of the above formulas —$Y^{21}$—O—$Y^{22}$—, —[$Y^{21}$—C(=O)—O]$_{m'}$—$Y^{22}$— or —$Y^{21}$—O—C(=O)—$Y^{22}$— are more preferable, and groups represented by either of the formulas —[$Y^{21}$—C(=O)—O]$_{m'}$—$Y^{22}$— or —$Y^{21}$—O—C(=O)—$Y^{22}$— are particularly preferable.

Of the various possibilities described above, $Y^2$ is preferably a linear or branched alkylene group, or a divalent linking group containing a hetero atom, and is more preferably a linear or branched alkylene group, a group represented by the above formula —$Y^{21}$—O—$Y^{22}$—, a group represented by the above formula —[$Y^{21}$—C(=O)—O]$_{m'}$—$Y^{22}$—, or a group represented by the above formula —$Y^{21}$—O—C(=O)—$Y^{22}$—.

Specific examples of the structural unit (a11) include structural units represented by general formulas (a1-1) to (a1-4) shown below.

[Chemical Formula 7]

(a1-1)

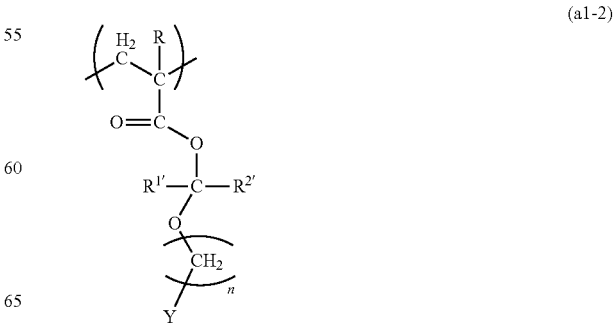

(a1-2)

(a1-3)

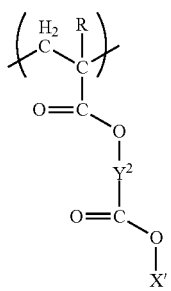

(a1-4)

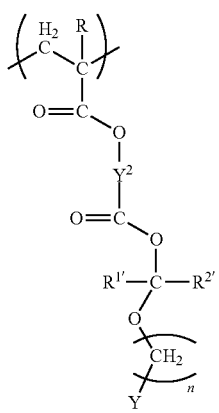

In the formulas, R, R$^{1'}$, R$^{2'}$, n, Y and Y$^2$ are each the same as defined above, and X' represents a tertiary alkyl ester-type acid-dissociable group.

In the above formulas, R is the same as defined for R in formula (a1-0-1).

Examples of X' include the same tertiary alkyl ester-type acid-dissociable groups as those described above.

R$^{1'}$, R$^{2'}$, n and Y are the same as defined above for R$^{1'}$, R$^{2'}$, n and Y respectively in general formula (p1) described above in connection with the "acetal-type acid-dissociable group".

Examples of Y$^2$ include the same groups as those described above for Y$^2$ in general formula (a1-0-2).

Specific examples of structural units represented by general formula (a1-1) to (a1-4) are shown below.

In the formulas shown below, R$^\alpha$ represents a hydrogen atom, a methyl group or a trifluoromethyl group.

[Chemical Formula 8]

(a1-1-1)

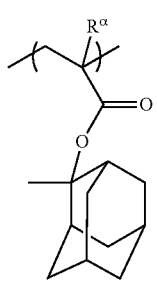

(a1-1-2)

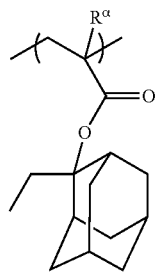

(a1-1-3)

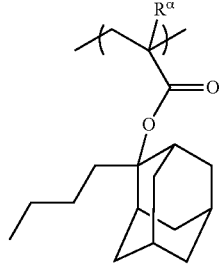

(a1-1-4)

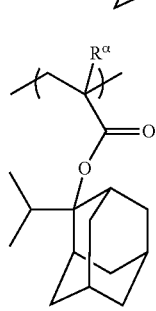

(a1-1-5)

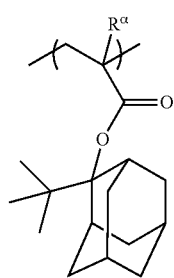

(a1-1-6)

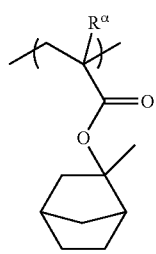

(a11-1-7)

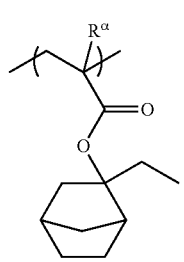

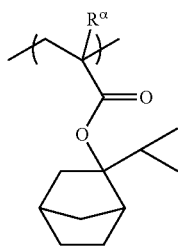 (a1-1-8)
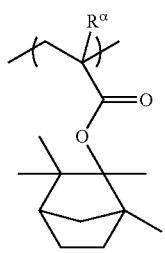 (a1-1-9)
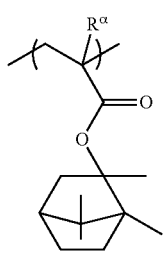 (a1-1-10)
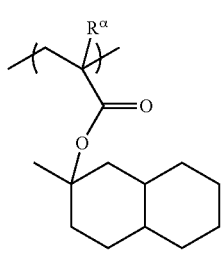 (a1-1-11)
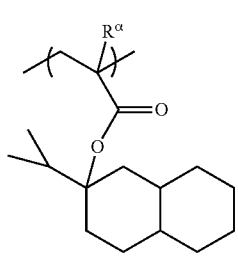 (a1-1-12)
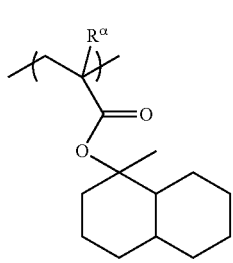 (a1-1-13)
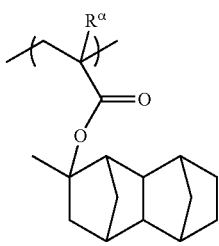 (a1-1-14)
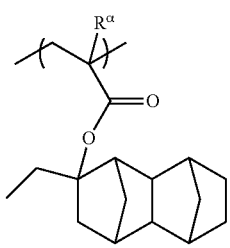 (a1-1-15)
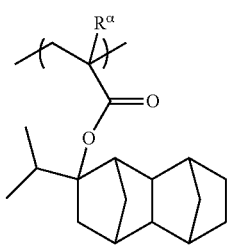 (a1-1-16)
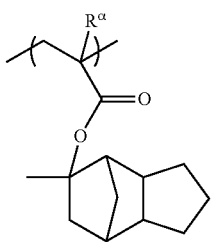 (a1-1-17)
[Chemical Formula 9]
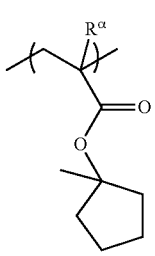 (a1-1-18)
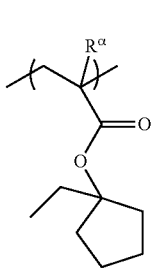 (a1-1-19)

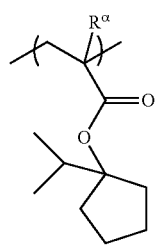 (a1-1-20)
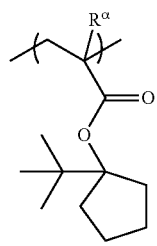 (a1-1-21)
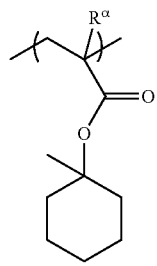 (a1-1-22)
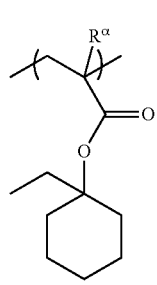 (a1-1-23)
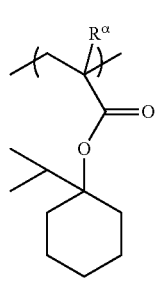 (a1-1-24)
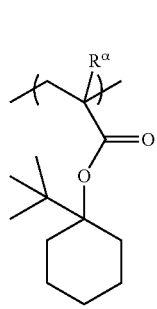 (a1-1-25)
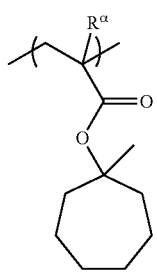 (a1-1-26)
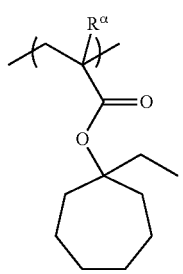 (a1-1-27)
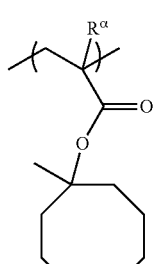 (a1-1-28)
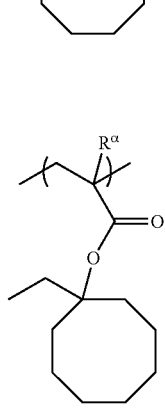 (a1-1-29)
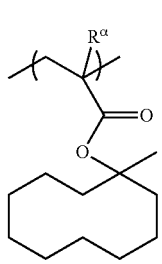 (a1-1-30)

(a1-1-31)
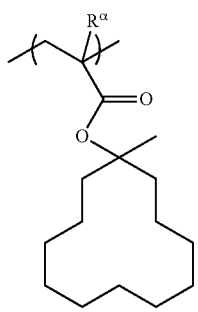
[Chemical Formula 10]
(a1-1-32)
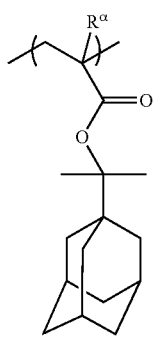
(a1-1-33)
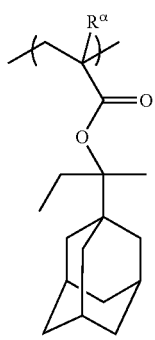
(a1-1-34)
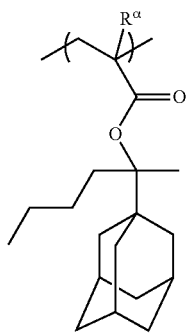
(a1-1-35)
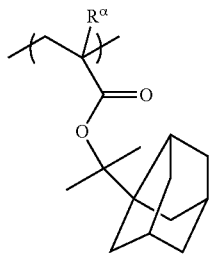
(a1-1-36)
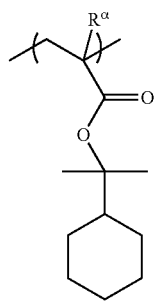
(a1-1-37)
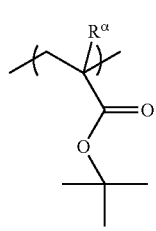
(a1-1-38)
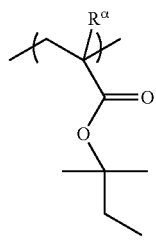
[Chemical Formula 11]
(a1-2-1)
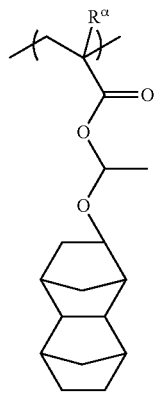
(a1-2-2)
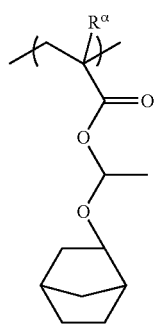

(a1-2-3)
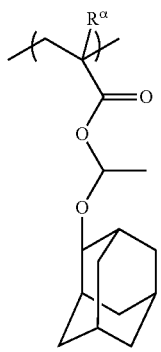
(a1-2-4)
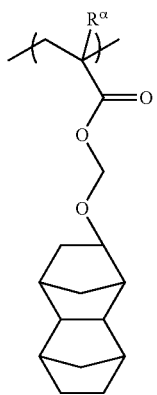
(a1-2-5)
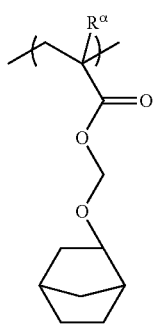
(a1-2-6)
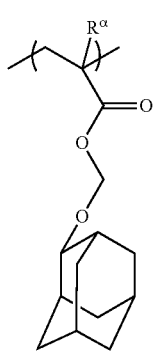
(a1-2-7)
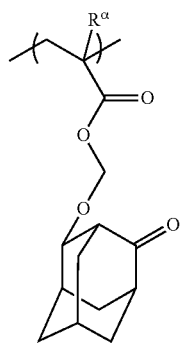
(a1-2-8)
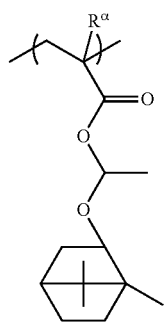
(a1-2-9)
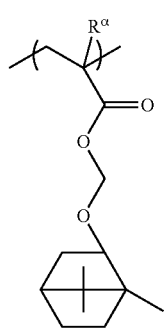
(a1-2-10)
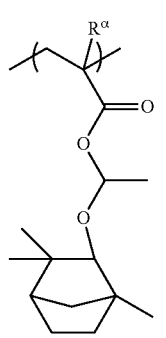
(a1-2-11)
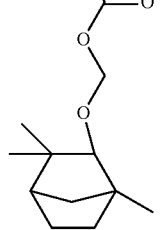

(a1-2-12) 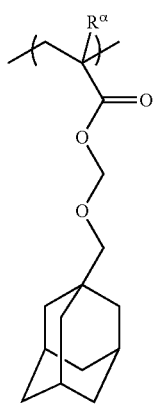
(a1-2-13) 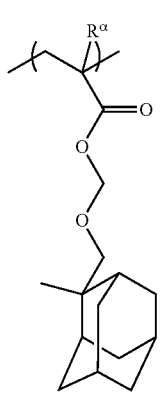
(a1-2-14) 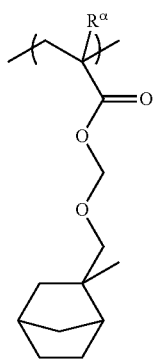
(a1-2-15) 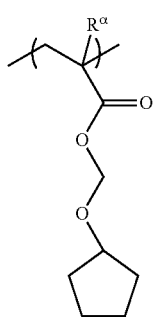
(a1-2-16) 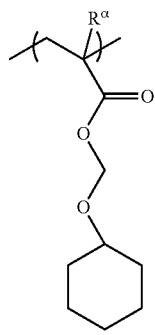
(a1-2-17) 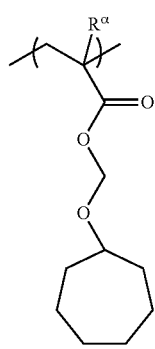
(a1-2-18) 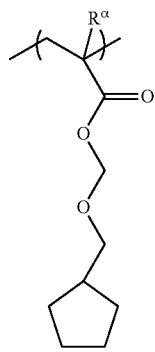
(a1-2-19) 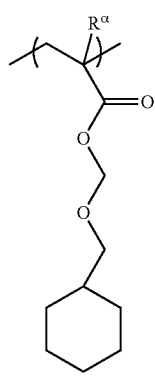

(a1-2-20)
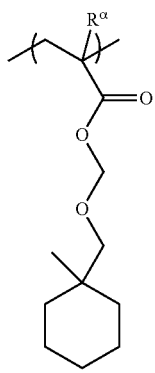
(a1-2-21)
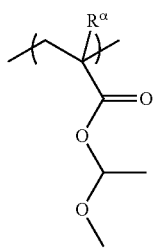
(a1-2-22)
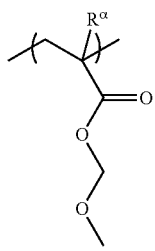
(a1-2-23)
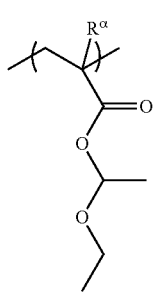
(a1-2-24)
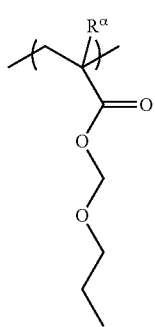
[Chemical Formula 12]
(a1-3-1)
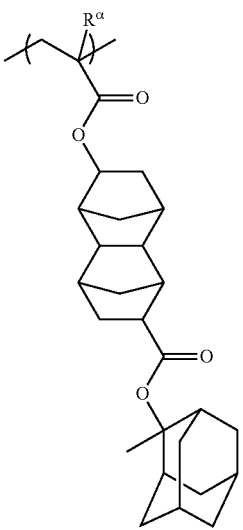
(a1-3-2)
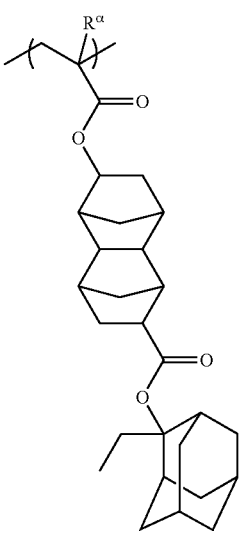
(a1-3-3)
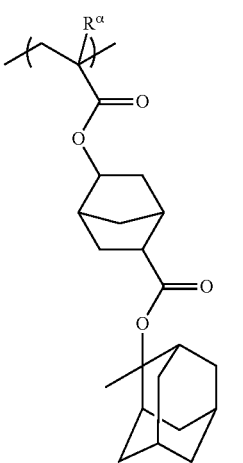

(a1-3-4)
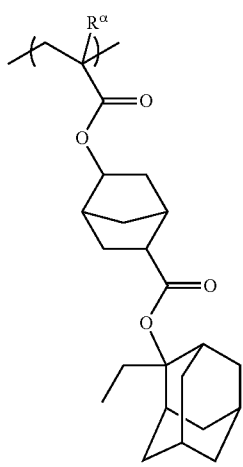
(a1-3-5)
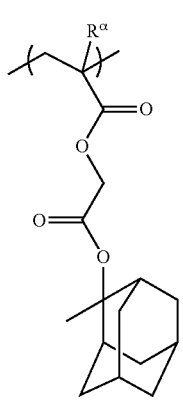
(a1-3-6)
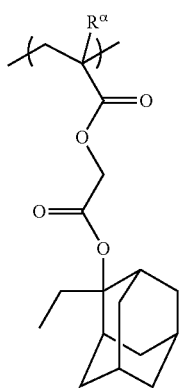
(a1-3-7)
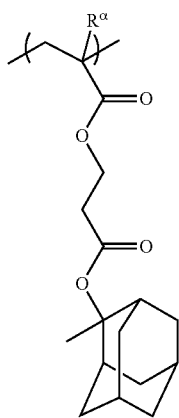
(a1-3-8)
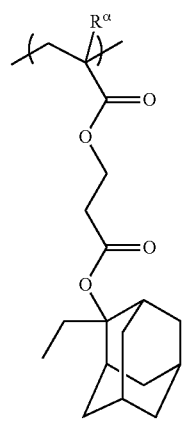
(a1-3-9)
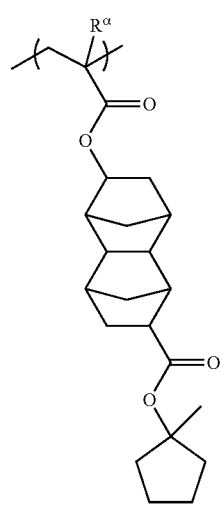
(a1-3-10)
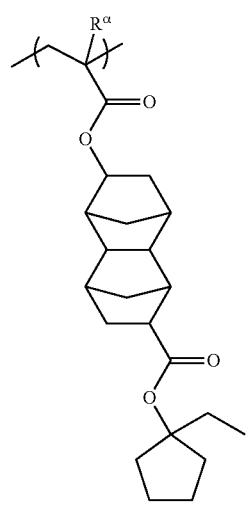

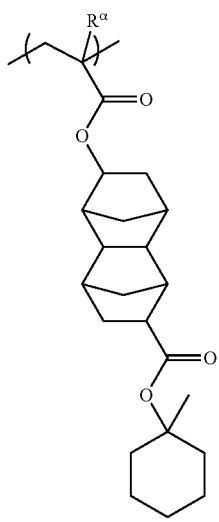 (a1-3-11)
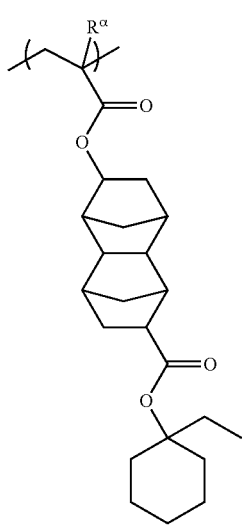 (a1-3-12)
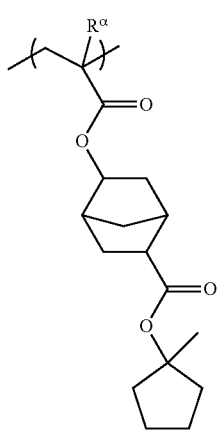 (a1-3-13)
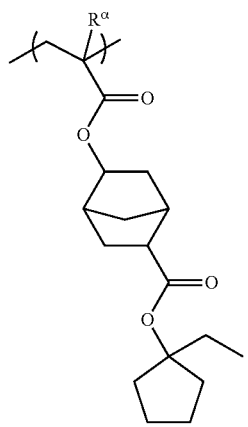 (a1-3-14)
(a1-3-15)
(a1-3-16)
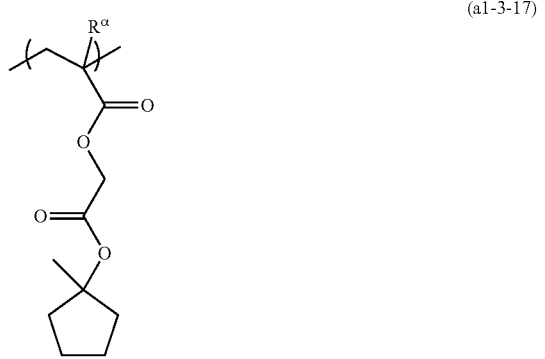 (a1-3-17)

(a1-3-18) 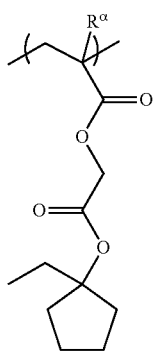
(a1-3-19) 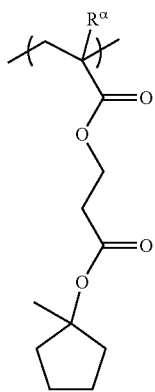
(a1-3-20) 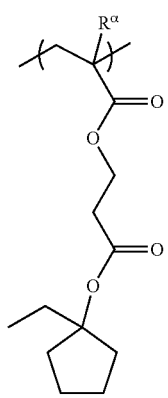
(a1-3-21) 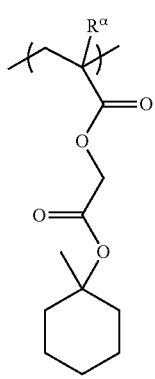
(a1-3-22) 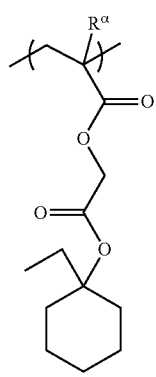
(a1-3-23) 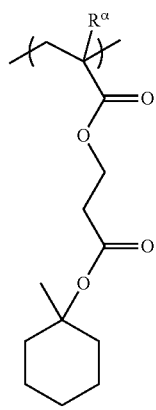
(a1-3-24) 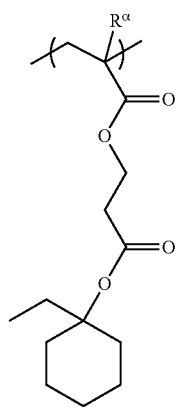

[Chemical Formula 13]
(a1-3-25) 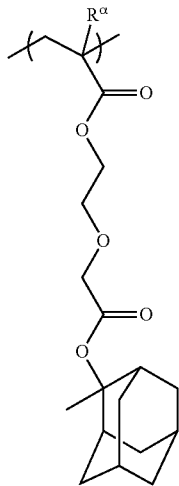
(a1-3-26) 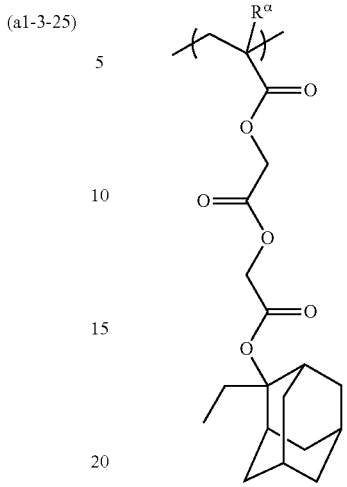
(a1-3-27)
(a1-3-28) 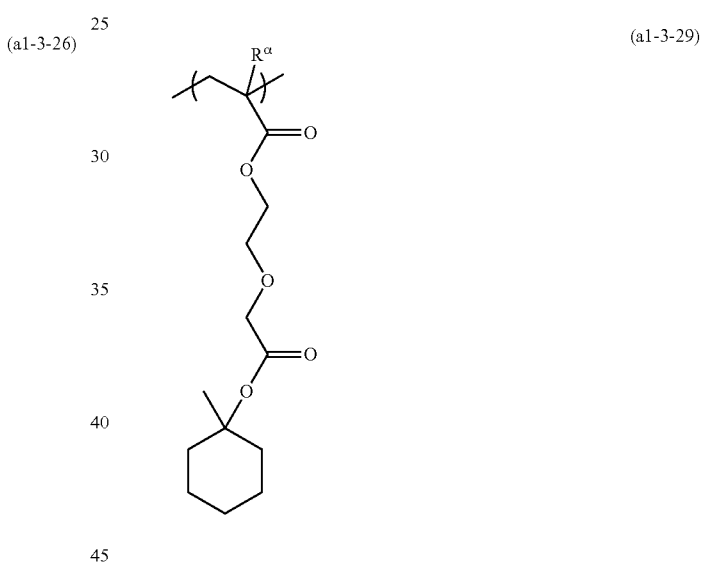
(a1-3-29)
(a1-3-30) 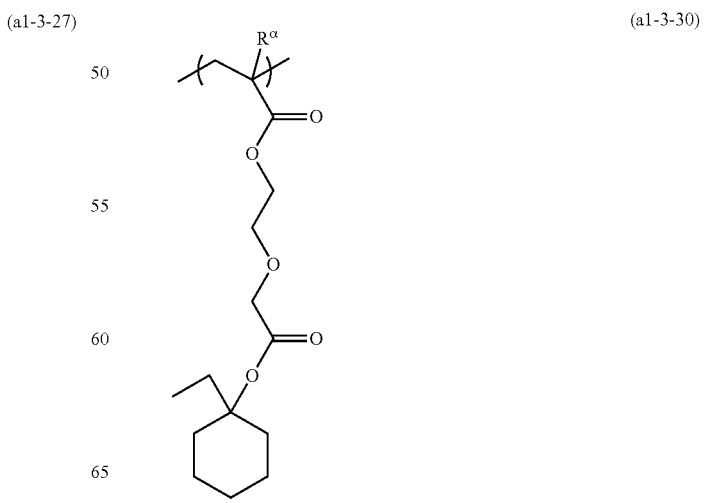

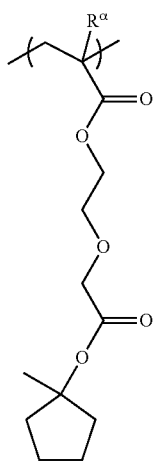
(a1-3-31)
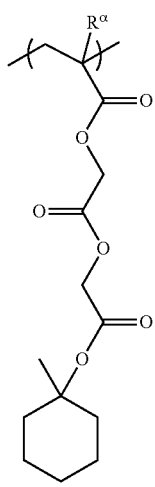
(a1-3-32)
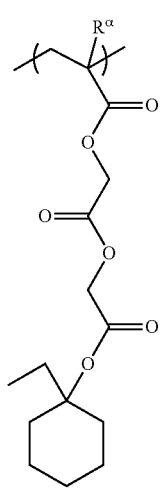
(a1-3-33)
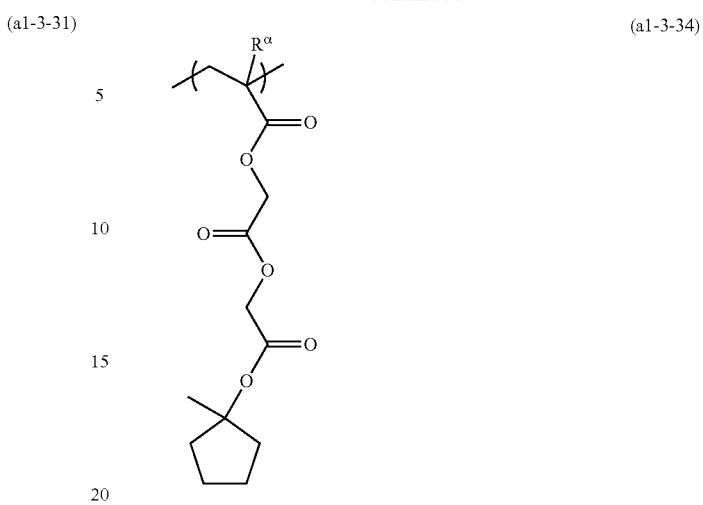
(a1-3-34)
[Chemical Formula 14]
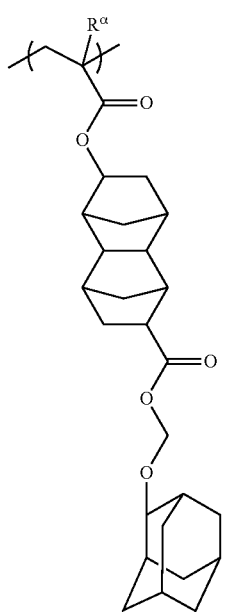
(a1-4-1)

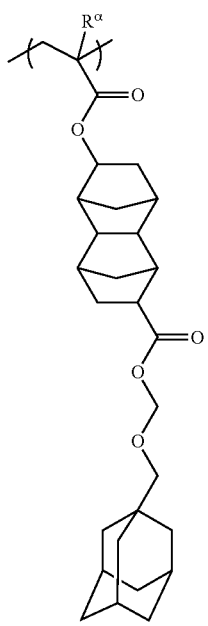
(a1-4-2)
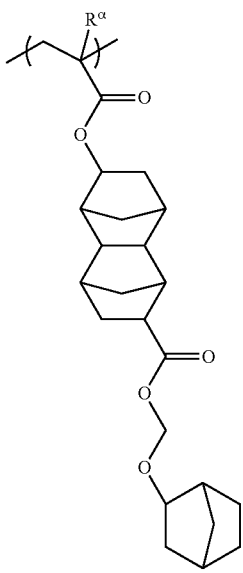
(a1-4-4)
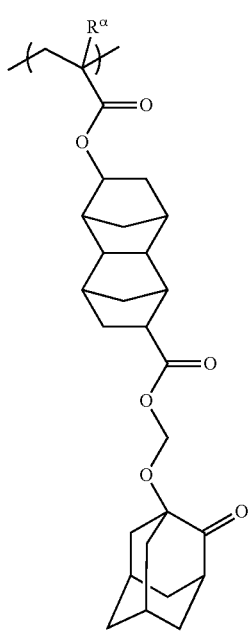
(a1-4-3)
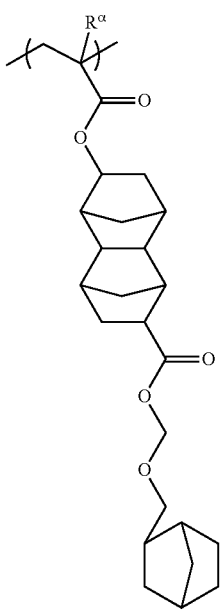
(a1-4-5)

(a1-4-6)
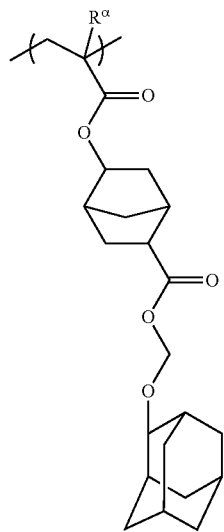
(a1-4-7)
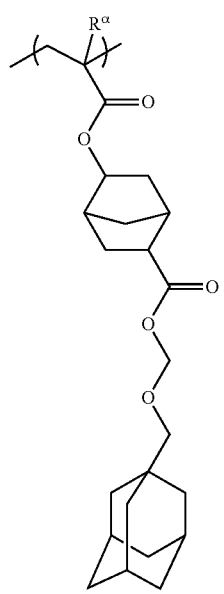
(a1-4-8)
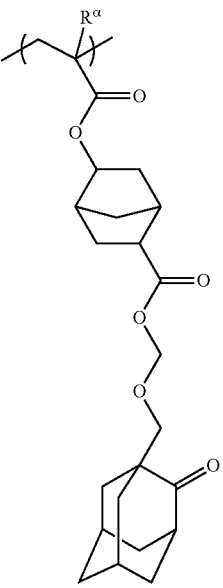
(a1-4-9)
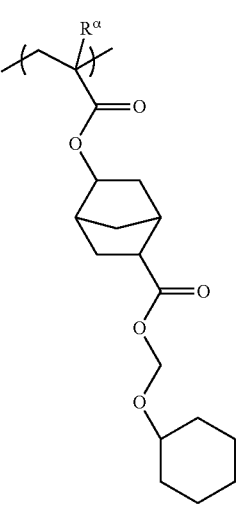
(a1-4-10)
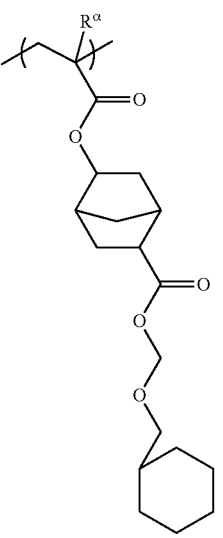

(a1-4-11)
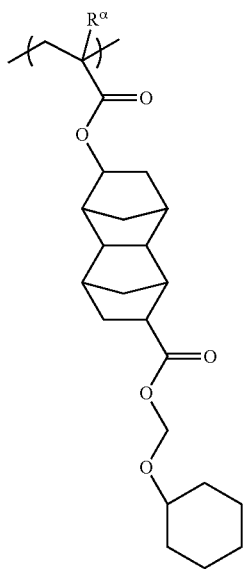
(a1-4-12)
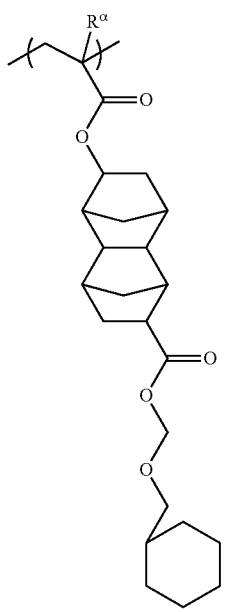
(a1-4-13)
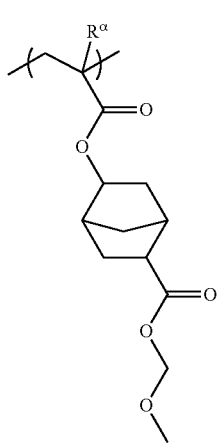
(a1-4-14)
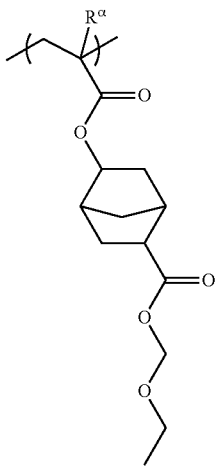
(a1-4-15)
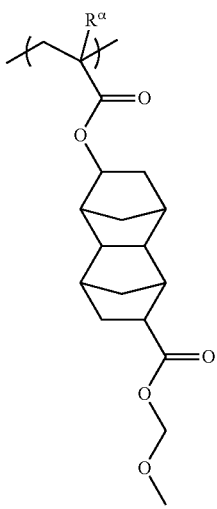
(a1-4-16)
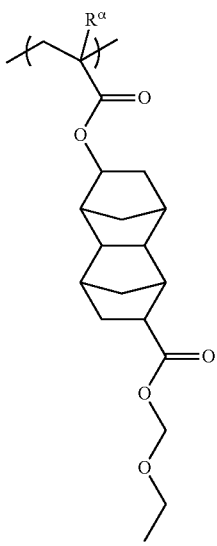
The structural unit (a11) preferably includes at least one structural unit selected from the group consisting of structural units represented by general formula (a1-0-11) shown below, structural units represented by general formula (a1-0-12) shown below, structural units represented by general formula (a1-0-13) shown below, structural units represented by general formula (a1-0-14) shown below, structural units represented by general formula (a1-0-15) shown below, and structural units represented by general formula (a1-0-2) shown below.

[Chemical Formula 15]

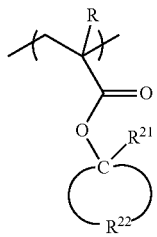
(a1-0-11)

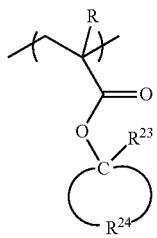
(a1-0-12)

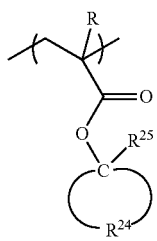
(a1-0-13)

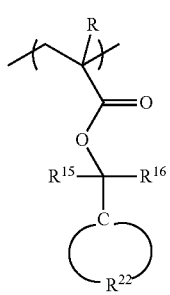
(a1-0-14)

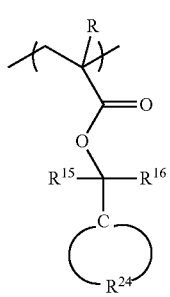
(a1-0-15)

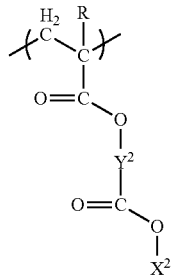
(a1-0-2)

In the formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group which forms an aliphatic monocyclic group in combination with the carbon atom to which this $R^{22}$ group is bonded, $R^{23}$ represents a branched alkyl group, $R^{24}$ represents a group which forms an aliphatic polycyclic group in combination with the carbon atom to which this $R^{24}$ group is bonded, $R^{25}$ represents a linear alkyl group of 1 to 5 carbon atoms, each of $R^{15}$ and $R^{16}$ independently represents an alkyl group, $Y^2$ represents a divalent linking group, and $X^2$ represents an acid-dissociable group.

In each of the above formulas, R, $Y^2$ and $X^2$ are the same as defined above.

In formula (a1-0-11), examples of the alkyl group for $R^{21}$ include the same alkyl groups as those described above for $R^{14}$ in formulas (1-1) to (1-9), and a methyl group, ethyl group or isopropyl group is preferred.

In terms of $R^{22}$, examples of the aliphatic monocyclic group that is formed by $R^{22}$ in combination with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

A portion of the carbon atoms that constitute the ring of the monocycloalkane may or may not be substituted with an ether group (—O—).

Examples of the $R^{22}$ group that constitutes the aliphatic monocyclic group include linear alkylene groups which may have an ether group (—O—) interposed between the carbon atoms.

Further, the aliphatic monocyclic group may have a substituent such as an alkyl group of 1 to 5 carbon atoms, a fluorine atom or a fluorinated alkyl group of 1 to 5 carbon atoms.

Specific examples of the structural units represented by formula (a1-0-11) include structural units represented by the above formulas (a1-1-18) to (a1-1-31). Among these, structural units represented by general formula (a1-1-02) shown below, which includes the structural units represented by formulas (a1-1-18) to (a1-1-29) are preferred. Furthermore, structural units represented by general formula (a1-1-02') shown below are also preferred.

In each of the formulas below, h represents an integer of 1 to 4, and is preferably 1 or 2.

[Chemical Formula 16]

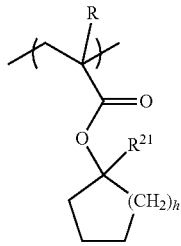
(a1-1-02)

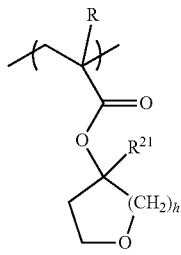
(a1-1-02')

In the formulas, R and $R^{21}$ are each the same as defined above, and h represents an integer of 1 to 4.

In formula (a1-0-12), examples of the branched alkyl group for $R^{23}$ include the same branched alkyl groups as those described above for the alkyl group for $R^{14}$ in formulas (1-1) to (1-9), and an isopropyl group is particularly desirable.

Examples of the aliphatic polycyclic group formed by $R^{24}$ in combination with the carbon atom to which $R^{24}$ is bonded include the same groups as the polycyclic groups among the aliphatic cyclic groups described above in connection with the tertiary alkyl ester-type acid-dissociable group.

Specific examples of structural units represented by general formula (a1-0-12) include the structural units represented by formulas (a1-1-4), (a1-1-5), (a1-1-8), (a1-1-12) and (a1-1-16), which were described above as specific examples of the aforementioned general formula (a1-1).

The structural unit represented by formula (a1-0-12) is preferably a structural unit in which the aliphatic polycyclic group formed by $R^{24}$ in combination with the carbon atom to which $R^{24}$ is bonded is a 2-adamantyl group, and a structural unit represented by the above formula (a1-1-4) is particularly desirable.

In formula (a1-0-13), $R^{24}$ is the same as defined above.

Examples of the linear alkyl group for $R^{25}$ include the same linear alkyl groups as those described above for the alkyl group for $R^{14}$ in the formulas (1-1) to (1-9), and a methyl group or an ethyl group is the most desirable.

Specific examples of the structural units represented by formula (a1-0-13) include the structural units represented by formulas (a1-1-1) to (a1-1-3), (a1-1-6) to (a1-1-7), (a1-1-9) to (a1-1-11), (a1-1-13) to (a1-1-15) and (a1-1-17), which were described above as specific examples of the structural unit represented by the aforementioned general formula (a1-1).

The structural unit represented by formula (a1-0-13) is preferably a structural unit in which the aliphatic polycyclic group formed by $R^{24}$ in combination with the carbon atom to which $R^{24}$ is bonded is a 2-adamantyl group, and a structural unit represented by the above formula (a1-1-1) or (a1-1-2) is particularly desirable.

In formula (a1-0-14), $R^{22}$ is the same as defined above.

$R^{15}$ and $R^{16}$ are the same as defined above for $R^{15}$ and $R^{16}$ in the aforementioned general formulas (2-1) to (2-6).

A specific example of the structural unit represented by formula (a1-0-14) is the structural unit represented by formula (a1-1-36), which was described above as a specific example of general formula (a1-1).

In formula (a1-0-15), $R^{24}$ is the same as defined above.

$R^{15}$ and $R^{16}$ are the same as defined above for $R^{15}$ and $R^{16}$ in the aforementioned general formulas (2-1) to (2-6).

Specific examples of the structural units represented by formula (a1-0-15) include the structural units represented by formulas (a1-1-32) to (a1-1-35), which were described above as specific examples of the aforementioned general formula (a1-1).

Examples of the structural units represented by formula (a1-0-2) include structural units represented by the above formulas (a1-3) and (a1-4), and of these, a structural unit represented by formula (a1-3) is particularly desirable.

As the structural unit represented by general formula (a1-0-2), structural units in which $Y^2$ in the formula is a group represented by the aforementioned formula $—Y^{21}—O—Y^{22}—$ or $—Y^{21}—C(=O)—O—Y^{22}—$ are particularly desirable.

Preferred examples of such structural units include structural units represented by general formula (a1-3-01) shown below, structural units represented by general formula (a1-3-02) shown below, and structural units represented by general formula (a1-3-03) shown below.

[Chemical Formula 17]

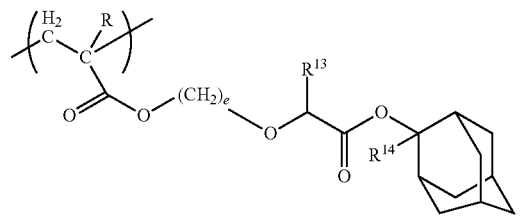
(a1-3-01)

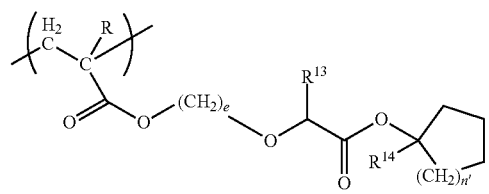
(a1-3-02)

In the formulas, R is the same as defined above, $R^{13}$ represents a hydrogen atom or a methyl group, $R^{14}$ represents an alkyl group, e represents an integer of 1 to 10, and n' represents an integer of 0 to 4.

[Chemical Formula 18]

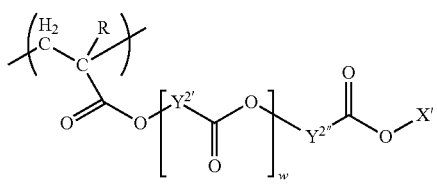

(a1-3-03)

In the formula, R is the same as defined above, each of $Y^{2\prime}$ and $Y^{2\prime\prime}$ independently represents a divalent linking group, $X'$ represents an acid-dissociable group, and w represents an integer of 0 to 3.

In formulas (a1-3-01) to (a1-3-02), $R^{13}$ is preferably a hydrogen atom.

$R^{14}$ is the same as defined for $R^{14}$ in the aforementioned formulas (1-1) to (1-9). e is preferably an integer of 1 to 8, more preferably an integer of 1 to 5, and most preferably 1 or 2.

n' is preferably 1 or 2, and most preferably 2.

Specific examples of the structural units represented by formula (a1-3-01) include the structural units represented by the above formulas (a1-3-25) and (a1-3-26).

Specific examples of structural units represented by general formula (a1-3-02) include the structural units represented by the aforementioned formulas (a1-3-29) to (a1-3-31).

Examples of the divalent linking groups for $Y^{2\prime}$ and $Y^{2\prime\prime}$ in formula (a1-3-03) include the same groups as those described above for $Y^2$ in general formula (a1-3).

$Y^{2\prime}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

$Y^{2\prime\prime}$ is preferably a divalent hydrocarbon group which may have a substituent, is more preferably a linear aliphatic hydrocarbon group, and is still more preferably a linear alkylene group. Among linear alkylene groups, a linear alkylene group of 1 to 5 carbon atoms is preferable, and a methylene group or an ethylene group is particularly desirable.

The acid-dissociable group for $X'$ is the same as defined above, is preferably a tertiary alkyl ester-type acid-dissociable group, is more preferably a group of type (i) described above, in which a substituent is bonded to a carbon atom that is bonded to the atom adjacent to the acid-dissociable group, thereby forming a tertiary carbon atom on the ring structure of a monovalent aliphatic cyclic group, and is most preferably a group represented by the above general formula (1-1).

w represents an integer of 0 to 3, and is preferably an integer of 0 to 2, more preferably 0 or 1, and most preferably 1.

The structural unit represented by general formula (a1-3-03) is preferably a structural unit represented by general formula (a1-3-03-1) or (a1-3-03-2) shown below, and among these, is most preferably a structural unit represented by formula (a1-3-03-1).

[Chemical Formula 19]

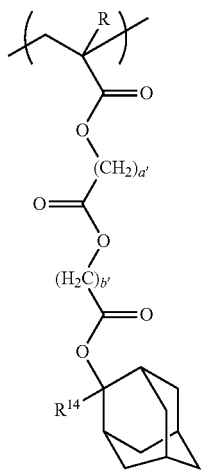

(a1-3-03-1)

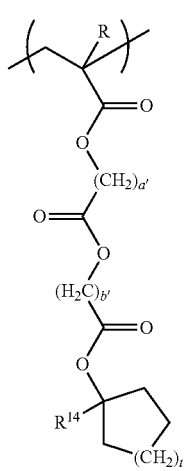

(a1-3-03-2)

In the formulas, R and $R^{14}$ are the same as defined above, a' represents an integer of 1 to 10, b' represents an integer of 1 to 10, and t represents an integer of 0 to 4.

In formulas (a1-3-03-1) and (a1-3-03-2), a' and b' are the same as a' and b' respectively in the formula $—(CH_2)_{a\prime}—C(=O)—O—(CH_2)_{b\prime}—$ mentioned above as a preferred example of the group represented by $—[Y^{21}—C(=O)—O]_{m\prime}—Y^{22}—$, which was described above in connection with the divalent linking group for $Y^2$.

a' is preferably an integer of 1 to 8, more preferably an integer of 1 to 5, and most preferably 1 or 2.

b' is preferably an integer of 1 to 8, more preferably an integer of 1 to 5, and most preferably 1 or 2.

t is preferably an integer of 1 to 4, and most preferably 1 or 2.

Specific examples of structural units represented by formulas (a1-3-03-1) and (a1-3-03-2) include structural units represented by the aforementioned formulas (a1-3-27), (a1-3-28), and (a1-3-32) to (a1-3-34).

{Structural Unit (a12)}

The structural unit (a12) is a structural unit derived from a hydroxystyrene in which the hydrogen atom bonded to the carbon atom on the α-position may be substituted with a substituent, in which the hydrogen atoms bonded to the benzene ring may be substituted with a substituent other than a hydroxyl group, and in which the hydrogen atom of the hydroxyl group is substituted with an acid-dissociable group or a substituent containing an acid-dissociable group.

Examples of the acid-dissociable group that substitutes the hydrogen atom of the hydroxyl group include the same acid-dissociable groups as those described above, and of these, a tertiary alkyl ester-type acid-dissociable group or an acetal-type acid-dissociable group is preferable, and an acetal-type acid-dissociable group is more preferable.

Examples of the substituent containing an acid-dissociable group include groups composed of an acid-dissociable group and a divalent linking group. Examples of this divalent linking group include the same divalent linking groups as those mentioned above for $Y^2$ in formula (a1-3), and a group in which the terminal structure on the acid-dissociable group-side of the group is a carbonyloxy group is particularly desirable. In such a case, the acid-dissociable group is preferably bonded to the oxygen atom (—O—) of the carbonyloxy group.

As the substituent containing an acid-dissociable group, groups represented by a formula $R^{11'}$—O—C(=O)— and groups represented by a formula $R^{11'}$—O—C(=O)—$R^{12'}$— are preferable. In these formulas, $R^{11'}$ represents an acid-dissociable group, and $R^{12'}$ represents a linear or branched alkylene group.

The acid-dissociable group for $R^{11'}$ is preferably a tertiary alkyl ester-type acid-dissociable group or an acetal-type acid-dissociable group, and is more preferably a tertiary alkyl ester-type acid-dissociable group. Preferred examples of the tertiary alkyl ester-type acid-dissociable group include the aforementioned aliphatic branched acid-dissociable groups represented by the formula —C($R^{71}$)($R^{72}$)($R^{73}$), groups represented by formulas (1-1) to (1-9), and groups represented by formulas (2-1) to (2-6).

Examples of the alkylene group for $R^{12'}$ include a methylene group, ethylene group, trimethylene group, tetramethylene group and 1,1-dimethylethylene group. A linear alkylene group is preferable as $R^{12'}$.

There are no particular limitations on the "substituent other than a hydroxyl group" that may substitute a hydrogen atom bonded to the benzene ring, and examples include a halogen atom, an alkyl group of 1 to 5 carbon atoms, a halogenated alkyl group of 1 to 5 carbon atoms, and a carboxyl group. Examples of the halogen atom include a fluorine atom, chlorine atom, bromine atom and iodine atom, and a fluorine atom is particularly desirable.

The structural unit (a12) is preferably a structural unit represented by general formula (a12-1) shown below.

[Chemical Formula 20]

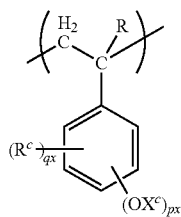

(a12-1)

In the formula, R represents a hydrogen atom, an alkyl group of 1 to 5 carbon atoms or a halogenated alkyl group of 1 to 5 carbon atoms, px represents an integer of 1 to 3 and qx represents an integer of 0 to 4, provided that px+qx is an integer of 1 to 5. Each of the px $X^c$ groups independently represents a hydrogen atom, an acid-dissociable group or a substituent containing an acid-dissociable group, provided that at least one $X^c$ group represents an acid-dissociable group or a substituent containing an acid-dissociable group. Each of the qx $R^c$ groups independently represents a halogen atom, an alkyl group of 1 to 5 carbon atoms or a halogenated alkyl group of 1 to 5 carbon atoms.

In formula (a12-1), R is the same as defined above.

Examples of the acid-dissociable group and the substituent containing an acid-dissociable group for $X^c$ include the same groups as those mentioned above.

px represents an integer of 1 to 3, and is preferably 1.

When px represents 2 or 3, the plurality of $X^c$ groups in the formula may be the same or different. For example, one of the $X^c$ groups may be an acid-dissociable group or a substituent containing an acid-dissociable group, and the other one or two $X^c$ groups may be hydrogen atoms. Similarly, when qx represents an integer of 2 to 4, the plurality of $R^c$ groups may be the same or different.

There are no particular limitations on the bonding position(s) of the $OX^C$ group(s) to the benzene ring in the formula. When px represents 1, the $OX^C$ group is preferably bonded to the para-position (4th position) relative to the position to which the α-position carbon atom (the carbon atom bonded to R) is bonded. When px represents an integer of 2 or greater, any arbitrary combination of bonding positions may be used.

Examples of the halogen atom for $R^c$ include a fluorine atom, chlorine atom, bromine atom and iodine atom, and a fluorine atom is particularly desirable.

Examples of the alkyl group and halogenated alkyl group for $R^c$ include the same groups as those mentioned above for the alkyl group and halogenated alkyl group for R.

{Structural Unit (a13)}

The structural unit (a13) is a structural unit derived from a vinyl(hydroxynaphthalene) in which the hydrogen atom bonded to the carbon atom on the α-position may be substituted with a substituent, in which the hydrogen atoms bonded to the naphthalene ring may be substituted with a substituent other than a hydroxyl group, and in which the hydrogen atom of the hydroxyl group is substituted with an acid-dissociable group or a substituent containing an acid-dissociable group.

In the structural unit (a13), examples of the acid-dissociable group or substituent containing an acid-dissociable group that substitutes the hydrogen atom of the hydroxyl group include the same groups and substituents as those mentioned above within the description of the structural unit (a12).

There are no particular limitations on the "substituent other than a hydroxyl group" that may substitute a hydrogen atom bonded to the naphthalene ring, and examples include a halogen atom, an alkyl group of 1 to 5 carbon atoms, a halogenated alkyl group of 1 to 5 carbon atoms, and a carboxyl group. Examples of the halogen atom include a fluorine atom, chlorine atom, bromine atom and iodine atom, and a fluorine atom is particularly desirable.

The structural unit (a13) is preferably a structural unit represented by general formula (a13-1) shown below.

[Chemical Formula 21]

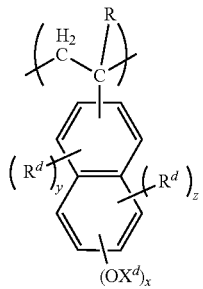

(a13-1)

In the formula, R represents a hydrogen atom, an alkyl group of 1 to 5 carbon atoms or a halogenated alkyl group of 1 to 5 carbon atoms, x represents an integer of 1 to 3, y represents an integer of 0 to 3, and z represents an integer of 0 to 3, provided that x+y+z is an integer of 1 to 7. Each of the x $X^d$ groups independently represents a hydrogen atom, an acid-dissociable group or a substituent containing an acid-dissociable group, provided that at least one $X^d$ group represents an acid-dissociable group or a substituent containing an acid-dissociable group. Each of the y+z $R^d$ groups independently represents a halogen atom, an alkyl group of 1 to 5 carbon atoms or a halogenated alkyl group of 1 to 5 carbon atoms.

In formula (a13-1), R is the same as defined above.

Examples of the acid-dissociable group and the substituent containing an acid-dissociable group for $X^d$ include the same groups as those mentioned above.

x represents an integer of 1 to 3, and is preferably 1.

When x represents 2 or 3, the plurality of $X^d$ groups in the formula may be the same or different. For example, one of the $X^d$ groups may be an acid-dissociable group or a substituent containing an acid-dissociable group, and the other one or two $X^d$ groups may be hydrogen atoms. Similarly, when x+y represents an integer of 2 to 6, the plurality of $R^d$ groups may be the same or different.

In the formula above, the α-position carbon atom (the carbon atom to which R is bonded) may be bonded to the 1st or 2nd position of the naphthalene.

There are no particular limitations on the bonding position(s) of the $OX^d$ group(s) to the naphthalene ring in the formula. When the α-position carbon atom is bonded to the 1st or 2nd position of the naphthalene, the $OX^d$ group(s) are preferably bonded to any of the 5th to 8th positions of the naphthalene ring. In particular, when there is only one $OX^d$ group, the $OX^d$ group is preferably bonded to any one of the 5th to 7th positions of the naphthalene ring, and is more preferably bonded to the 5th or 6th position. When the number of $OX^d$ groups is an integer of two or greater, any arbitrary combination of bonding positions may be used.

Examples of the halogen atom, alkyl group and halogenated alkyl group for $R^d$ include the same atoms and groups as those mentioned above for the halogen atom, alkyl group and halogenated alkyl group for $R^c$.

The component (A1) may contain a single type of the structural unit (a1), or may contain a combination of two or more types of the structural unit (a1).

Among the various possibilities described above, the structural unit (a1) is preferably the structural unit (a11).

The amount of the structural unit (a1) within the component (A1), based on the combined total of all the structural units that constitute the component (A1), is preferably within a range from 15 to 70 mol %, more preferably from 15 to 60 mol %, and still more preferably from 20 to 55 mol %. When the amount of the structural unit (a1) is at least as large as the lower limit of the above range, a pattern can be formed easily using a resist composition prepared from the component (A1), and the lithography properties such as the sensitivity, the resolution and the pattern shape also improve. On the other hand, when the amount of the structural unit (a1) is not more than the upper limit of the above range, a good balance can be achieved with the other structural units.

[Structural Unit (a2)]

The component (A1) preferably also includes, in addition to the structural unit (a1), a structural unit (a2) containing an —$SO_2$-containing cyclic group or a lactone-containing cyclic group.

When the component (A1) is used in forming a resist film, the —$SO_2$-containing cyclic group or lactone-containing cyclic group of the structural unit (a2) is effective in improving the adhesion of the resist film to the substrate. Further, because the structural unit (a2) also improves the affinity of the component (A1) with developing solutions containing water, such as alkali developing solutions, the structural unit (a2) is particularly effective in an alkali developing process.

In those cases where the structural unit (a1) includes an —$SO_2$-containing cyclic group or a lactone-containing cyclic group within the unit structure, although such a structural unit may also be classified as a structural unit (a2), in this description, this type of structural unit is classified as the structural unit (a1), and not as the structural unit (a2).

Here, an "—$SO_2$-containing cyclic group" refers to a cyclic group having a ring containing —$SO_2$— within the ring structure, and refers specifically to a cyclic group in which the sulfur atom (S) within —$SO_2$— forms a part of the ring structure of the cyclic group. In the —$SO_2$-containing cyclic group, the ring containing —$SO_2$— within the ring structure is counted as the first ring, and a cyclic group containing only this first ring is referred to as a monocyclic group, and a group containing other ring structures is described as a polycyclic group regardless of the structure of the other rings. The —$SO_2$-containing cyclic group may be either a monocyclic group or a polycyclic group.

The —$SO_2$-containing cyclic group is preferably a cyclic group containing —O—$SO_2$— within the ring structure, namely a cyclic group containing a sultone ring in which the —O—S— within the —O—$SO_2$— forms a part of the ring structure of the cyclic group.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be either an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which part of the carbon atoms that constitute the ring structure have been substituted with either —$SO_2$— or —O—$SO_2$—. More specific examples include groups in which at least one hydrogen atom has been removed from an aliphatic hydrocarbon ring in which a —CH$_2$— group that constitutes part of the ring structure has been substituted with an —SO$_2$-group, and groups in which at least one hydrogen atom has been removed from an aliphatic hydrocarbon ring in which a —CH$_2$—CH$_2$— group that constitutes part of the ring structure has been substituted with an —O—SO$_2$— group.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, a group in which two hydrogen atoms have been removed from a monocycloalkane of 3 to 6 carbon atoms is preferable. Examples of the monocycloalkane include cyclopentane and cyclohexane. As the polycyclic alicyclic hydrocarbon group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The —SO$_2$-containing cyclic group may have a substituent. Examples of the substituent include an alkyl group, alkoxy group, halogen atom, halogenated alkyl group, hydroxyl group, oxygen atom (=O), —COOR'', —OC(=O)R'', hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferable, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group substituent have each been substituted with an aforementioned halogen atom. A fluorinated alkyl group is preferable as the halogenated alkyl group, and a perfluoroalkyl group is particularly desirable.

In the aforementioned —COOR'' group and —OC(=O)R'' group, R'' represents a hydrogen atom, or a linear, branched or cyclic alkyl group of 1 to 15 carbon atoms.

When R'' represents a linear or branched alkyl group, the alkyl group preferably contains 1 to 10 carbon atoms, and more preferably 1 to 5 carbon atoms, and is most preferably a methyl group or an ethyl group.

When R'' is a cyclic alkyl group (cycloalkyl group), the cycloalkyl group preferably contains 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, and groups in which one or more hydrogen atoms have been removed from a polycycloalkane such as adamantane, norbornane, isobornane, tricyclodecane or tetracyclododecane.

The hydroxyalkyl group for the above substituent preferably has 1 to 6 carbon atoms, and specific examples include groups in which at least one hydrogen atom within an aforementioned alkyl group for the substituent has been substituted with a hydroxyl group.

More specific examples of the —SO$_2$-containing cyclic group include groups represented by general formulas (3-1) to (3-4) shown below.

[Chemical Formula 22]

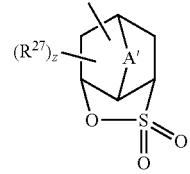

(3-1)

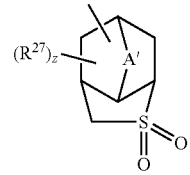

(3-2)

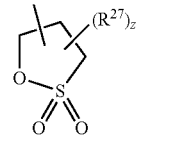

(3-3)

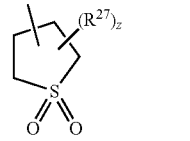

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR'', —OC(=O)R'', hydroxyalkyl group or cyano group, wherein R'' represents a hydrogen atom or an alkyl group.

In the above general formulas (3-1) to (3-4), A' represents an oxygen atom (—O—), a sulfur atom (—S—), or an alkylene group of 1 to 5 carbon atoms which may contain an oxygen atom or a sulfur atom.

The alkylene group of 1 to 5 carbon atoms for A' is preferably a linear or branched alkylene group, and specific examples include a methylene group, ethylene group, n-propylene group and isopropylene group.

Examples of alkylene groups which contain an oxygen atom or a sulfur atom include the aforementioned alkylene groups in which —O— or —S— is either bonded to the terminal of the alkylene group or interposed between carbon atoms of the alkylene group. Specific examples of such alkylene groups include —O—CH$_2$—, —CH$_2$—O—CH$_2$—, —S—CH$_2$— and —CH$_2$—S—CH$_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^{27}$ groups may be the same or different.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above as the substituent for the —SO$_2$-containing cyclic group.

Specific examples of the cyclic groups represented by general formulas (3-1) to (3-4) are shown below. In the formulas shown below, "Ac" represents an acetyl group.

[Chemical Formula 23]

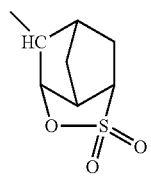 (3-1-1)

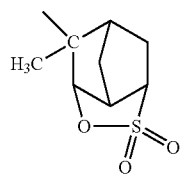 (3-1-2)

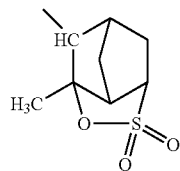 (3-1-3)

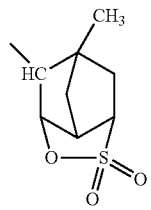 (3-1-4)

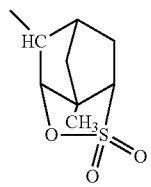 (3-1-5)

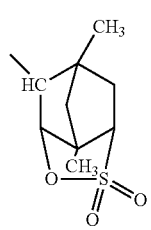 (3-1-6)

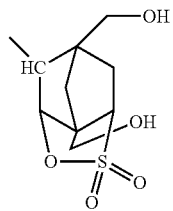 (3-1-7)

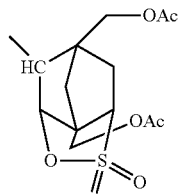 (3-1-8)

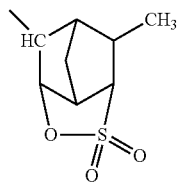 (3-1-9)

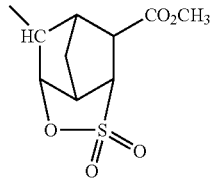 (3-1-10)

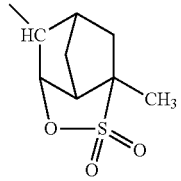 (3-1-11)

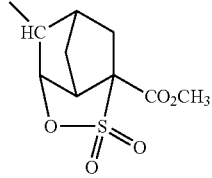 (3-1-12)

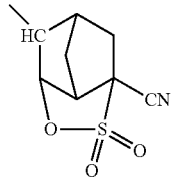 (3-1-13)

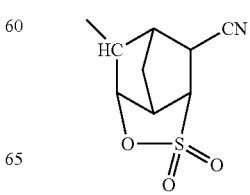 (3-1-14)

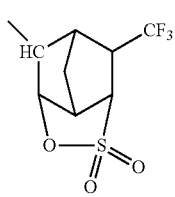
(3-1-15)
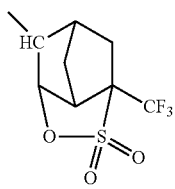
(3-1-16)
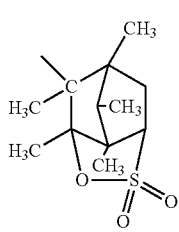
(3-1-17)
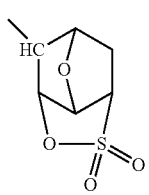
(3-1-18)
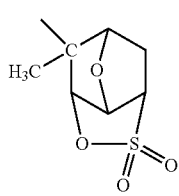
(3-1-19)
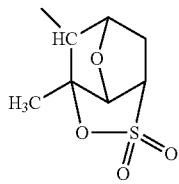
(3-1-20)
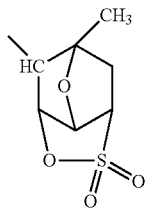
(3-1-21)
[Chemical Formula 24]
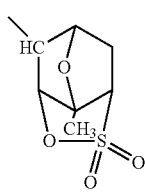
(3-1-22)
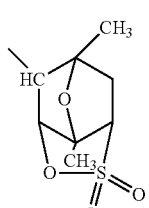
(3-1-23)
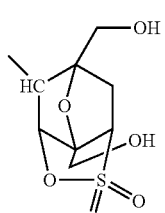
(3-1-24)
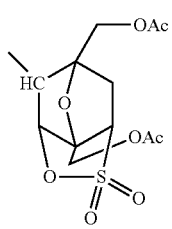
(3-1-25)
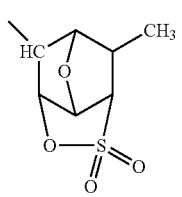
(3-1-26)
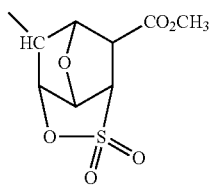
(3-1-27)
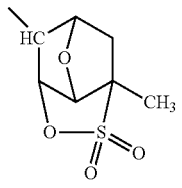
(3-1-28)
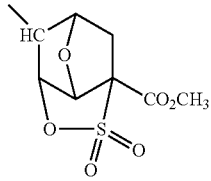
(3-1-29)
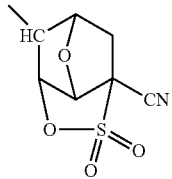
(3-1-30)

-continued (3-1-31)
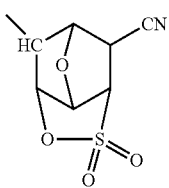

(3-1-32)
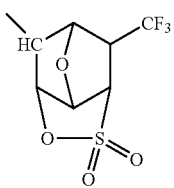

(3-1-33)
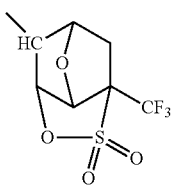

[Chemical Formula 25]

(3-2-1)
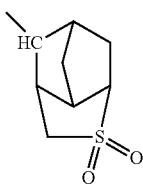

(3-2-2)
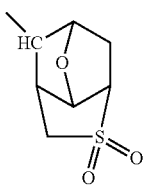

(3-3-1)
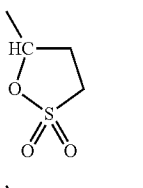

(3-4-1)
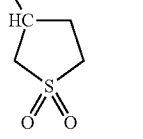

Of the groups shown above, the —SO$_2$-containing cyclic group is preferably a group represented by the above general formula (3-1), more preferably at least one group selected from the group consisting of groups represented by the above chemical formulas (3-1-1), (3-1-18), (3-3-1) and (3-4-1), and most preferably a group represented by the chemical formula (3-1-1).

The term "lactone-containing cyclic group" refers to a cyclic group including a ring (lactone ring) containing —O—C(=O)— within the ring structure. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be monocyclic or polycyclic.

There are no particular limitations on the lactone-containing cyclic group in the structural unit (a2), and any arbitrary structural unit may be used. Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Provided the structural unit (a2) contains an —SO$_2$-containing cyclic group or a lactone-containing cyclic group, there are no particular limitations on the other portions of the structural unit, but the structural unit (a2) is preferably at least one structural unit selected from the group consisting of a structural unit (a2$^S$) derived from an acrylate ester in which the hydrogen atom bonded to the carbon atom on the α-position may be substituted with a substituent and containing an —SO$_2$-containing cyclic group, and a structural unit (a2$^L$) derived from an acrylate ester in which the hydrogen atom bonded to the carbon atom on the α-position may be substituted with a substituent and containing a lactone-containing cyclic group.

Structural Unit (a2$^S$):

Specific examples of the structural unit (a2$^S$) include structural units represented by general formula (a2-0) shown below.

[Chemical Formula 26]

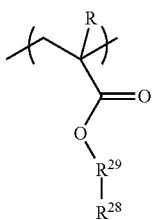

(a2-0)

In the formula, R represents a hydrogen atom, an alkyl group of 1 to 5 carbon atoms or a halogenated alkyl group of 1 to 5 carbon atoms, $R^{28}$ represents an —SO$_2$-containing cyclic group, and $R^{29}$ represents a single bond or a divalent linking group.

In formula (a2-0), R is the same as defined above.

$R^{28}$ is the same as the —SO$_2$-containing cyclic group described above.

$R^{29}$ may be either a single bond or a divalent linking group. A divalent linking group is preferable in terms of achieving superior effects for the present invention.

There are no particular limitations on the divalent linking group for $R^{29}$, and examples include the same groups as those mentioned above for the divalent linking group for $Y^2$ in formula (a1-3). Among these groups, an alkylene group or a group containing an ester linkage (—C(=O)—O—) is preferable.

The alkylene group is preferably a linear or branched alkylene group. Specific examples include the same groups as the linear alkylene groups and branched alkylene groups described above for the aliphatic hydrocarbon group for $Y^2$.

The divalent linking group containing an ester linkage is preferably a group represented by general formula: —$R^{30}$—C(=O)—O— (wherein $R^{30}$ represents a divalent linking group). In other words, the structural unit ($a2^S$) is preferably a structural unit represented by general formula (a2-0-1) shown below.

[Chemical Formula 27]

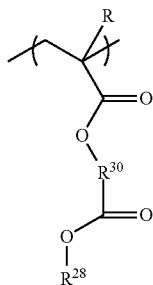

(a2-0-1)

In the formula, R and $R^{28}$ are each the same as defined above, and $R^{30}$ represents a divalent linking group.

There are no particular limitations on $R^{30}$, and examples include the same groups as the divalent linking groups described above for $Y^2$ in formula (a1-3).

The divalent linking group for $R^{30}$ is preferably a linear or branched alkylene group, an aliphatic hydrocarbon group that includes a ring within the structure, or a divalent linking group containing a hetero atom, and is more preferably a linear or branched alkylene group, or a divalent linking group containing an oxygen atom as a hetero atom.

As the linear alkylene group, a methylene group or ethylene group is preferable, and a methylene group is particularly desirable.

As the branched alkylene group, an alkylmethylene group or alkylethylene group is preferable, and —CH(CH$_3$)—, —C(CH$_3$)$_2$— and —C(CH$_3$)$_2$CH$_2$— are particularly desirable.

As the divalent linking group containing an oxygen atom, a divalent linking group containing an ether linkage or an ester linkage is preferable, and a group represented by one of the aforementioned formulas —$Y^{21}$—O—$Y^{22}$—, —[$Y^{21}$—C(=O)—O]$_{m'}$—$Y^{22}$— or —$Y^{21}$—O—C(=O)—$Y^{22}$— more preferable. Each of $Y^{21}$ and $Y^{22}$ independently represents a divalent hydrocarbon group which may have a substituent, and m' represents an integer of 0 to 3. Among these groups, a group represented by —$Y^{21}$—O—C(=O)—$Y^{22}$— is preferable, and a group represented by —(CH$_2$)$_c$—O—C(=O)—(CH$_2$)$_d$— is particularly desirable. In this formula, c represents an integer of 1 to 5, and is preferably 1 or 2, whereas d represents an integer of 1 to 5, and is preferably 1 or 2.

As the structural unit ($a2^S$), a structural unit represented by general formula (a2-0-11) or (a2-0-12) shown below is preferable, and a structural unit represented by formula (a2-0-12) is particularly desirable.

[Chemical Formula 28]

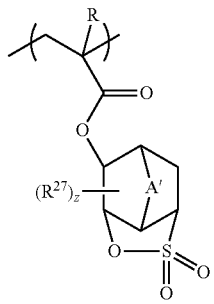

(a2-0-11)

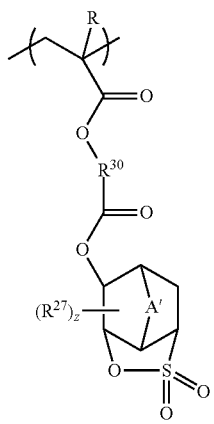

(a2-0-12)

In the formulas, R, A', $R^{27}$, z and $R^{30}$ are the same as defined above.

In formula (a2-0-11), A' is preferably a methylene group, an oxygen atom (—O—) or a sulfur atom (—S—).

$R^{30}$ is preferably a linear or branched alkylene group, or a divalent linking group containing an oxygen atom. Examples of the linear or branched alkylene group and the divalent linking group containing an oxygen atom for $R^{30}$ include the same linear or branched alkylene groups and divalent linking groups containing an oxygen described above.

As the structural unit represented by formula (a2-0-12), a structural unit represented by general formula (a2-0-12a) or (a2-0-12b) shown below is particularly desirable.

[Chemical Formula 29]

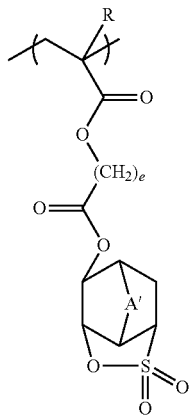

(a2-0-12a)

-continued

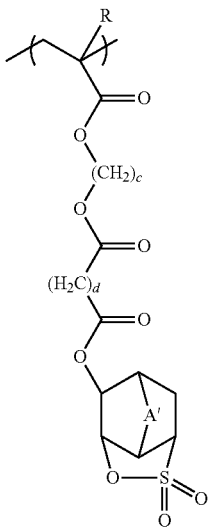

(a2-0-12b)

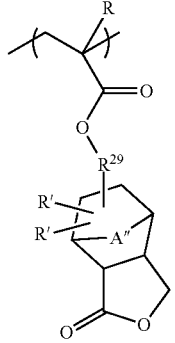

(a2-3)

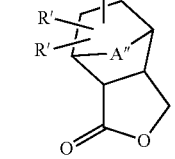

(a2-4)

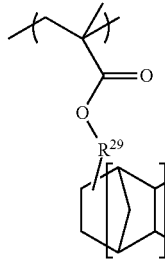

(a2-5)

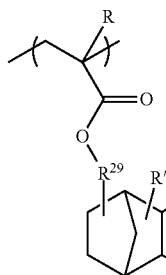

In the formulas, R and A' are each the same as defined above, and each of c to e independently represents an integer of 1 to 3.

Structural Unit (a2$^L$):

Examples of the structural unit (a2$^L$) include structural units of the above general formula (a2-0) in which R$^{28}$ has been substituted with a lactone-containing cyclic group, and more specific examples include structural units represented by general formulas (a2-1) to (a2-5) shown below.

[Chemical Formula 30]

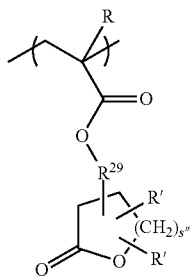

(a2-1)

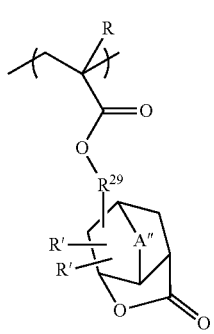

(a2-2)

In the above formulas, R represents a hydrogen atom, an alkyl group of 1 to 5 carbon atoms or a halogenated alkyl group of 1 to 5 carbon atoms, each R' independently represents a hydrogen atom, alkyl group, alkoxy group, halogenated alkyl group, hydroxyl group, —COOR", —OC(═O)R", hydroxyalkyl group or cyano group, wherein R" represents a hydrogen atom or an alkyl group, R$^{29}$ represents a single bond or a divalent linking group, s" represents an integer of 0 to 2, A" represents an oxygen atom, a sulfur atom or an alkylene group of 1 to 5 carbon atoms which may contain an oxygen atom or a sulfur atom, and m represents 0 or 1.

In general formulas (a2-1) to (a2-5), R is the same as defined above.

Examples of the alkyl group, alkoxy group, halogenated alkyl group, —COOR" group, —OC(═O)R" group and hydroxyalkyl group for R' include the same alkyl groups, alkoxy groups, halogenated alkyl groups, —COOR" groups, —OC(═O)R" groups and hydroxyalkyl groups as those mentioned above for the substituent of the —SO$_2$-containing cyclic group.

In terms of factors such as ease of industrial availability, R' is preferably a hydrogen atom.

The alkyl group for R" may be a linear, branched or cyclic alkyl group.

When R" is a linear or branched alkyl group, the alkyl group preferably contains 1 to 10 carbon atoms, and more preferably 1 to 5 carbon atoms.

When R″ is a cyclic alkyl group (cycloalkyl group), the cycloalkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of A″ include the same groups as those described above for A′ in general formula (3-1). A″ is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or dimethylmethylene group is preferable, and a methylene group is the most desirable.

$R^{29}$ is the same as defined above for $R^{29}$ in general formula (a2-0).

In formula (a2-1), s″ is preferably 1 or 2.

Specific examples of structural units represented by general formulas (a2-1) to (a2-5) are shown below. In each of the following formulas, $R^\alpha$ represents a hydrogen atom, a methyl group or a trifluoromethyl group.

[Chemical Formula 31]

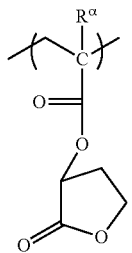

(a2-1-1)

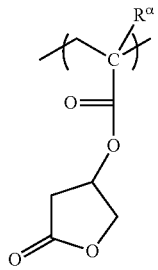

(a2-1-2)

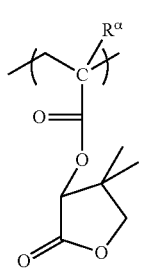

(a2-1-3)

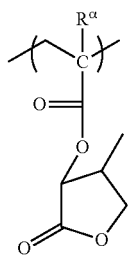

(a2-1-4)

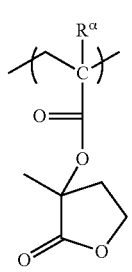

(a2-1-5)

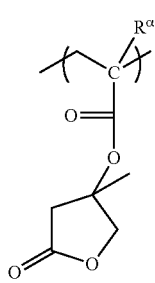

(a2-1-6)

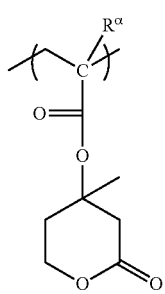

(a2-1-7)

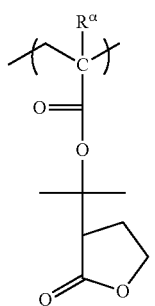

(a2-1-8)

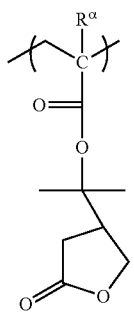 (a2-1-9)
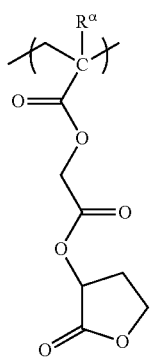 (a2-1-10)
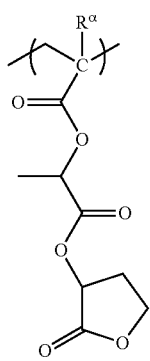 (a2-1-11)
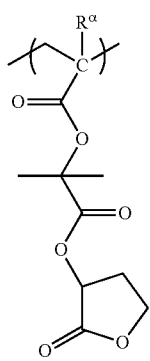 (a2-1-12)
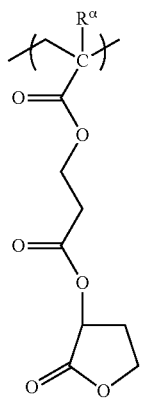 (a2-1-13)
[Chemical Formula 32]
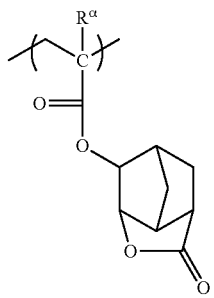 (a2-2-1)
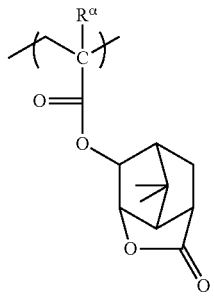 (a2-2-2)
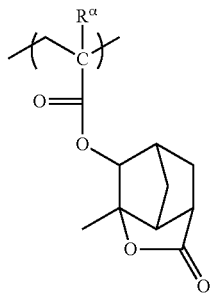 (a2-2-3)
(a2-2-4)

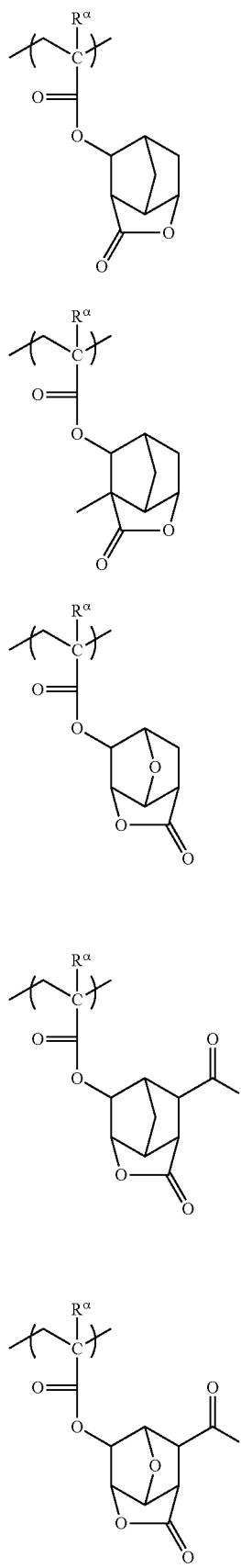
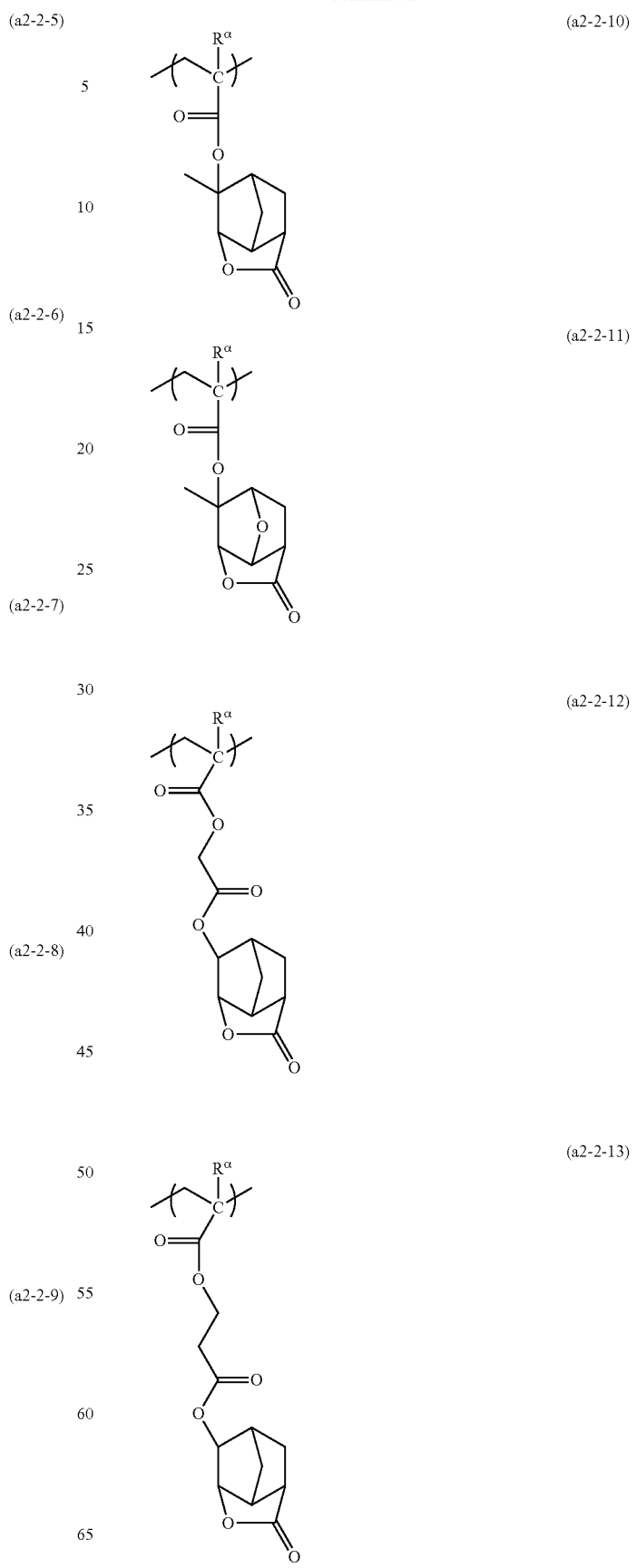

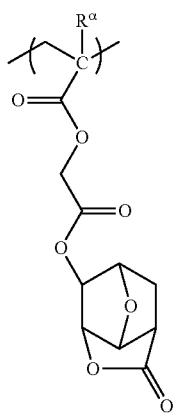 (a2-2-14)
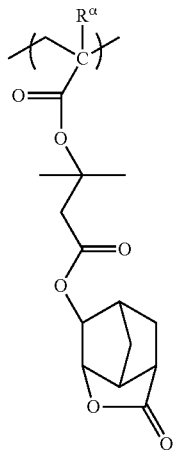 (a2-2-17)
[Chemical Formula 33]
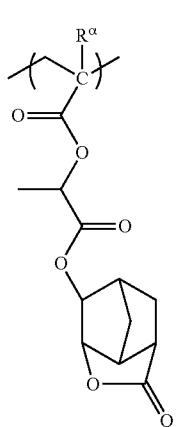 (a2-2-15)
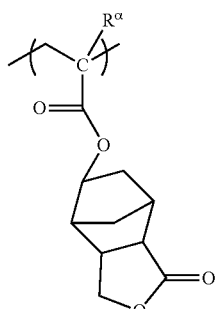 (a2-3-1)
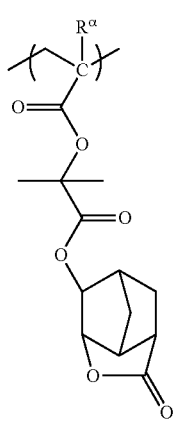 (a2-2-16)
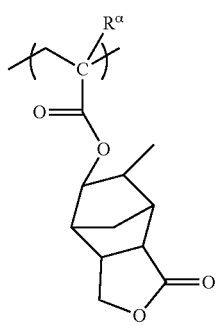 (a2-3-2)
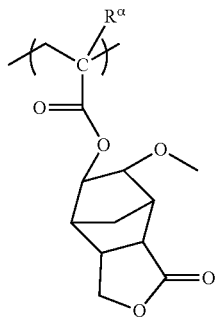 (a2-3-3)

(a2-3-4)
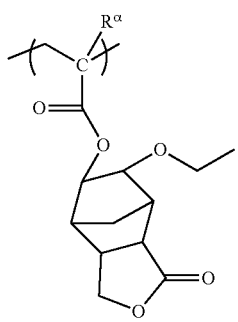
(a2-3-5)
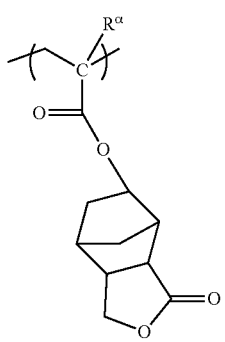
[Chemical Formula 34]
(a2-4-1)
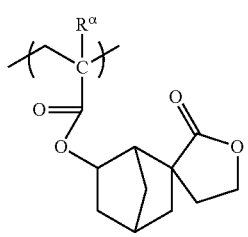
(a2-4-2)
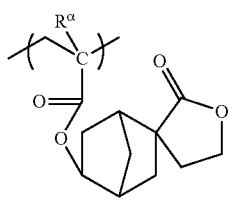
(a2-4-3)
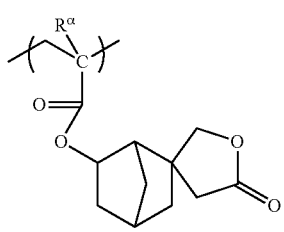
(a2-4-4)
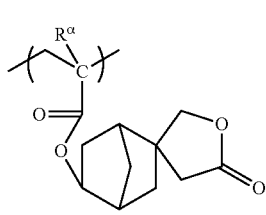
(a2-4-5)
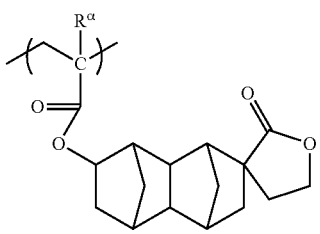
(a2-4-6)
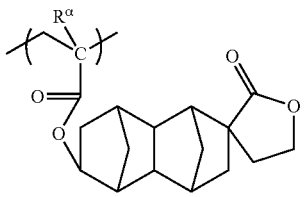
(a2-4-7)
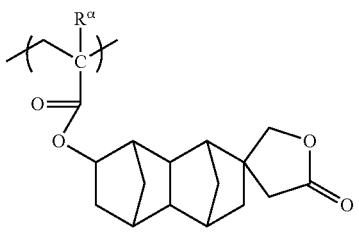
(a2-4-8)
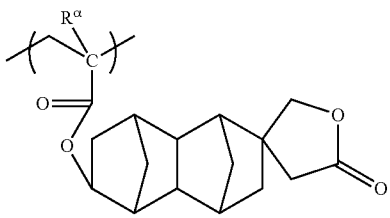
(a2-4-9)
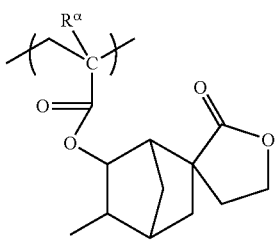
(a2-4-10)
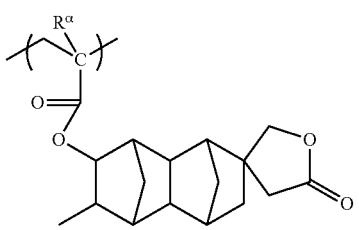

(a2-4-11)
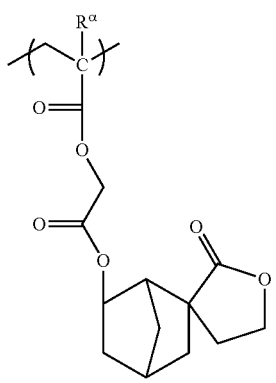
(a2-4-12)
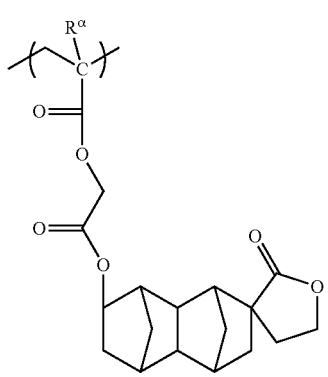
[Chemical Formula 35]
(a2-5-1)
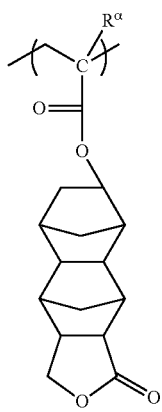
(a2-5-2)
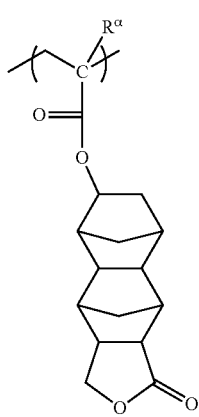
(a2-5-3)
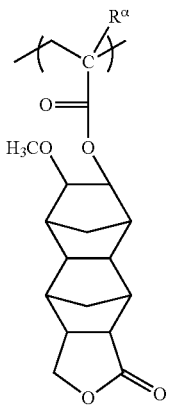
(a2-5-4)
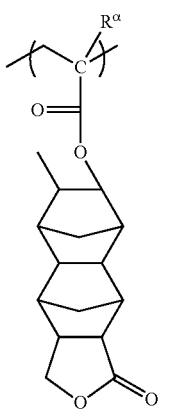
(a2-5-5)

(a2-5-6)

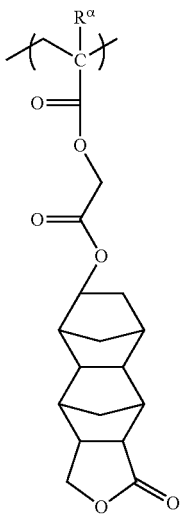

The structural unit (a2$^L$) is preferably at least one structural unit selected from the group consisting of structural units represented by the above general formulas (a2-1) to (a2-5), is more preferably at least one structural unit selected from the group consisting of structural units represented by general formulas (a2-1) to (a2-3), and is still more preferably at least one structural unit selected from the group consisting of structural units represented by general formulas (a2-1) and (a2-3).

Among these structural units, the structural unit (a2$^L$) is most preferably at least one structural unit selected from the group consisting of structural units represented by the above formulas (a2-1-1), (a2-1-2), (a2-2-1), (a2-2-7), (a2-2-12), (a2-2-14), (a2-3-1) and (a2-3-5).

Further, structural units represented by formulas (a2-6) and (a2-7) shown below are also preferable as the structural unit (a2$^L$).

[Chemical Formula 36]

(a2-6)

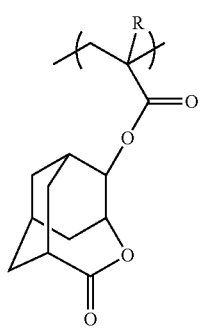

(a2-7)

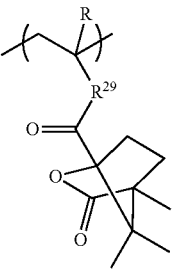

In the formulas, R and R$^{29}$ are the same as defined above.

The structural unit (a2) within the component (A1) may be a single type of structural unit, or a combination of two or more types. For example, as the structural unit (a2), the structural unit (a2$^S$) may be used alone, the structural unit (a2$^L$) may be used alone, or a combination of these structural units may be used. Further, as the structural unit (a2$^S$) or the structural unit (a2$^L$), either a single type of structural unit may be used alone, or two or more types may be used in combination.

The amount of the structural unit (a2) within the component (A 1), based on the combined total of all the structural units that constitute the component (A1), is preferably within a range from 1 to 80 mol %, more preferably from 10 to 70 mol %, still more preferably from 10 to 65 mol %, and most preferably from 10 to 60 mol %. When the amount of the structural unit (a2) is at least as large as the lower limit of the above range, the effects achieved by including the structural unit (a2) can be satisfactorily achieved. On the other hand, when the amount of the structural unit (a2) is not more than the upper limit of the above range, a good balance can be achieved with the other structural units, and various lithography properties such as DOF and CDU, and the pattern shape can be improved.

[Structural Unit (a3)]

The component (A1) may also include, in addition to the structural unit (a1), or in addition to the structural units (a1) and (a2), a structural unit (a3) containing a polar group. By including the structural unit (a3) in the component (A1), the polarity of the component (A1) following exposure can be further increased. Increasing the polarity of the component (A1) contributes to improvements in the resolution and the like, particularly in those cases where an alkali developing process is used.

Examples of the polar group include —OH, —COOH, —CN, —SO$_2$NH$_2$ and —CONH$_2$. Structural units containing —COOH include (α-substituted) acrylic acid structural units.

The structural unit (a3) is preferably a structural unit containing a hydrocarbon group in which part of the hydrogen atoms have been substituted with the polar group. The hydrocarbon group may be either an aliphatic hydrocarbon group or an aromatic hydrocarbon group. The hydrocarbon group is preferably an aliphatic hydrocarbon group.

Examples of the aliphatic hydrocarbon group for this hydrocarbon group include linear or branched hydrocarbon groups (and preferably alkylene groups) of 1 to 10 carbon atoms, and aliphatic cyclic groups (monocyclic groups or polycyclic groups).

As the aliphatic cyclic group (monocyclic group or polycyclic group), any of the multitude of groups proposed for resins used, for example, in resist compositions designed for use with an ArF excimer laser can be selected as appropriate. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which two or more hydrogen atoms have been removed from a monocycloalkane, and groups in which two or more hydrogen atoms have been removed from a polycycloalkane such as a bicycloalkane, tricycloalkane or tetracycloalkane. Specific examples of such groups include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane. The aliphatic cyclic group may or may not have a substituent. Examples of the substituent include an alkyl group of 1 to 5 carbon atoms, a fluorine atom, and a fluorinated alkyl group of 1 to 5 carbon atoms.

The aromatic hydrocarbon group for the above hydrocarbon group is a hydrocarbon group containing at least one aromatic ring.

There are no particular limitations on the aromatic ring, provided it is a cyclic conjugated system having 4n+2π electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and most preferably 6 to 12 carbon atoms. This number of carbon atoms does not include any carbon atoms within any substituents. Specific examples of the aromatic ring include aromatic hydrocarbon rings such as benzene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom. Specific examples of the aromatic heterocyclic rings include a pyridine ring and a thiophene ring.

Specific examples of the aromatic hydrocarbon group for the above divalent hydrocarbon group include groups in which two hydrogen atoms have been removed from an aromatic hydrocarbon ring or an aromatic heterocyclic ring (namely, arylene groups or heteroarylene groups), groups in which two hydrogen atoms have been removed from an aromatic compound having two or more aromatic rings (such as biphenyl or fluorene), and groups in which one further hydrogen atom has been removed from the aromatic ring of a group in which one of the hydrogen atoms of an aforementioned aromatic ring has been substituted with an alkylene group (for example, an arylalkyl group such as a benzyl group, phenethyl group, 1-naphthylmethyl group, 2-naphthylmethyl group, 1-naphthylethyl group or 2-naphthylethyl group, or a heteroarylalkyl group). The alkylene group that substitutes the hydrogen atom of the aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group may have a substituent. For example, a hydrogen atom bonded to the aromatic ring within the aromatic hydrocarbon group may be substituted with a substituent. Examples of this substituent include an alkyl group, alkoxy group, halogen atom, halogenated alkyl group, hydroxyl group and oxygen atom (=O).

The alkyl group as the substituent is preferably an alkyl group of 1 to 5 carbon atoms, and a methyl group, ethyl group, propyl group, n-butyl group or tert-butyl group is the most desirable.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent include groups in which part or all of the hydrogen atoms in an aforementioned alkyl group have each been substituted with an aforementioned halogen atom.

The structural unit (a3) is preferably a structural unit represented by general formula (a3-1) shown below.

[Chemical Formula 37]

(a3-1)

In the formula, R represents a hydrogen atom, an alkyl group of 1 to 5 carbon atoms or a halogenated alkyl group of 1 to 5 carbon atoms, and $L^0$ represents —C(=O)—O—, —C(=O)—NR″— (wherein R″ represents a hydrogen atom or an alkyl group of 1 to 5 carbon atoms) or a single bond. $R^0$ represents —COOH, or a hydrocarbon group having at least one group selected from the group consisting of —OH, —COOH, —CN, —SO$_2$NH$_2$ and —CONH$_2$ as a substituent, wherein the hydrocarbon group may have an oxygen atom or a sulfur atom in an arbitrary position.

In formula (a3-1), the alkyl group for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Examples of the halogenated alkyl group for R include groups in which part or all of the hydrogen atoms of an aforementioned alkyl group for R have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and is most preferably a hydrogen atom or a methyl group.

In formula (a3-1), $L^0$ represents —C(=O)—O—, —C(=O)—NR″— (wherein R″ represents a hydrogen atom or an alkyl group of 1 to 5 carbon atoms) or a single bond. The alkyl group for R″ is the same as defined above for the alkyl group for R.

In formula (a3-1), $R^0$ represents a hydrocarbon group having at least one group selected from the group consisting of —OH, —COOH, —CN, —SO$_2$NH$_2$ and —CONH$_2$ as a substituent, wherein the hydrocarbon group may have an oxygen atom or a sulfur atom in an arbitrary position.

The expression "hydrocarbon having a substituent" describes a group in which at least part of the hydrogen atoms bonded to the hydrocarbon group have been substituted with a substituent.

The hydrocarbon group for $R^0$ may be an aliphatic hydrocarbon group or an aromatic hydrocarbon group.

Preferred examples of the aliphatic hydrocarbon group for $R^0$ include a linear or branched hydrocarbon group (and preferably an alkylene group) of 1 to 10 carbon atoms, and an aliphatic cyclic group (monocyclic group or polycyclic group), and these groups are as described above.

The aromatic hydrocarbon group for $R^0$ is a hydrocarbon group having an aromatic ring, and is the same as described above.

$R^0$ may have an oxygen atom or a sulfur atom in an arbitrary position. This expression that the hydrocarbon group "may have an oxygen atom or a sulfur atom in an arbitrary position" means that either a portion of the carbon atoms that constitute the hydrocarbon group or the hydrocarbon group having a substituent (including the carbon atoms in the substituent portion) may be substituted with an oxygen atom or a sulfur atom, or that one or more hydrogen atoms bonded to the hydrocarbon group may be substituted with an oxygen atom or a sulfur atom.

Examples of $R^0$ groups having an oxygen atom (O) in an arbitrary position are shown below.

[Chemical Formula 38]

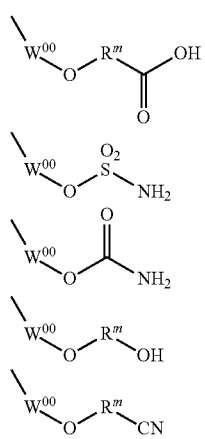

In the formulas, $W^{00}$ represents a hydrocarbon group, and $R^m$ represents an alkylene group of 1 to 5 carbon atoms.

In the above formulas, $W^{00}$ represents a hydrocarbon group, and examples include the same groups as those mentioned above for $R^0$ in formula (a3-1). $W^{00}$ is preferably an aliphatic hydrocarbon group, and more preferably an aliphatic cyclic group (monocyclic group or polycyclic group).

$R^m$ is preferably a linear or branched group, is more preferably an alkylene group of 1 to 3 carbon atoms, and is most preferably a methylene group or an ethylene group.

Among the various structural units (a3), specific examples of preferred structural units include structural units derived from an (α-substituted) acrylic acid, and structural units represented by any of general formulas (a3-11) to (a3-13) shown below.

An example of a structural unit derived from an (α-substituted) acrylic acid is a structural unit of the above formula (a3-1) in which $L^0$ represents a single bond and $R^0$ represents —COOH.

[Chemical Formula 39]

(a3-11)

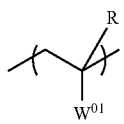

(a3-12)

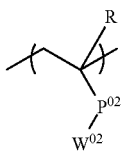

(a3-13)

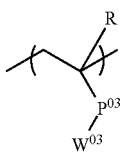

In the formulas, R represents a hydrogen atom, an alkyl group of 1 to 5 carbon atoms or a halogenated alkyl group of 1 to 5 carbon atoms, $W^{01}$ represents an aromatic hydrocarbon group having at least one group selected from the group consisting of —OH, —COOH, —CN, —SO$_2$NH$_2$ and —CONH$_2$ as a substituent, each of $P^{02}$ and $P^{03}$ represents —C(=O)—O— or —C(=O)—NR″— (wherein R″ represents a hydrogen atom or an alkyl group of 1 to 5 carbon atoms), $W^{02}$ represents a cyclic hydrocarbon group having at least one group selected from the group consisting of —OH, —COOH, —CN, —SO$_2$NH$_2$ and —CONH$_2$ as a substituent, and may have an oxygen atom or a sulfur atom in an arbitrary position, and $W^{03}$ represents a linear hydrocarbon group having at least one group selected from the group consisting of —OH, —COOH, —CN, —SO$_2$NH$_2$ and —CONH$_2$ as a substituent.

[Structural Unit Represented by General Formula (a3-11)]

In the above formula (a3-11), R is the same as defined above for R in formula (a3-1).

The aromatic hydrocarbon group for $W^{01}$ is the same as the aromatic hydrocarbon group described above for $R^0$ in formula (a3-1).

The aromatic hydrocarbon group for $W^{01}$ may also have a substituent other than the substituent selected from the group consisting of —OH, —COOH, —CN, —SO$_2$NH$_2$ and —CONH$_2$. Examples of this other substituent include a halogen atom, an alkyl group of 1 to 5 carbon atoms and a halogenated alkyl group of 1 to 5 carbon atoms. Among these, a halogen atom is preferable, and a fluorine atom is particularly desirable.

Specific examples of preferred structural units represented by general formula (a3-11) are shown below. In the following formula, $R^α$ represents a hydrogen atom, a methyl group, or a trifluoromethyl group.

[Chemical Formula 40]

(a3-11-1)

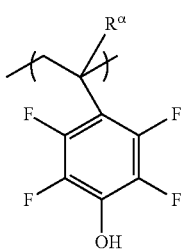

(a3-11-2)
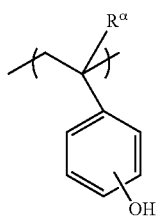

(a3-11-3)
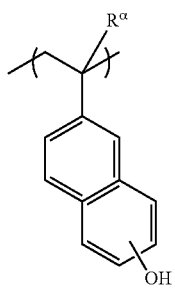

(a3-11-4)
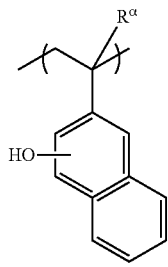

(a3-11-5)
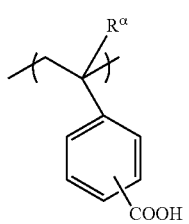

[Structural Unit Represented by General Formula (a3-12)]

In the above formula (a3-12), R is the same as defined above for R in formula (a3-1).

$P^{02}$ represents —C(=O)—O— or —C(=O)—NR″— (wherein R″ represents a hydrogen atom or an alkyl group of 1 to 5 carbon atoms), and is preferably —C(=O)—O—. The alkyl group for R″ is the same as defined above for the alkyl group for R.

Examples of the cyclic hydrocarbon group for $W^{02}$ include the same groups as those mentioned above for the aliphatic cyclic group (monocyclic group or polycyclic group) and the aromatic hydrocarbon group within the description for $R^0$ in the aforementioned formula (a3-1).

$W^{02}$ may have an oxygen atom or a sulfur atom in an arbitrary position, and this is the same as described above for $R^0$ in formula (a3-1).

Specific examples of preferred structural units represented by general formula (a3-12) are shown below. In each of the following formulas, $R^\alpha$ represents a hydrogen atom, a methyl group, or a trifluoromethyl group.

[Chemical Formula 41]

(a3-12-1)
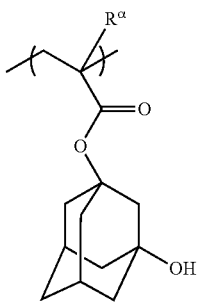

(a3-12-2)
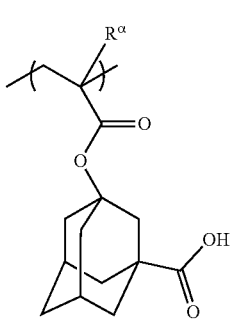

(a3-12-3)
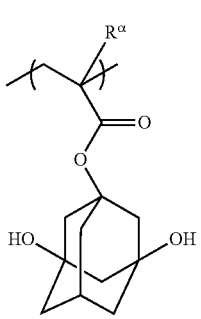

(a3-12-4)
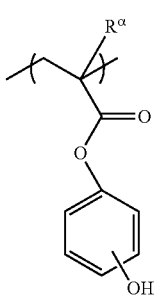

(a3-12-5)
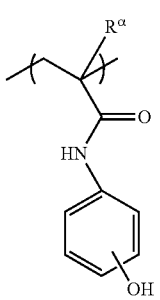

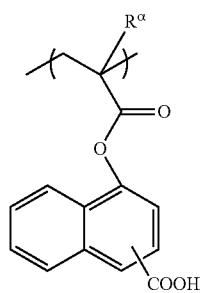
(a3-12-6)
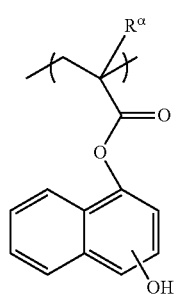
(a3-12-7)
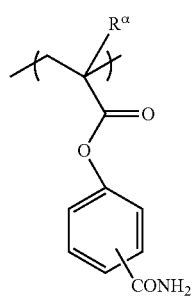
(a3-12-8)
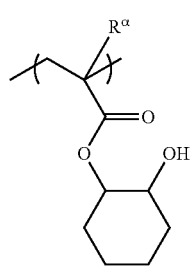
(a3-12-9)
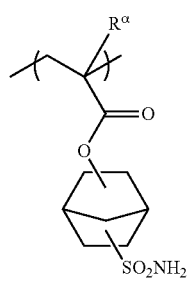
(a3-12-10)
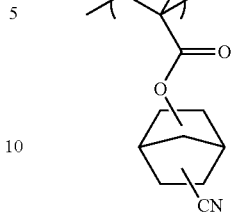
(a3-12-11)
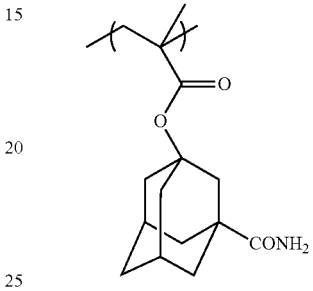
(a3-12-12)
[Chemical Formula 42]
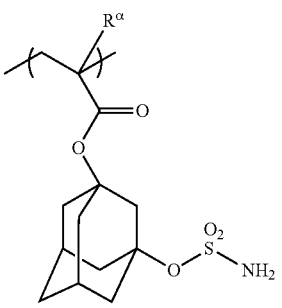
(a3-12-13)
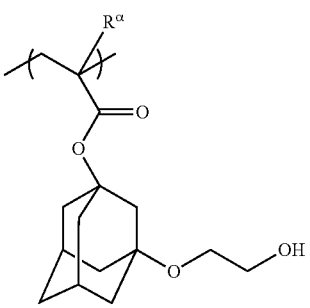
(a3-12-14)
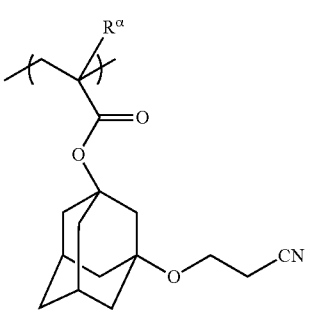
(a3-12-15)

-continued

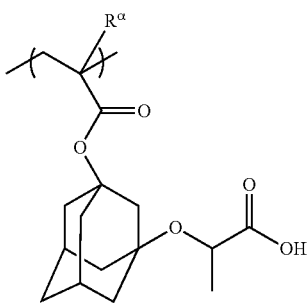
(a3-12-16)

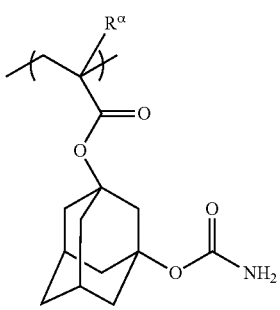
(a3-12-17)

[Structural Unit Represented by General Formula (a3-13)]

In the above formula (a3-13), R is the same as defined above for R in formula (a3-1).

$P^{03}$ represents —C(=O)—O— or —C(=O)—NR″— (wherein R″ represents a hydrogen atom or an alkyl group of 1 to 5 carbon atoms), and is preferably —C(=O)—O—. The alkyl group for R″ is the same as defined above for the alkyl group for R.

The linear hydrocarbon group for $W^{03}$ preferably contains 1 to 10 carbon atoms, more preferably 1 to 5 carbon atoms, and still more preferably 1 to 3 carbon atoms.

The linear hydrocarbon group for $W^{03}$ may also have a substituent (a) other than the —OH, —COOH, —CN, —SO$_2$NH$_2$ and/or —CONH$_2$ substituent. Examples of this substituent (a) include an alkyl group of 1 to 5 carbon atoms, an aliphatic cyclic group (monocyclic group or polycyclic group), a fluorine atom, and a fluorinated alkyl group of 1 to 5 carbon atoms. The aliphatic cyclic group (monocyclic group or polycyclic group) for the substituent (a) preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of such groups include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Further, the linear hydrocarbon group for $W^{03}$ may have a plurality of the substituents (a), as shown below for a structural unit represented by general formula (a3-13-a), and this plurality of the substituents (a) may be bonded to each other to form a ring.

[Chemical Formula 43]

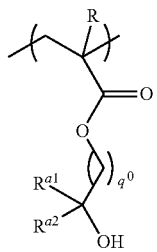
(a3-13-a)

In the formula, R represents a hydrogen atom, an alkyl group of 1 to 5 carbon atoms or a halogenated alkyl group of 1 to 5 carbon atoms, and each of $R^{a1}$ and $R^{a2}$ independently represents an alkyl group of 1 to 5 carbon atoms, an aliphatic cyclic group (monocyclic group or polycyclic group), a fluorine atom or a fluorinated alkyl group of 1 to 5 carbon atoms. Further, $R^{a1}$ and $R^{a2}$ may be bonded to each other to form a ring. $q^0$ represents an integer of 1 to 4.

In formula (a3-13-a), R is the same as defined above for R in formula (a3-1).

The aliphatic cyclic group (monocyclic group or polycyclic group) for $R^{a1}$ and $R^{a2}$ is the same as the aliphatic cyclic group (monocyclic group or polycyclic group) described above for the substituent (a).

Further, $R^{a1}$ and $R^{a2}$ may be bonded to each other to form a ring. In this case, a cyclic group is formed from $R^{a1}$, $R^{a2}$, and the carbon atom to which both $R^{a1}$ and $R^{a2}$ are bonded. The thus formed cyclic group may be a monocyclic group or a polycyclic group, and specific examples include groups in which one or more hydrogen atoms have been removed from the types of monocycloalkanes and polycycloalkanes mentioned above within the description of the aliphatic cyclic group (monocyclic group or polycyclic group) for the aforementioned substituent (a).

$q^0$ is preferably 1 or 2, and is more preferably 1.

Specific examples of preferred structural units represented by general formula (a3-13) are shown below. In each of the following formulas, $R^\alpha$ represents a hydrogen atom, a methyl group, or a trifluoromethyl group.

[Chemical Formula 44]

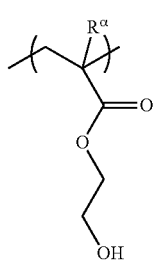
(a3-13-1)

(a3-13-2)

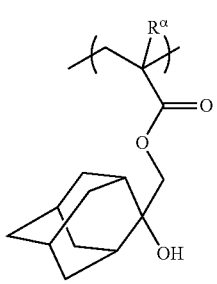

(a3-13-3)

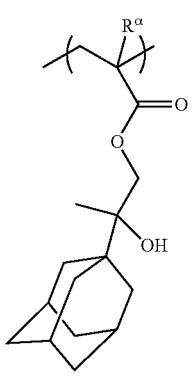

The structural unit (a3) in the component (A1) may be a single type of structural unit, or a combination of two or more types.

The amount of the structural unit (a3) within the component (A1), based on the combined total of all the structural units that constitute the component (A1), is preferably within a range from 0 to 85 mol %, and more preferably from 0 to 80 mol %. When the amount of the structural unit (a3) is at least as large as the lower limit of the above range, the effects achieved be including the structural unit (a3) (improved resolution, lithography properties and pattern shape) can be satisfactorily achieved. On the other hand, when the amount of the structural unit (a3) is not more than the upper limit of the above range, a good balance can be achieved with the other structural units.

[Structural Unit (a4)]

The component (A1) may also include, where required, a structural unit (a4) containing a non-acid-dissociable cyclic group. By including the structural unit (a4) in the component (A1), the dry etching resistance of the formed resist pattern can be improved. Further, the hydrophobicity of the component (A1) is enhanced.

This improvement in hydrophobicity contributes to improvements in the resolution and the resist pattern shape and the like, particularly in those cases where organic solvent developing is used.

The "non-acid-dissociable cyclic group" in the structural unit (a4) is a cyclic group that does not dissociate, but is rather retained within the structural unit, even when acid is generated from the component (B) upon exposure and this acid acts upon the structural unit.

Examples of the structural unit (a4) include structural units in which the acid-dissociable group in the aforementioned structural unit (a1) has been substituted with a non-acid-dissociable group. Among such structural units, a structural unit (a41) derived from an acrylate ester in which the hydrogen atom bonded to the carbon atom on the α-position may be substituted with a substituent and containing a non-acid-dissociable aliphatic cyclic group, a structural unit (a42) derived from a styrene in which the hydrogen atom bonded to the carbon atom on the α-position may be substituted with a substituent, and a structural unit (a43) derived from a vinyl-naphthalene in which the hydrogen atom bonded to the carbon atom on the α-position may be substituted with a substituent are preferable.

Examples of the non-acid-dissociable aliphatic cyclic group in the structural unit (a41) include monovalent aliphatic cyclic groups in which a substituent (an atom other than a hydrogen atom or a group) is not bonded to the carbon atom bonded to the atom adjacent to the aliphatic cyclic group (such as the —O— in —C(=O)—O—), and groups in which one hydrogen atom of a primary or secondary alkyl group has been substituted with an aliphatic cyclic group.

There are no particular limitations on the monovalent aliphatic cyclic group, provided the group is non-acid-dissociable, and any of the multitude of conventional aliphatic cyclic groups used within the resin component of resist compositions designed for ArF excimer lasers or KrF excimer lasers (and preferably ArF excimer lasers) can be used. The aliphatic cyclic group may be saturated or unsaturated, but is preferably saturated.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring structure of the aliphatic cyclic group exclusive of substituents is not limited to structures constituted of only carbon and hydrogen (not limited to hydrocarbon groups), but is preferably a hydrocarbon group. Further, the hydrocarbon group may be either saturated or unsaturated, but in most cases, is preferably saturated.

The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

The aliphatic cyclic group may be either monocyclic or polycyclic. As the monocyclic aliphatic cyclic group, a group in which one or more hydrogen atoms have been removed from a monocycloalkane is preferred. The monocycloalkane preferably contains 3 to 6 carbon atoms, and specific examples include cyclobutane, cyclopentane and cyclohexane. As the polycyclic aliphatic cyclic group, a group in which one or more hydrogen atoms have been removed from a polycycloalkane is preferable, and the polycycloalkane preferably has 7 to 12 carbon atoms. Specific examples of the polycycloalkane include adamantane, norbornane, isobornane, tricyclodecane and tetracyclododecane. Further, part of the carbon atoms that constitute the ring structure of these aliphatic cyclic groups may be replaced with an ether group (—O—).

In terms of enhancing the effects described above, the aliphatic cyclic group is preferably a polycyclic group. Two-ring to four-ring structures are preferable, and at least one group selected from among a tricyclodecyl group, adamantyl group, tetracyclododecyl group, isobornyl group and norbornyl group is preferred in terms of ease of industrial availability.

Specific examples of the monovalent aliphatic cyclic group for the non-acid-dissociable aliphatic cyclic group include monovalent aliphatic cyclic groups in which a substituent (an atom other than a hydrogen atom or a group) is not bonded to the carbon atom bonded to the atom adjacent to the aliphatic cyclic group (such as the —O— in —C(=O)—O—). Specific examples include groups in which $R^{14}$ within a group represented by any of formulas (1-1) to (1-9), which were mentioned above within the description of the aforementioned acid-dissociable group, has been substituted with a hydrogen atom, and groups in which a hydrogen atom has been removed from the tertiary carbon atom of a cycloalkane in which the tertiary carbon atom is formed only by carbon atoms that constitute the ring structure.

Examples of groups in which one hydrogen atom of a primary or secondary alkyl group has been substituted with a monovalent aliphatic cyclic group include groups in which at least one of $R^{15}$ and $R^{16}$ within any of formulas (2-1) to (2-6), which were mentioned above within the description of the aforementioned acid-dissociable group, has been substituted with a hydrogen atom.

Examples of the structural unit (a41) include structural units in which the acid-dissociable group in the structural unit (a11) has been substituted with a non-acid-dissociable aliphatic cyclic group. Of these, structural units in which $X^1$ in the aforementioned general formula (a1-0-1) has been substituted with a non-acid-dissociable aliphatic polycyclic group, namely structural units represented by general formula (a4-0) shown below, are preferable, and structural units represented by general formulas (a4-1) to (a4-5) shown below are particularly desirable.

[Chemical Formula 45]

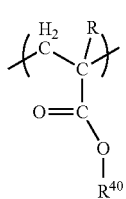

(a4-0)

In the formula, R is the same as defined above, and $R^{40}$ represents a non-acid-dissociable aliphatic polycyclic group.

[Chemical Formula 46]

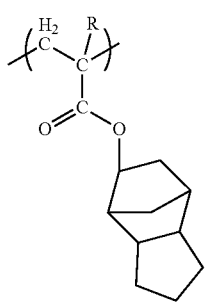

(a4-1)

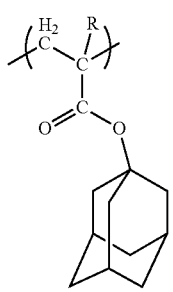

(a4-2)

-continued

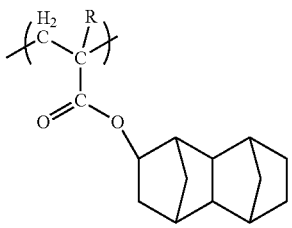

(a4-3)

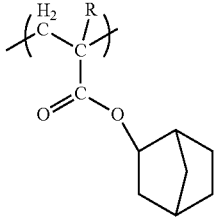

(a4-4)

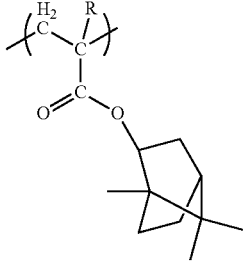

(a4-5)

In the above formulas, R is the same as defined above.

Specific examples of the structural unit (a42) include structural units in which the value of px, representing the number of $OX^c$ groups bonded to the benzene ring in the general formula (a12-1) mentioned above within the description relating to the structural unit (a12), is zero, and the value of qx representing the number of arbitrary substituents $R^c$ is an integer of 0 to 5.

Specific examples of the structural unit (a43) include structural units in which the value of x, representing the number of $OX^d$ groups bonded to the naphthalene ring in the general formula (a13-1) mentioned above within the description relating to the structural unit (a13), is zero, and the value of y+z representing the number of arbitrary substituents $R^d$ is an integer of 0 to 7.

The structural unit (a4) in the component (A1) may be a single type of structural unit, or a combination of two or more types.

In those cases where the component (A1) includes the structural unit (a4), the amount of the structural unit (a4) within the component (A1), based on the combined total of all the structural units that constitute the component (A1), is preferably within a range from 1 to 30 mol %, more preferably from 1 to 20 mol %, and still more preferably from 5 to 20 mol %. When the amount of the structural unit (a4) is at least as large as the lower limit of the above range, the effects achieved be including the structural unit (a4) can be satisfactorily achieved. On the other hand, when the amount of the structural unit (a4) is not more than the upper limit of the above range, a good balance can be achieved with the other structural units.

The component (A1) may also include one or more other structural units besides the structural units (a1) to (a4) described above, provided these other structural units do not impair the effects of the present invention.

There are no particular limitations on these other structural units, provided they cannot be classified as one of the above structural units (a1) to (a4), and any of the multitude of conventional structural units used within resist resins designed for use with ArF excimer lasers, KrF excimer lasers, EB or EUV or the like can be used.

The component (A1) is preferably a polymer that includes the structural unit (a1), and is more preferably a copolymer containing the structural unit (a1), and at least one structural unit selected from among the structural units (a2) and (a3). Among such copolymers, a copolymer that includes the structural units (a1) and (a2) is preferable, and a copolymer containing the structural unit (a1), the structural unit (a2) and the structural unit (a3) is particularly desirable.

Examples of these polymers and copolymers include copolymers consisting of the structural units (a1) and (a2), copolymers consisting of the structural units (a1) and (a3), copolymers consisting of the structural units (a1), (a2) and (a3), and copolymers consisting of the structural units (a1), (a2), (a3) and (a4).

The structural units (a1), (a2), (a3) and (a4) within these polymers and copolymers may each include a single type of structural unit or a combination of two or more types.

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight-average molecular weight is not more than the upper limit of the above range, the component (A1) exhibits satisfactory solubility in a resist solvent when used as a resist. On the other hand, when the weight-average molecular weight is at least as large as the lower limit of the above range, the dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn represents the number-average molecular weight.

A single component (A1) may be used alone, or a combination of two or more types of the component (A1) may be used.

The component (A1) can be obtained, for example, by a conventional radical polymerization or the like of the monomers corresponding with each of the structural units, using a radical polymerization initiator such as azobisisobutyronitrile (AIBN).

Furthermore, by using a chain transfer agent such as HS—$CH_2$—$CH_2$—$CH_2$—$C(CF_3)_2$—OH during the above polymerization, a —$C(CF_3)_2$—OH group can be introduced at the terminals of the component (A1). Such a copolymer having an introduced hydroxyalkyl group in which some of the hydrogen atoms of the alkyl group have been substituted with fluorine atoms is effective in reducing developing defects and line edge roughness (LER: unevenness in the side walls of a line pattern).

In terms of the monomers used for forming each of the structural units, either commercially available monomers may be used, or the monomers may be synthesized using conventional methods.

{Component (A2)}

The component (A2) is preferably a low molecular weight compound having a molecular weight of at least 500 but less than 4,000, containing a hydrophilic group and an acid-dissociable group such as those mentioned above in the description of the component (A1). Specific examples of the component (A2) include compounds containing a plurality of phenol structures in which a portion of the hydrogen atoms of the hydroxyl groups have each been substituted with an aforementioned acid-dissociable, group.

Examples of the component (A2) include low molecular weight phenolic compounds in which a portion of the hydroxyl group hydrogen atoms have each been substituted with an aforementioned acid-dissociable group. These types of compounds are known, for example, as sensitizers or heat resistance improvers for use in non-chemically amplified g-line or i-line resists, and any of these compounds may be used.

Examples of these low molecular weight phenolic compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3', 4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples.

In particular, a phenolic compound having 2 to 6 triphenylmethane structures is preferable as the low molecular weight phenolic compound, as such compounds yield superior levels of resolution and line width roughness (LWR).

There are no particular limitations on the acid-dissociable group, and examples include the same groups as those described above within the description relating to the component (A1).

A single component (A2) may be used alone, or a combination of two or more types of the component (A2) may be used.

In the resist composition of the present invention, a single component (A) may be used alone, or a combination of two or more types of the component (A) may be used.

Among the various possibilities described above, the component (A) preferably includes the component (A1).

The amount of the component (A1) within the component (A), based on the total weight of the component (A), is preferably at least 25% by weight, more preferably 50% by weight or more, still more preferably 75% by weight or more, and may even be 100% by weight. When this amount is at least 25% by weight, lithography properties such as the mask error factor (MEF) and the circularity are improved, and roughness can be further reduced.

There amount of the component (A) within the resist composition of the present aspect may be adjusted in accordance with factors such as the thickness of the resist film that is to be formed.

<Component (G)>

The resist composition of the present invention also includes an acid (G) (hereafter referred to as "component (G)") having a pKa of 4 or less.

The "pKa" value is the acid dissociation constant, and is a value that is widely used to indicate the acid strength of a target material.

The pKa value of the component (G) can be determined by measurement using normal methods. Further, the pKa value can also be estimated by calculation using conventional software such as ACD/Labs (a product name, manufactured by Advanced Chemistry Development, Inc.).

In the present invention, including the component (G) improves the storage stability of the resist composition.

Examples of "acids" that can contribute to an improvement in the storage stability of the resist composition include carboxylic acids, alkylsulfonic acids, arylsulfonic acids, sulfonylamide acids, sulfonylimide acids, phosphorus oxo acids, and derivatives thereof, but in the present invention, by using an acid having a pKa value of 4 or less, a superior storage stability improvement effect can be achieved. It is thought that the reason for this improvement is as follows. Namely, when the component (C) is used, and particularly in those cases where a salt having an anion with a pKa exceeding 4 is used as the component (C), the component (C) tends to subject the other components within the resist composition to nucleophilic attack, causing a deterioration in the storage stability. By including the component (G) having a pKa of 4 or less, anion exchange facilitates the conversion of the component (C) to an acid and the component (G) to a salt. It is thought that the salt generated in this manner is less likely to initiate nucleophilic attack on the other components in the resist composition than the component (C) prior to the anion exchange, resulting in an improvement in the storage stability of the resist composition.

Although there are no particular limitations on the lower limit for the pKa value of the component (G), from the viewpoint of suppressing nucleophilic attack on the other components by the component (G) itself, the pKa value is preferably 0 or greater.

There are no particular limitations on the component (G), provided it is an acid having a pKa of 4 or less, but in terms of achieving a superior effect for the present invention, the component (G) is preferably an aliphatic carboxylic acid having an aliphatic hydrocarbon group in which the β-position carbon atom is substituted with an oxygen atom (—O—) or a sulfur atom (—S—), an aliphatic carboxylic acid having an aliphatic hydrocarbon group in which an electron withdrawing group is bonded to the carbon atom on the α-position or the β-position, or an aromatic carboxylic acid having an aryl group in which an organic group containing an oxygen atom (—O—) is bonded to the carbon atom on the ortho-position via the oxygen atom of the organic group.

Examples of the electron withdrawing group include a fluorine atom, oxygen atom (oxo group), nitrogen atom (cyano group), and sulfur atom (sulfonyl group). Of these, a fluorine atom is preferable.

Examples of the organic group containing an oxygen atom include any organic group having an oxygen atom (—O—) at the terminal that bonds to the aryl group, and examples include the groups represented by —O—C(=O)—R$^{7'}$ and —O—R$^{8'}$ described below in relation to the component (C).

The α-position refers to the carbon atom, among all the carbon atoms that constitute the aliphatic hydrocarbon group, that is bonded to the carboxyl group, and the β-position and the γ-position refer to the subsequent positions at increasing distance from the carboxyl group. The ortho-position of an aryl group refers to the carbon atom, among the carbon atoms that constitute the aryl group, that is adjacent to the carbon atom bonded to the carboxyl group.

Specific examples of the above types of carboxylic acids include a compound (G1) represented by general formula (g1) shown below, a compound (G2) represented by general formula (g2) shown below, and a compound (G3) represented by general formula (g3) shown below. Of these compounds, at least one compound selected from the group consisting of the compound (G1) and the compound (G3) is preferable.

[Chemical Formula 47]

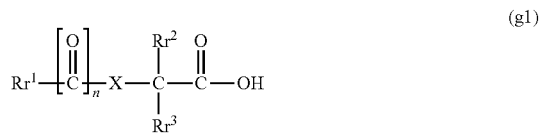

(g1)

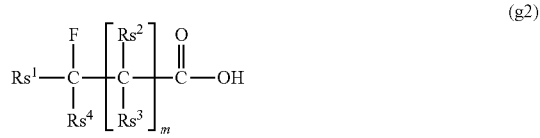

(g2)

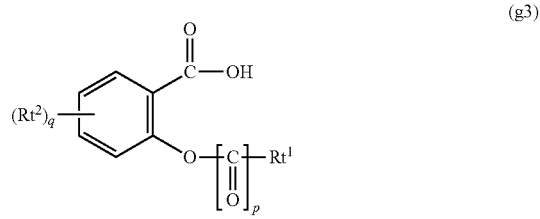

(g3)

In the formulas, $Rr^1$ represents a hydrogen atom or a hydrocarbon group of 1 to 20 carbon atoms which may have a substituent, each of $Rr^2$ and $Rr^3$ independently represents a hydrogen atom or a hydrocarbon group of 1 to 20 carbon atoms which may have a substituent, and two or three of $Rr^1$ to $Rr^3$ may be bonded to each other to form a ring. X represents an oxygen atom or a sulfur atom, and n represents 0 or 1. $Rs^1$ represents a hydrogen atom, a fluorine atom, or a hydrocarbon group of 1 to 20 carbon atoms which may have a substituent, each of $Rs^2$ and $Rs^3$ independently represents a hydrogen atom or a hydrocarbon group of 1 to 20 carbon atoms which may have a substituent, and two or three of $Rs^1$ to $Rs^3$ may be bonded to each other to form a ring. $Rs^4$ represents a fluorine atom or a fluorinated alkyl group, and m represents 0 or 1. $Rt^1$ represents a chain-like alkyl group of 1 to 15 carbon atoms or a cyclic alkyl group of 3 to 20 carbon atoms, and $Rt^2$ represents a halogen atom, hydroxyl group, alkoxy group, or alkyl group of 1 to 5 carbon atoms. p represents 0 or 1, and q represents an integer of 0 to 4.

[Compound (G1)]

In formula (g1), $Rr^1$ represents a hydrocarbon group which may have a substituent.

The expression that the hydrocarbon group for $Rr^1$ "may have a substituent" means that part of the carbon atoms that constitute the hydrocarbon group my be substituted with a hetero atom-containing substituent, or part or all of the hydrogen atoms that constitute the hydrocarbon group may be substituted with a substituent.

The hydrocarbon group for $Rr^1$ may be an aromatic hydrocarbon group or an aliphatic hydrocarbon group.

The aromatic hydrocarbon group is a hydrocarbon group having at least one aromatic ring.

There are no particular limitations on the aromatic ring, provided it is a cyclic conjugated system having $4n+2\pi$ electrons, and the aromatic ring may be either monocyclic or polycyclic. The number of carbon atoms that constitute the cyclic structure of the aromatic ring is preferably from 5 to 20 carbon atoms, more preferably from 5 to 15 carbon atoms, still more preferably from 6 to 15 carbon atoms, and most preferably from 6 to 12 carbon atoms. Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings has been substituted with a hetero atom. Examples of the hetero atom in the aromatic heterocyclic ring include an oxygen atom, a sulfur atom and a nitrogen atom. Specific examples of the aromatic heterocyclic ring include a pyridine ring and a thiophene ring.

Specific examples of the aromatic hydrocarbon group include groups in which one hydrogen atom has been removed from an aforementioned aromatic hydrocarbon ring or aromatic heterocyclic ring (namely, aryl groups or heteroaryl groups), groups in which one hydrogen atom has been removed from an aromatic compound having two or more aromatic rings (such as biphenyl or fluorene), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group, and heteroarylalkyl groups). The alkylene group that substitutes a hydrogen atom of an aforementioned aromatic hydrocarbon ring or aromatic heterocyclic ring preferably contains 1 to 4 carbon atoms, more preferably 1 or 2 carbon atoms, and most preferably 1 carbon atom.

The aromatic hydrocarbon group for $Rr^1$ preferably contains 5 to 20 carbon atoms, more preferably 5 to 15 carbon atoms, still more preferably 6 to 15 carbon atoms, and most preferably 6 to 12 carbon atoms. However, in those cases where part or all of the hydrogen atoms have been substituted with substituents, this number of carbon atoms for the aromatic hydrocarbon group does not include carbon atoms contained within the substituents.

In the aromatic hydrocarbon group, part or all of the hydrogen atoms that constitute the aromatic hydrocarbon group may each be substituted with a substituent. For example, one or more of the hydrogen atoms bonded to the aromatic ring within the aromatic hydrocarbon group may each be substituted with a substituent.

Examples of the substituent include an alkyl group, alkoxy group, halogen atom, halogenated alkyl group, hydroxyl group, oxo group (=O), cyano group, aryl group, alkoxyalkyloxy group, alkoxycarbonylalkyloxy group, carboxyl group, —COO$^-$Z$^+$ (wherein Z$^+$ is an organic cation), —C(=O)—O—R$^{6t}$, —O—C(=O)—R$^{7t}$, and —O—R$^{8t}$. Each of R$^{6t}$, R$^{7t}$ and R$^{8t}$ independently represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The alkyl group as the substituent for the aromatic hydrocarbon group is preferably an alkyl group of 1 to 5 carbon atoms, and is most preferably a methyl group, ethyl group, propyl group, n-butyl group or tert-butyl group.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms of an aforementioned alkyl group have each been substituted with an aforementioned halogen atom.

Examples of the aryl group as the substituent for the aromatic hydrocarbon group include groups in which one hydrogen atom has been removed from an aforementioned aromatic hydrocarbon ring. Among such groups, an aryl group of 6 to 12 carbon atoms is preferable, and a phenyl group or naphthyl group is particularly desirable.

Examples of the alkoxyalkyloxy group as the substituent for the aromatic hydrocarbon group include groups represented by a general formula shown below.

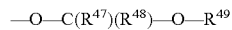

—O—C(R$^{47}$)(R$^{48}$)—O—R$^{49}$

In this formula, each of R$^{47}$ and R$^{48}$ independently represents a hydrogen atom or a linear or branched alkyl group, and R$^{49}$ represents an alkyl group.

The alkyl group for R$^{47}$ and R$^{48}$ preferably has 1 to 5 carbon atoms, may be either linear or branched, is preferably an ethyl group or a methyl group, and is most preferably a methyl group.

It is preferable that at least one of R$^{47}$ and R$^{48}$ is a hydrogen atom. It is particularly desirable that at least one of R$^{47}$ and R$^{48}$ is a hydrogen atom, and the other is a hydrogen atom or a methyl group.

The alkyl group for R$^{49}$ preferably has 1 to 15 carbon atoms, and may be linear, branched or cyclic.

The linear or branched alkyl group for R$^{49}$ preferably has 1 to 5 carbon atoms, and specific examples include a methyl group, ethyl group, propyl group, n-butyl group and tert-butyl group.

The cyclic alkyl group for R$^{49}$ preferably has 4 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the aromatic hydrocarbon group include groups represented by a general formula shown below.

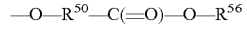

—O—R$^{50}$—C(=O)—O—R$^{56}$

In this formula, R$^{50}$ represents a linear or branched alkylene group, and R$^{56}$ represents a tertiary alkyl group.

The linear or branched alkylene group for R$^{50}$ preferably has 1 to 5 carbon atoms, and specific examples include a methylene group, ethylene group, trimethylene group, tetramethylene group and 1,1-dimethylethylene group.

Examples of the tertiary alkyl group for R$^{56}$ include a 2-methyl-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1- methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

Further, a group in which $R^{56}$ in the group represented by the aforementioned general formula: —O—$R^{50}$—C(=O)—O—$R^{56}$ has been substituted with $R^{56'}$ can also be used. $R^{56'}$ represents a hydrogen atom, an alkyl group, a fluorinated alkyl group or an aliphatic cyclic group which may contain a hetero atom.

Examples of the alkyl group for $R^{56'}$ include the same groups as those described above for the alkyl group for $R^{49}$.

Examples of the fluorinated alkyl group for $R^{56'}$ include groups in which part or all of the hydrogen atoms within an aforementioned alkyl group for $R^{49}$ have each been substituted with a fluorine atom.

Examples of the aliphatic cyclic group which may contain a hetero atom for $R^{56'}$ include aliphatic cyclic groups that do not contain a hetero atom, aliphatic cyclic groups containing a hetero atom within the ring structure, and groups in which a hydrogen atom within an aliphatic cyclic group has been substituted with a hetero atom.

For $R^{56'}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Specific examples of the aliphatic cyclic group containing a hetero atom in the ring structure for $R^{56'}$ include groups represented by formulas (L1) to (L7) and (S1) to (S4) described below.

For $R^{56'}$, specific examples of the groups in which a hydrogen atom within an aliphatic cyclic group has been substituted with a hetero atom include groups in which two hydrogen atoms within an aliphatic cyclic group have been substituted with an oxygen atom (=O).

Each of $R^{6'}$, $R^{7'}$ and $R^{8'}$ in —C(=O)—O—$R^{6'}$, —O—C(=O)—$R^{7'}$, and —O—$R^{8'}$ independently represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The linear or branched saturated hydrocarbon group preferably has 1 to 25 carbon atoms, more preferably 1 to 15 carbon atoms, and still more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group, excluding tertiary alkyl groups, include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxygen atom (=O), cyano group and carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group of 3 to 20 carbon atoms for $R^{6'}$, $R^{7'}$ or $R^{8'}$ may be either a polycyclic group or a monocyclic group, and examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

The cyclic saturated hydrocarbon group may have a substituent. For example, part of the carbon atoms that constitute a ring within the cyclic saturated hydrocarbon group may be substituted with a hetero atom, or a hydrogen atom bonded to a ring within the cyclic saturated hydrocarbon may be substituted with a substituent.

Examples of the former case include groups in which one or more hydrogen atoms have been removed from a heterocycloalkane in which part of the carbon atoms that constitute the ring(s) of an aforementioned monocycloalkane or polycycloalkane have been substituted with a hetero atom such as an oxygen atom, a sulfur atom or a nitrogen atom. Further, the ring structure may contain an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a bicycloalkane, tricycloalkane or tetracycloalkane containing a lactone ring.

In the latter case, examples of the substituent include the same substituents as those described above for the linear or branched saturated hydrocarbon group, and alkyl groups of 1 to 5 carbon atoms.

Further, the saturated hydrocarbon group for $R^{6'}$, $R^{7'}$ or $R^{8'}$ may be a combination of a linear or branched alkyl group and a cyclic alkyl group.

Examples of combinations of a linear or branched alkyl group and a cyclic alkyl group include groups in which a cyclic alkyl group is bonded as a substituent to a linear or branched alkyl group, and groups in which a linear or branched alkyl group is bonded as a substituent to a cyclic alkyl group.

Examples of the linear aliphatic unsaturated hydrocarbon group for $R^{6'}$, $R^{7'}$ or $R^{8'}$ include a vinyl group, propenyl group (allyl group), and butynyl group.

Examples of the branched aliphatic unsaturated hydrocarbon group for $R^{6'}$, $R^{7'}$ or $R^{8'}$ include a 1-methylpropenyl group and 2-methylpropenyl group.

These linear or branched aliphatic unsaturated hydrocarbon groups may have a substituent. Examples of the substituent include the same substituents as those described above for the linear or branched alkyl group.

Of the above possibilities, each of $R^{7'}$ and $R^{8'}$ is preferably a linear or branched saturated hydrocarbon group of 1 to 15 carbon atoms or a cyclic saturated hydrocarbon group of 3 to 20 carbon atoms, as such groups yield superior lithography properties and a favorable resist pattern shape.

The aliphatic hydrocarbon group for $Rr^1$ may be a saturated hydrocarbon group (alkyl group) or an unsaturated aliphatic hydrocarbon group. Further, the aliphatic hydrocarbon group may be either a chain-like group or a cyclic group. The chain-like aliphatic hydrocarbon group may be either linear or branched. The cyclic aliphatic hydrocarbon group may be either monocyclic group or polycyclic.

In the aliphatic hydrocarbon group, part of the carbon atoms that constitute the aliphatic hydrocarbon group may be substituted with a hetero atom-containing substituent, and part or all of the hydrogen atoms that constitute the aliphatic hydrocarbon group may be substituted with a substituent.

The hetero atom in the hetero atom-containing substituent that may substitute part of the carbon atoms that constitute the aliphatic hydrocarbon group describes an atom other than a carbon atom or hydrogen atom, and examples include a halogen atom, oxygen atom, sulfur atom and nitrogen atom. Examples of the halogen atom include a fluorine atom, chlorine atom, iodine atom and bromine atom.

The hetero atom-containing substituent may consist solely of the hetero atom, or may be a group that also contains an atom or group of atoms in addition to the hetero atom.

Specific examples of the substituent for substituting part of the carbon atoms that constitute the aliphatic hydrocarbon group include —O—, —C(=O)—O—, —C(=O)—, —O—C(=O)—O—, —C(=O)—NH—, —NH— (wherein H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituents within the ring structure.

Examples of the substituent used for substituting part or all of the hydrogen atoms that constitute the aliphatic hydrocarbon group include an alkoxy group, halogen atom, halogenated alkyl group, hydroxyl group, oxo group (=O), cyano group, aryl group, alkoxyalkyloxy group, alkoxycarbonylalkyloxy group, carboxyl group, —COO$^-$Z$^+$ (wherein Z$^+$ is the same as defined above), —C(=O)—O—$R^{6'}$, —O—C(=O)—$R^{7'}$, and —O—$R^{8'}$. Each of $R^{6'}$, $R^{7'}$ and $R^{8'}$ independently represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms. In those cases where the aliphatic hydrocarbon group is a cyclic group, the hydrocarbon group may include an alkyl group as a substituent. Specific examples of these substituents include the same groups as those mentioned above as the substituent for the aromatic hydrocarbon group.

Examples of the organic cation for Z$^+$ include the same organic cation as those mentioned below for Z$^+$ in general formula (c1).

The aliphatic hydrocarbon group for $Rr^1$ is preferably a chain-like alkyl group, a chain-like unsaturated hydrocarbon group, or a cyclic alkyl group.

The chain-like alkyl group preferably contains 1 to 20 carbon atoms, more preferably 1 to 15 carbon atoms, still more preferably 1 to 10 carbon atoms, and most preferably 1 to 5 carbon atoms.

The chain-like alkyl group may be either linear or branched.

Examples of the linear alkyl group include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group and eicosyl group.

Examples of the branched alkyl group include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

In these chain-like alkyl groups, part or all of the hydrogen atoms that constitute the alkyl group may be substituted with a substituent. Examples of the substituent include the same groups as those mentioned above for the substituent for substituting part or all of the hydrogen atoms that constitute the aliphatic hydrocarbon group.

Among the above possibilities, the substituent is preferably a halogen atom, and most preferably a fluorine atom.

The chain-like unsaturated hydrocarbon group has 2 to 20 carbon atoms, preferably 2 to 10 carbon atoms, more preferably 2 to 5 carbon atoms, still more preferably 2 to 4 carbon atoms, and most preferably 3 carbon atoms.

The chain-like unsaturated hydrocarbon group may be either linear or branched.

Examples of the linear unsaturated hydrocarbon group include a vinyl group, propenyl group (allyl group) and butynyl group.

Examples of the branched unsaturated hydrocarbon group include a 1-methylpropenyl group and a 2-methylpropenyl group.

Among the above examples, the chain-like unsaturated hydrocarbon group is most preferably a propenyl group (allyl group).

In these chain-like alkyl groups, part or all of the hydrogen atoms that constitute the alkyl group may be substituted with a substituent. Examples of the substituent include the same groups as those mentioned above for the substituent for substituting part or all of the hydrogen atoms that constitute the aliphatic hydrocarbon group.

Among the above possibilities, the substituent is preferably a halogen atom, and most preferably a fluorine atom.

The cyclic alkyl group contains 3 to 20 carbon atoms, preferably 5 to 20 carbon atoms, and more preferably 5 to 10 carbon atoms.

The cyclic alkyl group may be either monocyclic or polycyclic.

Examples of the monocyclic cyclic alkyl group include groups in which one or more hydrogen atoms have been removed from a monocycloalkane. The monocycloalkane is preferably a monocycloalkane of 5 or 6 carbon atoms, and specific examples include cyclopentane and cyclohexane.

Examples of the polycyclic cyclic alkyl group include groups in which one or more hydrogen atoms have been removed from a polycycloalkane. The polycycloalkane is preferably a polycycloalkane of 7 to 12 carbon atoms, and specific examples include such as adamantane, norbornane, isobornane, tricyclodecane or tetracyclododecane.

In the cyclic alkyl group, part or all of the hydrogen atoms bonded to the carbon atoms that constitute the cyclic structure may be substituted with a substituent. Examples of the substituent include the same groups as those mentioned above for the substituent for substituting part or all of the hydrogen atoms that constitute the aliphatic hydrocarbon group.

In the cyclic alkyl group, part of the carbon atoms that constitute the cyclic alkyl group may be substituted with a hetero atom-containing substituent. Examples of this substituent include the same substituents as those mentioned above for the hetero atom-containing substituent that may substitute part of the carbon atoms that constitute the aliphatic hydrocarbon group. Among such substituents, —O—, —C(=O)—O—, —S—, —S(=O)$_2$—, and —S(=O)$_2$—O— are preferable.

Preferred examples of cyclic alkyl groups in which part of the carbon atoms have been substituted with a hetero atom-containing substituent include the cyclic alkyl groups represented by formulas (L1) to (L7) and (S1) to (S4) shown below.

[Chemical Formula 48]

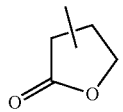
(L1)

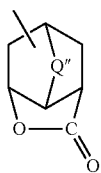
(L2)

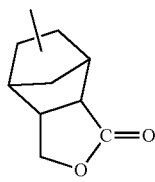
(L3)

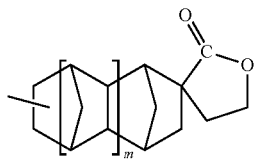
(L4)

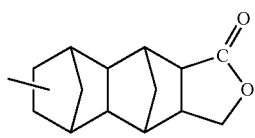
(L5)

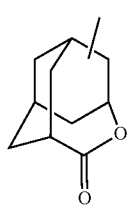
(L6)

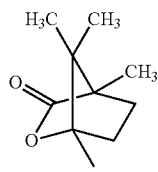
(L7)

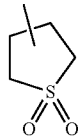
(S1)

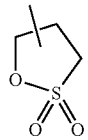
(S2)

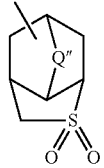
(S3)

(S4)

In the formulas, Q" represents an alkylene group of 1 to 5 carbon atoms, —O—, —S—, —O—R$^{94'}$— or —S—R$^{95'}$—, wherein each of R$^{94'}$ and R$^{95'}$ independently represents an alkylene group of 1 to 5 carbon atoms, and m represents an integer of 0 or 1.

In the above formulas, the alkylene groups for Q", R$^{94'}$ and R$^{95'}$ are preferably linear or branched alkylene groups, and each alkylene group preferably contains 1 to 12 carbon atoms, more preferably 1 to 5 carbon atoms, and still more preferably 1 to 3 carbon atoms.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—]. Of these, a methylene group or alkylmethylene group is preferable, and a methylene group is particularly desirable.

In these cyclic groups, a portion of the hydrogen atoms bonded to the carbon atoms that constitute the cyclic structure may be substituted with a substituent. Examples of this substituent include the same groups as those mentioned above for the substituent that may substitute part or all of the hydrogen atoms bonded to the carbon atoms that constitute the cyclic structure of the aforementioned cyclic alkyl group.

Among the various possibilities described above, $Rr^1$ is preferably a hydrogen atom, a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent, and is more preferably a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent.

Among these, when the value of n in formula (g1) is 0, $Rr^1$ is preferably a chain-like alkyl group of 1 to 15 carbon atoms which may have a substituent or an aromatic hydrocarbon group of 5 to 20 carbon atoms which may have a substituent, and is most preferably a methyl group which may be substituted with fluorine, an ethyl group which may be substituted with fluorine, or a phenyl group which may be substituted with fluorine.

Further, when the value of n in formula (g1) is 1, $Rr^1$ is preferably a cyclic alkyl group of 3 to 20 carbon atoms which may have a substituent, and is more preferably a polycyclic cyclic group.

As this polycyclic cyclic alkyl group, a group in which one or more hydrogen atoms have been removed from a polycycloalkane which may be substituted with fluorine, or a cyclic group represented by one of the aforementioned formulas (L1) to (L7) and (S1) to (S4) or the like is preferable.

Examples of the polycycloalkane include the same compounds as those mentioned above. The group in which one or more hydrogen atoms have been removed from a polycycloalkane is preferably an adamantyl group, norbornyl group, isobornyl group, tricyclodecanyl group or tetracyclododecyl group or the like, wherein these groups may be substituted with fluorine.

The polycyclic cyclic alkyl group is most preferably an adamantyl group which may be substituted with fluorine, or the cyclic group represented by formula (L7).

Examples of the hydrocarbon group of 1 to 20 carbon atoms which may have a substituent for $Rr^2$ and $Rr^3$ include the same groups as those described above for the hydrocarbon group of 1 to 20 carbon atoms which may have a substituent for $Rr^1$.

In the present invention, each of $Rr^2$ and $Rr^3$ preferably represents a hydrogen atom or an alkyl group of 1 to 5 carbon atoms, and is most preferably a hydrogen atom.

In formula (g1), two or three of $Rr^1$ to $Rr^3$ may be bonded to each other to form a ring. For example, $Rr^2$ and $Rr^3$ may be bonded to each other to form a ring, $Rr^1$ and $Rr^3$ may be bonded to each other to form a ring, or all of $Rr^1$ to $Rr^3$ may be bonded together to form a ring. Of these possibilities, it is preferable that either $Rr^2$ and $Rr^3$ are bonded to each other to form a ring, or all of $Rr^1$ to $Rr^3$ are bonded together to form a ring.

When $Rr^2$ and $Rr^3$ are bonded to each other to form a ring, the ring that is formed may be saturated or unsaturated, but in most cases, is preferably saturated. Further, the ring may be either monocyclic or polycyclic. For example, when one or both of $Rr^2$ and $Rr^3$ include cyclic structures (such as a cyclic alkyl group or an aromatic hydrocarbon group), bonding these groups together forms a polycyclic ring (condensed ring structure).

Specific examples of the ring formed when $Rr^2$ and $Rr^3$ are bonded to each other include groups in which at least two hydrogen atoms bonded to a single carbon atom have been removed from one of the monocycloalkanes described above in relation to the aforementioned cyclic alkyl group, and groups in which at least two hydrogen atoms bonded to a single carbon atom have been removed from one of the polycycloalkanes described above in relation to the aforementioned cyclic alkyl group.

Preferred examples of the compound (G1) in the case where $Rr^2$ and $Rr^3$ are bonded to each other to form a ring include compounds represented by general formula (g1-01) shown below.

[Chemical Formula 49]

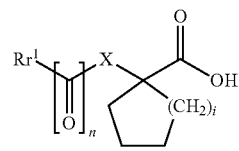

(g1-01)

In the formula, $Rr^1$, n and X are each the same as defined above, and i represents an integer of 0 to 2.

When all of $Rr^1$ to $Rr^3$ are bonded together to form a ring, the ring that is formed may be saturated or unsaturated, but in most cases, is preferably saturated. The ring is typically polycyclic.

Specific examples of the ring formed when all of $Rr^1$ to $Rr^3$ are bonded together to form a ring include groups derived from the polycycloalkanes mentioned above within the description of the cyclic alkyl group, in which the hydrogen atom is removed from a tertiary carbon atom within the polycycloalkane formed solely from carbon atoms that constitute the ring structure, and in which the carbon atom adjacent to this tertiary carbon atom has been substituted with an oxygen atom or a sulfur atom. In such groups, of the carbon atoms bonded to the oxygen atom within the ring structure, an oxo group (=O) may be substituted to one of the carbon atoms other than the tertiary carbon atom.

More specific examples of these types of groups include groups in which a hydrogen atom has been removed from the aforementioned tertiary carbon atom in a lactone ring in which the tertiary carbon atom exists adjacent to the oxygen atom within the ring structure (such as groups of the aforementioned formulas (L2) and (L5) to (L7) in which the group bonding position is the tertiary carbon atom adjacent to —O—).

X represents an oxygen atom or a sulfur atom.

When n represents 1, X is preferably an oxygen atom in terms of ease of synthesis and the like.

n may be either 0 or 1.

Specific examples of the compound (G1) include compounds represented by general formula (g1-1) shown below, compounds represented by general formula (g1-2) shown below, and compounds represented by general formula (g1-3) shown below.

Of these compounds, the compounds represented by formula (g1-1) or (g1-2) correspond with compounds of the aforementioned formula (g1) in which n represents 0, whereas compounds represented by formula (g1-3) correspond with compounds of the formula (g1) in which n represents 1.

[Chemical Formula 50]

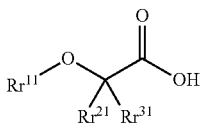
(g1-1)

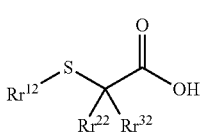
(g1-2)

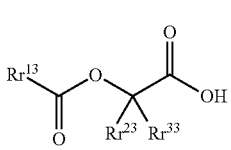
(g1-3)

In the formulas, $Rr^{11}$ represents a hydrogen atom or a hydrocarbon group of 1 to 20 carbon atoms which may have a substituent, each of $Rr^{21}$ and $Rr^{31}$ independently represents a hydrogen atom or a hydrocarbon group of 1 to 20 carbon atoms which may have a substituent, and $Rr^{21}$ and $Rr^{31}$ may be bonded to each other to form a ring. $Rr^{12}$ represents a hydrogen atom or a hydrocarbon group of 1 to 20 carbon atoms which may have a substituent, each of $Rr^{22}$ and $Rr^{32}$ independently represents a hydrogen atom or a hydrocarbon group of 1 to 20 carbon atoms which may have a substituent, and $Rr^{22}$ and $Rr^{32}$ may be bonded to each other to form a ring. $Rr^{13}$ represents a hydrogen atom or a hydrocarbon group of 1 to 20 carbon atoms which may have a substituent, each of $Rr^{23}$ and $Rr^{33}$ independently represents a hydrogen atom or a hydrocarbon group of 1 to 20 carbon atoms which may have a substituent, and $Rr^{23}$ and $Rr^{33}$ may be bonded to each other to form a ring.

In formula (g1-1), $Rr^{11}$, $Rr^{21}$ and $Rr^{31}$ are the same as defined above for $Rr^1$, $Rr^2$ and $Rr^3$ respectively in general formula (g1).

$Rr^{11}$ is preferably a hydrogen atom, a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent, and is more preferably a chain-like alkyl group of 1 to 15 carbon atoms which may have a substituent or an aromatic hydrocarbon group of 5 to 20 carbon atoms which may have a substituent.

It is preferable that $Rr^{21}$ and $Rr^{31}$ are either both hydrogen atoms, or are bonded to each other to form a ring, and it is particularly desirable that $R^{21}$ and $R^{31}$ are both hydrogen atoms.

In formula (g1-2), $Rr^{12}$, $Rr^{22}$ and $Rr^{32}$ are the same as defined above for $Rr^{11}$, $Rr^{21}$ and $Rr^{31}$ respectively in general formula (g1-1).

In formula (g1-3), $Rr^{13}$, $Rr^{23}$ and $Rr^{33}$ are the same as defined above for $Rr^1$, $Rr^2$ and $Rr^3$ respectively in general formula (g1).

$Rr^{13}$ is preferably a hydrogen atom, a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent, is more preferably a cyclic alkyl group of 3 to 20 carbon atoms which may have a substituent, and is still more preferably a polycyclic cyclic alkyl group.

It is preferable that $Rr^{23}$ and $Rr^{33}$ are either both hydrogen atoms, or are bonded to each other to form a ring, and it is particularly desirable that $Rr^{23}$ and $Rr^{33}$ are both hydrogen atoms.

[Compound (G2)]

In formula (g2), examples of the hydrocarbon group of 1 to 20 carbon atoms which may have a substituent for $Rs^1$ include the same groups as those described above for $Rr^1$ in the aforementioned general formula (g1).

$Rs^1$ is preferably a fluorine atom or a fluorinated alkyl group.

The fluorinated alkyl group for $Rs^1$ is a group in which part or all of the hydrogen atoms of an alkyl group have each been substituted with a fluorine atom, wherein the alkyl group may be either a chain-like group or a cyclic group. Examples of the chain-like alkyl group include the same chain-like alkyl groups as those mentioned above within the description relating to $Rr^1$ in general formula (g1), and chain-like alkyl groups having 1 to 15 carbon atoms are preferable. Examples of the cyclic alkyl group include the same cyclic alkyl groups as those mentioned above within the description relating to $Rr^1$ in general formula (g1), and cyclic alkyl groups having 3 to 20 carbon atoms are preferable.

The fluorinated alkyl group is preferably a chain-like fluorinated alkyl group having 1 to 15 carbon atoms, more preferably 1 to 11 carbon atoms, still more preferably 1 to 8 carbon atoms, and most preferably 1 to 4 carbon atoms. Specific examples include groups in which part or all of the hydrogen atoms that constitute a linear alkyl group such as a methyl group, ethyl group, propyl group, butyl group, pentyl group, hexyl group, heptyl group, octyl group, nonyl group or decyl group have each been substituted with a fluorine atom, and groups in which part or all of the hydrogen atoms that constitute a branched alkyl group such as a 1-methylethyl group, 1-methylpropyl group, 2-methylpropyl group, 1-methylbutyl group, 2-methylbutyl group or 3-methylbutyl group have each been substituted with a fluorine atom.

Further, the fluorinated alkyl group for $Rs^1$ may include an atom other than the carbon, hydrogen and fluorine atoms. Examples of this atom other than the carbon, hydrogen and fluorine atoms include an oxygen atom, a sulfur atom and a nitrogen atom.

The fluorinated alkyl group for $Rs^1$ is preferably a group in which part or all of the hydrogen atoms that constitute a linear alkyl group have each been substituted with a fluorine atom. A group in which all of the hydrogen atoms that constitute a linear alkyl group have each been substituted with a fluorine atom (namely, a perfluoroalkyl group) is particularly desirable.

$Rs^2$ and $Rs^3$ are the same as defined above for $Rr^2$ and $Rr^3$ in general formula (g1).

Examples of the fluorinated alkyl group for $Rs^4$ include the same groups as those mentioned above for the fluorinated alkyl group for $Rs^1$.

m may be either 0 or 1.

[Compound (G3)]

In formula (g3), examples of the chain-like alkyl group of 1 to 15 carbon atoms and the cyclic alkyl group of 3 to 20 carbon atoms for $Rt^1$ include the same groups as those described above for the chain-like alkyl group and cyclic alkyl group for $Rr^1$ in the aforementioned general formula (g1).

Among the above possibilities, $Rt^1$ is preferably a chain-like or cyclic alkyl group of 1 to 15 carbon atoms, more preferably a chain-like alkyl group of 1 to 5 carbon atoms or a cyclic alkyl group of 5 to 10 carbon atoms, and most preferably a methyl group.

Examples of the halogen atom for $Rt^2$ include a fluorine atom, chlorine atom, bromine atom and iodine atom, and a fluorine atom is particularly desirable.

The alkoxy group for $Rt^2$ is preferably an alkoxy group of 1 to 5 carbon atoms, and specific examples include a methoxy group and an ethoxy group.

The alkyl group of 1 to 5 carbon atoms for $Rt^2$ is preferably a linear or branched alkyl group, and specific examples include a methyl group, ethyl group, propyl group, n-butyl group and tert-butyl group.

p may be either 0 or 1.

Specific examples of preferred compounds for the compounds (G1) to (G3) are shown below.

[Chemical Formula 51]

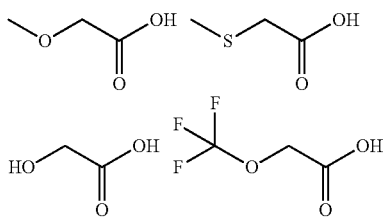

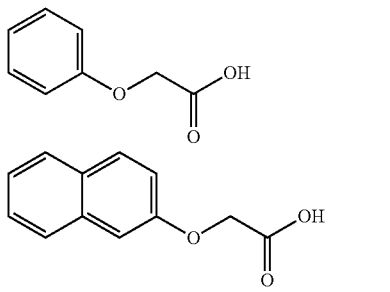

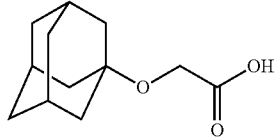

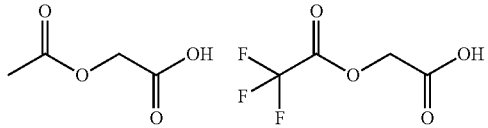

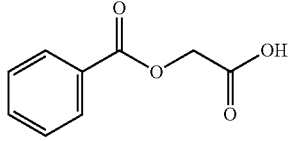

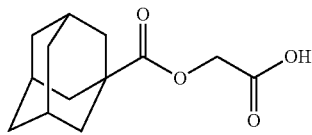

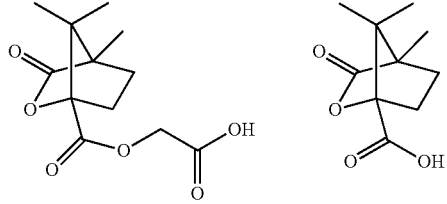

-continued

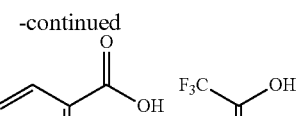

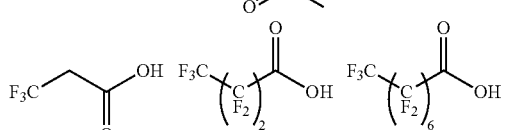

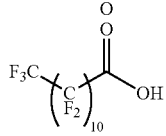

Commercially available compounds may be used as the compounds (G1) to (G3), or the compounds may be synthesized using conventional production methods.

For example, among the various forms of the compound (G1), compounds in which n represents 1 (namely, compounds represented by general formula (g1') shown below) can be synthesized by reacting a compound (i-1) and a compound (i-2) in the manner described below.

[Chemical Formula 52]

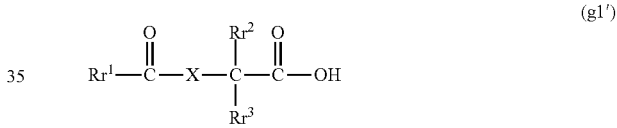

In formula (g1'), $Rr^1$ represents a hydrogen atom or a hydrocarbon group of 1 to 20 carbon atoms which may have a substituent, each of $Rr^2$ and $Rr^3$ independently represents a hydrogen atom or a hydrocarbon group of 1 to 20 carbon atoms which may have a substituent, and two or three of $Rr^1$ to $Rr^3$ may be bonded to each other to form a ring. X represents an oxygen atom or a sulfur atom.

[Chemical Formula 53]

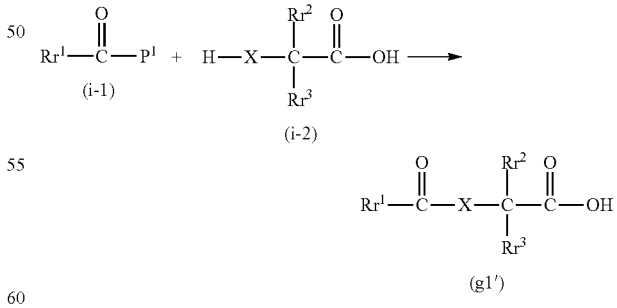

In the above formulas, $Rr^1$, $Rr^2$, $Rr^3$, X and n are each the same as defined above, and $P^1$ represents a halogen atom (preferably a chlorine atom or a bromine atom).

As the component (G), a single compound may be used alone, or a combination of two or more compounds may be used.

The amount of the component (G) within the resist composition, is preferably within a range from 0.01 to 7 parts by weight, more preferably from 0.1 to 5 parts by weight, and still more preferably from 0.5 to 3 parts by weight, per 100 parts by weight of the component (A). When the amount of the component (G) is at least as large as the lower limit of the above range, the effect of the component (G) in improving the storage stability of the resist composition can be satisfactorily realized. On the other hand, when the amount of the component (G) is not more than the upper limit of the above range, more favorable lithography properties (such as sensitivity) can be obtained.

Further, the amount of the component (G) is preferably within a range from 1 to 5 mol, and more preferably from 1 to 3 mol, per 1 mol of the component (C).

<Component (C)>

The component (C) is a photoreactive quencher.

A "quencher" is an acid diffusion control agent, namely a compound that traps the acid generated from the component (B) or the like upon exposure.

A "photoreactive quencher" functions as a quencher prior to exposure (or in the unexposed portions), but does not function as a quencher following exposure (such as irradiation with EB or EUV).

There are no particular limitations on the component (C), provided it functions as a photoreactive quencher, and any known photoreactive quencher proposed for use with a resist composition can be used.

Specific examples of the component (C) include basic compounds composed of an anion and a cation. These basic compounds trap the acid (strong acid) generated from the component (B) and the like by salt exchange.

In the present invention, the expression "basic compound" describes a compound that is relatively basic compared with the component (B).

Examples of the component (C) include a compound (C1) represented by general formula (c1) shown below, a compound (C2) represented by general formula (c2) shown below, and a compound (C3) represented by general formula (c3) shown below.

[Chemical Formula 54]

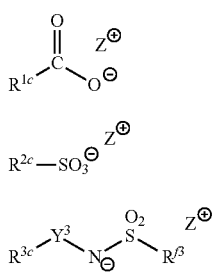

In the formulas, $R^{1c}$ represents a hydrocarbon group which may have a substituent, $R^{2c}$ represents a hydrocarbon group of 1 to 30 carbon atoms which may have a substituent (but in which the carbon atom adjacent to S is not substituted with a fluorine atom), $R^{3c}$ represents an organic group, $Y^3$ represents a linear, branched or cyclic alkylene group or an arylene group, $Rf^3$ represents a hydrocarbon group containing a fluorine atom, and each $Z^+$ independently represents an organic cation.

[Compound (C1)]

Anion

In formula (c1), $R^{1c}$ represents a hydrocarbon group which may have a substituent.

Examples of the hydrocarbon group for $R^{1c}$ include the same groups as those mentioned above for $Rr^1$ in general formula (g1) within the above description relating to the component (G).

Further, $R^{1c}$ may also represent the type of hydrocarbon group with which the carbonate group in the component (G) is substituted. In other words, $R^{1c}$ may represent an aliphatic hydrocarbon group in which the β-position carbon atom is substituted with an oxygen atom (—O—) or a sulfur atom (—S—), an aliphatic hydrocarbon group in which an electron withdrawing group is bonded to the carbon atom on the α-position or the β-position, or an aryl group in which an organic group containing an oxygen atom (—O—) is bonded to the carbon atom on the ortho-position via the oxygen atom of the organic group. Furthermore, an aryl group in which a hydroxyl group is bonded to the carbon atom on the ortho-position may also be used.

Examples of the electron withdrawing group include a fluorine atom, oxygen atom (oxo group), nitrogen atom (cyano group), and sulfur atom (sulfonyl group). Of these, a fluorine atom is preferable.

Examples of the organic group containing an oxygen atom include any organic group having an oxygen atom (—O—) at the terminal that bonds to the aryl group, and examples include the aforementioned groups —O—C(=O)—R⁷' and —O—R⁸'.

Of the above possibilities, preferred examples of the aliphatic hydrocarbon group in which the β-position carbon atom is substituted with an oxygen atom or a sulfur atom include groups (I) represented by general formula (I) shown below.

Preferred examples of the aliphatic hydrocarbon group in which an electron withdrawing group is bonded to the carbon atom on the α-position or the β-position include groups (II) represented by general formula (II) shown below.

Preferred examples of the aryl group in which an organic group containing an oxygen atom is bonded to the carbon atom on the ortho-position via the oxygen atom of the organic group, or an aryl group in which a hydroxyl group is bonded to the carbon atom on the ortho-position include groups (III) represented by general formula (III) shown below.

[Chemical Formula 55]

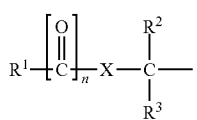

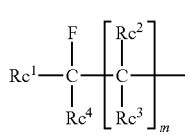

In the above formulas, $R^1$ represents a hydrogen atom or a hydrocarbon group of 1 to 20 carbon atoms which may have a substituent, each of $R^2$ and $R^3$ independently represents a hydrogen atom or a hydrocarbon group of 1 to 20 carbon atoms which may have a substituent, and two or three of $R^1$ to $R^3$ may be bonded to each other to form a ring. X represents an oxygen atom or a sulfur atom, and n represents 0 or 1. $Rc^1$ represents a hydrogen atom, a fluorine atom, or a hydrocarbon group of 1 to 20 carbon atoms which may have a substituent, each of $Rc^2$ and $Rc^3$ independently represents a hydrogen atom or a hydrocarbon group of 1 to 20 carbon atoms which may have a substituent, and two or three of $Rc^1$ to $Rc^3$ may be bonded to each other to form a ring. $Rc^4$ represents a fluorine atom or a fluorinated alkyl group, and m represents 0 or 1. $Rd^1$ represents a hydrogen atom, a chain-like alkyl group of 1 to 15 carbon atoms or a cyclic alkyl group of 3 to 20 carbon atoms, and $Rd^2$ represents a halogen atom, hydroxyl group, alkoxy group, or alkyl group of 1 to 5 carbon atoms. p represents 0 or 1, and q represents an integer of 0 to 4.

In formula (I), $R^1$ represents a hydrogen atom or a hydrocarbon group of 1 to 20 carbon atoms which may have a substituent.

The hydrocarbon group for $R^1$ may be an aromatic hydrocarbon group or an aliphatic hydrocarbon group. Examples of the aromatic hydrocarbon group and the aliphatic hydrocarbon group include the same groups as the aromatic hydrocarbon group and aliphatic hydrocarbon group mentioned above within the description of $Rr^1$ in the aforementioned general formula (g1).

Among the various possibilities described above, $R^1$ is preferably a hydrogen atom, a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent, and is more preferably a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent.

Among these, when the value of n in formula (I) is 0, $R^1$ is preferably a chain-like alkyl group of 1 to 15 carbon atoms which may have a substituent or an aromatic hydrocarbon group of 5 to 20 carbon atoms which may have a substituent, and is most preferably a methyl group which may be substituted with fluorine, an ethyl group which may be substituted with fluorine, or a phenyl group which may be substituted with fluorine.

Further, when the value of n in formula (I) is 1, $R^1$ is preferably a cyclic alkyl group of 3 to 20 carbon atoms which may have a substituent, and is more preferably a polycyclic cyclic group.

As this polycyclic cyclic alkyl group, a group in which one or more hydrogen atoms have been removed from a polycycloalkane which may be substituted with fluorine, or a cyclic group represented by one of the aforementioned formulas (L1) to (L7) and (S1) to (S4) or the like is preferable.

Examples of the polycycloalkane include the same compounds as those mentioned above. The group in which one or more hydrogen atoms have been removed from a polycycloalkane is preferably an adamantyl group, norbornyl group, isobornyl group, tricyclodecanyl group or tetracyclododecyl group or the like, wherein these groups may be substituted with fluorine.

The polycyclic cyclic alkyl group is most preferably an adamantyl group which may be substituted with fluorine, or the cyclic group represented by formula (L7).

Examples of the hydrocarbon group of 1 to 20 carbon atoms which may have a substituent for $R^2$ and $R^3$ include the same groups as those described above for the hydrocarbon group of 1 to 20 carbon atoms which may have a substituent for $R^1$.

In the present invention, each of $R^2$ and $R^3$ preferably represents a hydrogen atom or an alkyl group of 1 to 5 carbon atoms, and is most preferably a hydrogen atom.

In formula (I), two or three of $R^1$ to $R^3$ may be bonded to each other to form a ring. For example, $R^2$ and $R^3$ may be bonded to each other to form a ring, $R^1$ and $R^3$ may be bonded to each other to form a ring, or all of $R^1$ to $R^3$ may be bonded together to form a ring. Of these possibilities, it is preferable that either $R^2$ and $R^3$ are bonded to each other to form a ring, or all of $R^1$ to $R^3$ are bonded together to form a ring.

When $R^2$ and $R^3$ are bonded to each other to form a ring, the ring that is formed may be saturated or unsaturated, but in most cases, is preferably saturated. Further, the ring may be either monocyclic or polycyclic. For example, when one or both of $R^2$ and $R^3$ include cyclic structures (such as a cyclic alkyl group or an aromatic hydrocarbon group), bonding these groups together forms a polycyclic ring (condensed ring structure).

Specific examples of the ring formed when $R^2$ and $R^3$ are bonded to each other include groups in which at least two hydrogen atoms bonded to a single carbon atom have been removed from one of the monocycloalkanes described above in relation to the aforementioned cyclic alkyl group, and groups in which at least two hydrogen atoms bonded to a single carbon atom have been removed from one of the polycycloalkanes described above in relation to the aforementioned cyclic alkyl group.

Preferred examples of the group (I) in the case where $R^2$ and $R^3$ are bonded to each other to form a ring include groups represented by general formula (I-01) shown below.

[Chemical Formula 56]

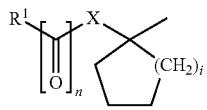

(I-01)

In the formula, $R^1$, n and X are each the same as defined above, and i represents an integer of 0 to 2.

When all of $R^1$ to $R^3$ are bonded together to form a ring, the ring that is formed may be saturated or unsaturated, but in most cases, is preferably saturated. The ring is typically polycyclic.

Specific examples of the ring formed when all of $R^1$ to $R^3$ are bonded together to form a ring include groups derived from the polycycloalkanes mentioned above within the description of the cyclic alkyl group, in which the hydrogen atom is removed from a tertiary carbon atom within the polycycloalkane formed solely from carbon atoms that constitute the ring structure, and in which the carbon atom adjacent to this tertiary carbon atom has been substituted with an oxygen atom or a sulfur atom. In such groups, of the carbon atoms bonded to the oxygen atom within the ring structure, an oxo group (=O) may be substituted to one of the carbon atoms other than the tertiary carbon atom.

More specific examples of these types of groups include groups in which a hydrogen atom has been removed from the aforementioned tertiary carbon atom in a lactone ring in which the tertiary carbon atom exists adjacent to the oxygen atom within the ring structure (such as groups of the aforementioned formulas (L2) and (L5) to (L7) in which the group bonding position is the tertiary carbon atom adjacent to —O—).

X represents an oxygen atom or a sulfur atom.

When n represents 1, X is preferably an oxygen atom in terms of ease of synthesis and the like.

n may be either 0 or 1.

Specific examples of the group (I) include groups represented by general formulas (I-1), (I-2) and (I-3) shown below.

Of these groups, the groups represented by formula (I-1) or (1-2) correspond with groups of the aforementioned formula (I) in which n represents 0, whereas groups represented by formula (I-3) correspond with groups of the formula (I) in which n represents 1.

[Chemical Formula 57]

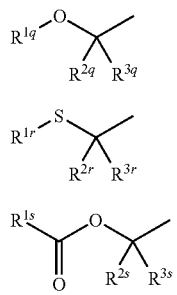

In the formulas, $R^{1q}$ represents a hydrogen atom or a hydrocarbon group of 1 to 20 carbon atoms which may have a substituent, each of $R^{2q}$ and $R^{3q}$ independently represents a hydrogen atom or a hydrocarbon group of 1 to 20 carbon atoms which may have a substituent, and $R^{2q}$ and $R^{3q}$ may be bonded to each other to form a ring. $R^{1r}$ represents a hydrogen atom or a hydrocarbon group of 1 to 20 carbon atoms which may have a substituent, each of $R^{2r}$ and $R^{3r}$ independently represents a hydrogen atom or a hydrocarbon group of 1 to 20 carbon atoms which may have a substituent, and $R^{2r}$ and $R^{3r}$ may be bonded to each other to form a ring. $R^{1s}$ represents a hydrogen atom or a hydrocarbon group of 1 to 20 carbon atoms which may have a substituent, each of $R^{2s}$ and $R^{3s}$ independently represents a hydrogen atom or a hydrocarbon group of 1 to 20 carbon atoms which may have a substituent, and $R^{2s}$ and $R^{3s}$ may be bonded to each other to form a ring.

In formula (I-1), $R^{1q}$, $R^{2q}$ and $R^{3q}$ are the same as defined above for $R^1$, $R^2$ and $R^3$ respectively in general formula (I).

$R^{1q}$ is preferably a hydrogen atom, a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent, and is more preferably a chain-like alkyl group of 1 to 15 carbon atoms which may have a substituent or an aromatic hydrocarbon group of 5 to 20 carbon atoms which may have a substituent.

It is preferable that $R^{2q}$ and $R^{3q}$ are either both hydrogen atoms, or are bonded to each other to form a ring, and it is particularly desirable that $R^{2q}$ and $R^{3q}$ are both hydrogen atoms.

In formula (I-2), $R^{1r}$, $R^{2r}$ and $R^{3r}$ are the same as defined above for $R^{1q}$, $R^{2q}$ and $R^{3q}$ respectively in general formula (I-1).

In formula (I-3), $R^{1s}$, $R^{2s}$ and $R^{3s}$ are the same as defined above for $R^1$, $R^2$ and $R^3$ respectively in general formula (I).

$R^{1s}$ is preferably a hydrogen atom, a chain-like alkyl group of 1 to 15 carbon atoms which may have a substituent, a cyclic alkyl group of 3 to 20 carbon atoms which may have a substituent, or an aromatic hydrocarbon group of 5 to 20 carbon atoms which may have a substituent, is more preferably a cyclic alkyl group of 3 to 20 carbon atoms which may have a substituent, and is still more preferably a polycyclic cyclic alkyl group.

It is preferable that $R^{2s}$ and $R^{3s}$ are either both hydrogen atoms, or are bonded to each other to form a ring, and it is particularly desirable that $R^{2s}$ and $R^{3s}$ are both hydrogen atoms.

In formula (II), examples of the hydrocarbon group of 1 to 20 carbon atoms which may have a substituent for $Rc^1$ include the same groups as those described above for $R^1$ in general formula (I).

$Rc^1$ is preferably a fluorine atom or a fluorinated alkyl group.

The fluorinated alkyl group for $Rc^1$ is a group in which part or all of the hydrogen atoms of an alkyl group have each been substituted with a fluorine atom, wherein the alkyl group may be either a chain-like group or a cyclic group. Examples of the chain-like alkyl group include the same chain-like alkyl groups as those mentioned above within the description relating to $Rr^1$ in general formula (g1), and chain-like alkyl groups having 1 to 15 carbon atoms are preferable. Examples of the cyclic alkyl group include the same cyclic alkyl groups as those mentioned above within the description relating to $Rr^1$ in general formula (g1), and cyclic alkyl groups having 3 to 20 carbon atoms are preferable.

The fluorinated alkyl group is preferably a chain-like fluorinated alkyl group having 1 to 15 carbon atoms, more preferably 1 to 11 carbon atoms, still more preferably 1 to 8 carbon atoms, and most preferably 1 to 4 carbon atoms. Specific examples include groups in which part or all of the hydrogen atoms that constitute a linear alkyl group such as a methyl group, ethyl group, propyl group, butyl group, pentyl group, hexyl group, heptyl group, octyl group, nonyl group or decyl group have each been substituted with a fluorine atom, and groups in which part or all of the hydrogen atoms that constitute a branched alkyl group such as a 1-methylethyl group, 1-methylpropyl group, 2-methylpropyl group, 1-methylbutyl group, 2-methylbutyl group or 3-methylbutyl group have each been substituted with a fluorine atom.

Further, the fluorinated alkyl group for $Rc^1$ may include an atom other than the carbon, hydrogen and fluorine atoms. Examples of this atom other than the carbon, hydrogen and fluorine atoms include an oxygen atom, a sulfur atom and a nitrogen atom.

The fluorinated alkyl group for $Rc^1$ is preferably a group in which part or all of the hydrogen atoms that constitute a linear alkyl group have each been substituted with a fluorine atom. A group in which all of the hydrogen atoms that constitute a linear alkyl group have each been substituted with a fluorine atom (namely, a perfluoroalkyl group) is particularly desirable.

$Rc^2$ and $Rc^3$ are the same as defined above for $R^2$ and $R^3$ in general formula (I).

Examples of the fluorinated alkyl group for $Rc^4$ include the same groups as those mentioned above for the fluorinated alkyl group for $Rc^1$.

m may be either 0 or 1.

In formula (III), examples of the chain-like alkyl group of 1 to 15 carbon atoms and the cyclic alkyl group of 3 to 20 carbon atoms for $Rd^1$ include the same groups as those described above for the chain-like alkyl group and cyclic alkyl group for Rr¹ in the aforementioned general formula (g1).

Among the above possibilities, $Rd^1$ is preferably a chain-like or cyclic alkyl group of 1 to 15 carbon atoms, more preferably a chain-like alkyl group of 1 to 5 carbon atoms or a cyclic alkyl group of 5 to 10 carbon atoms, and most preferably a methyl group.

Examples of the halogen atom for $Rd^2$ include a fluorine atom, chlorine atom, bromine atom and iodine atom, and a fluorine atom is particularly desirable.

The alkoxy group for $Rd^2$ is preferably an alkoxy group of 1 to 5 carbon atoms, and specific examples include a methoxy group and an ethoxy group.

The alkyl group of 1 to 5 carbon atoms for $Rd^2$ is preferably a linear or branched alkyl group, and specific examples include a methyl group, ethyl group, propyl group, n-butyl group and tert-butyl group.

p may be either 0 or 1.

Specific examples of preferred anions for the compound (C1) in those cases where $R^{1c}$ is represented by the group (I), the group (II) or the group (III) include the anions shown below.

[Chemical Formula 58]

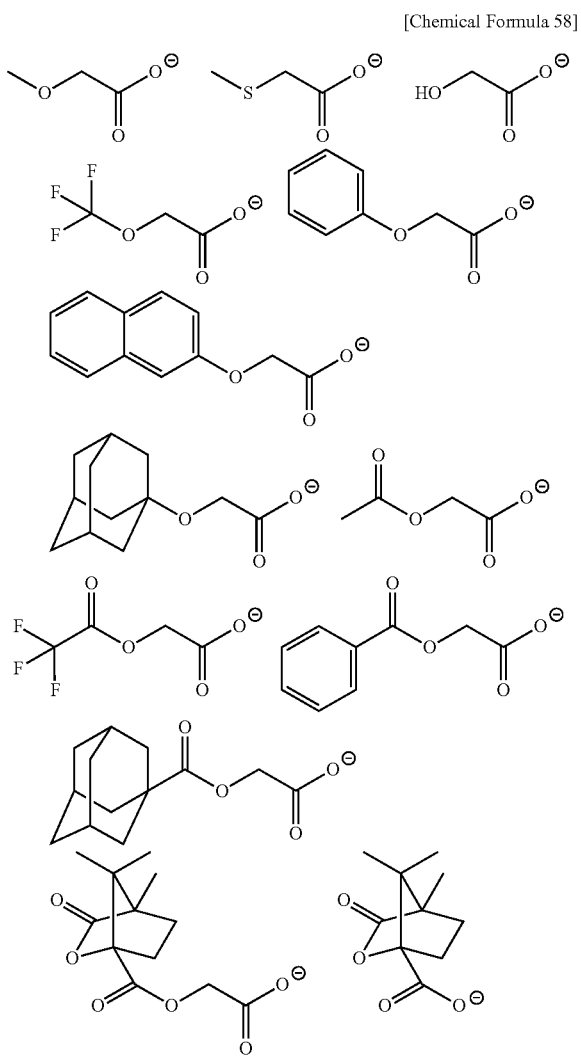

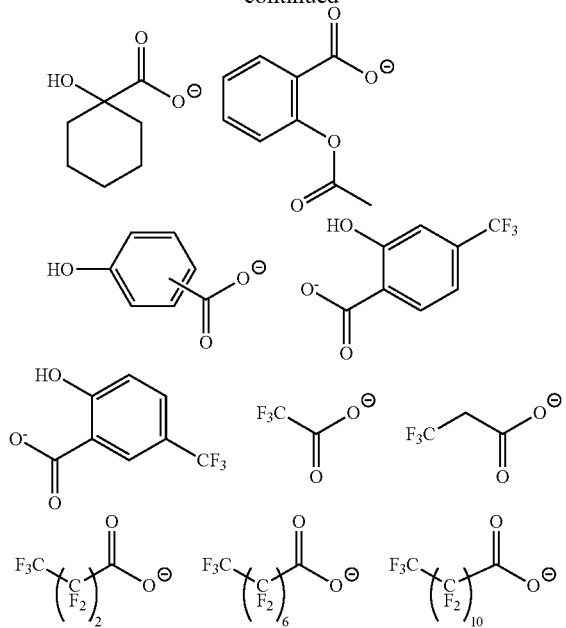

Further examples of $R^{1c}$, besides those described above, include:

chain-like alkyl groups, cyclic alkyl groups which may have a substituent (but excluding aliphatic hydrocarbon groups in which the carbon atom on the β-position is substituted with an oxygen atom or a sulfur atom, and aliphatic hydrocarbon groups in which an electron withdrawing group is bonded to the carbon atom on the α-position or the β-position), and aromatic hydrocarbon groups which may have a substituent (but excluding aryl groups in which an organic group containing an oxygen atom is bonded to the carbon atom on the ortho-position via the oxygen atom of the organic group).

Among these groups, the chain-like alkyl group may be linear or branched. The chain-like alkyl group preferably contains 1 to 10 carbon atoms, and specific examples include linear alkyl groups such as a methyl group, ethyl group, propyl group, butyl group, pentyl group, hexyl group, heptyl group, octyl group, nonyl group and decyl group, and branched alkyl groups such as a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The cyclic alkyl group which may have a substituent is preferably a group in which one or more hydrogen atoms have been removed from a polycycloalkane such as adamantane, norbornane, isobornane, tricyclodecane or tetracyclododecane, wherein the polycycloalkane may have a substituent. Examples of the substituent which the cyclic alkyl group may have include a fluorine atom, an alkyl group and a fluorinated alkyl group.

The aromatic hydrocarbon group which may have a substituent is preferably a phenyl group or naphthyl group which may have a substituent. Examples of the aromatic hydrocarbon group include the same groups as those mentioned above, but an aryl group is preferable, and a phenyl group or naphthyl group is particularly desirable. Examples of the substituent which the aromatic hydrocarbon group may have include a fluorine atom, a fluorinated alkyl group and a hydroxyl group, and a fluorine atom, a trifluoromethyl group or a hydroxyl group is particularly desirable.

Specific examples of preferred anions for the compound (C1) in those cases where $R^{1c}$ is a chain-like alkyl group, a cyclic alkyl group which may have a substituent, or an aromatic hydrocarbon group which may have a substituent include the anions shown below.

[Chemical Formula 59]

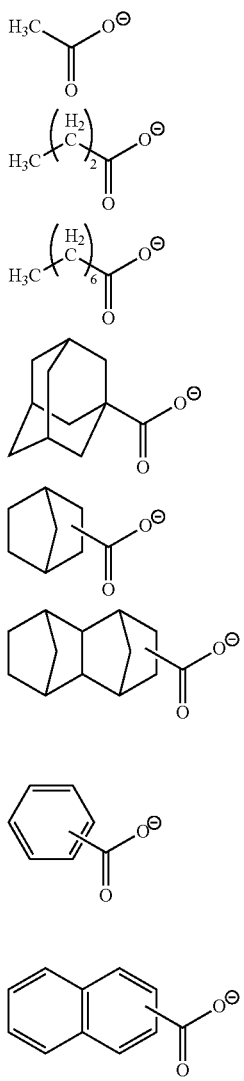

Cation

In formula (c1), $Z^+$ represents an organic cation.

There are no particular limitations on the organic cation for $Z^+$, and the types of organic cations known as the cations for photodegradable bases (photoreactive quenchers) used as quenchers in conventional resist compositions, or the cations for onium salts (onium salt acid generators) or the like used as conventional acid generator components can be used. Examples of these types of organic cations include cations represented by general formula (ca-1) or general formula (ca-2) shown below. Of these, cations represented by general formula (ca-1) are preferable

[Chemical Formula 60]

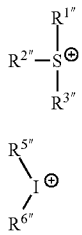

(ca-1)

(ca-2)

In the formulas, each of $R^{1\prime\prime}$ to $R^{3\prime\prime}$, $R^{5\prime\prime}$ and $R^{6\prime\prime}$ independently represents an aryl group, alkyl group or alkenyl group which may have a substituent, and in formula (ca-1), two of $R^{1\prime\prime}$ to $R^{3\prime\prime}$ may be bonded to each other to form a ring in combination with the sulfur atom in the formula.

$R^{1\prime\prime}$ to $R^{3\prime\prime}$ in formula (ca-1), and $R^{5\prime\prime}$ and $R^{6\prime\prime}$ in formula (ca-2) are the same as described for $R^{1\prime\prime}$ to $R^{3\prime\prime}$ in general formula (b-1) and $R^{5\prime\prime}$ and $R^{6\prime\prime}$ in formula (b-2), which are described below within the description relating to component (B).

As the compound (C1), a single compound may be used alone, or a combination of two or more compounds may be used.

In terms of achieving superior effects for the present invention, the compound (C1) is preferably at least one compound selected from the group consisting of compounds in which $R^{1c}$ in formula (c1) is a group (I), group (II) or group (III) described above. At least one compound selected from the group consisting of a compound (C11) represented by general formula (c11) shown below, a compound (C12) represented by general formula (c12) shown below, and a compound (C13) represented by general formula (c13) shown below is preferable. Of these, the compound (C11) is particularly desirable.

[Chemical Formula 61]

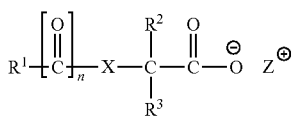

(c11)

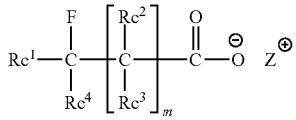

(c12)

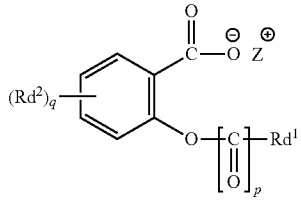

(c13)

In the above formulas, $Z^+$ is the same as defined above. $R^1$ represents a hydrogen atom or a hydrocarbon group of 1 to 20 carbon atoms which may have a substituent, each of $R^2$ and $R^3$ independently represents a hydrogen atom or a hydrocarbon group of 1 to 20 carbon atoms which may have a substituent, and two or three of $R^1$ to $R^3$ may be bonded to each other to form a ring. X represents an oxygen atom or a sulfur atom, and n represents 0 or 1. $Rc^1$ represents a hydrogen atom, a fluorine atom, or a hydrocarbon group of 1 to 20 carbon atoms which may have a substituent, each of $Rc^2$ and $Rc^3$ independently represents a hydrogen atom or a hydrocarbon group of 1 to 20 carbon atoms which may have a substituent, and two or three of $Rc^1$ to $Rc^3$ may be bonded to each other to form a ring. $Rc^4$ represents a fluorine atom or a fluorinated alkyl group, and m represents 0 or 1. $Rd^1$ represents a hydrogen atom, a chain-like alkyl group of 1 to 15 carbon atoms or a cyclic alkyl group of 3 to 20 carbon atoms, and $Rd^2$ represents a halogen atom, hydroxyl group, alkoxy group, or alkyl group of 1 to 5 carbon atoms. p represents 0 or 1, and q represents an integer of 0 to 4.

[Compound (C2)]

Anion

In formula (c2), $R^{2c}$ represents a hydrocarbon group of 1 to 30 carbon atoms which may have a substituent.

The hydrocarbon group of 1 to 30 carbon atoms which may have a substituent for $R^{2c}$ may be an aliphatic hydrocarbon group or an aromatic hydrocarbon group, and examples include the same groups as those mentioned above for $R^{1c}$ in formula (c1).

Among such groups, the hydrocarbon group which may have a substituent for $R^{2c}$ is preferably a cyclic alkyl group which may have a substituent, and is more preferably a group in which one or more hydrogen atoms have been removed from adamantane, norbornane, isobornane, tricyclodecane, tetracyclododecane or camphor or the like (wherein the group may have a substituent).

Examples of the substituent which the hydrocarbon group represented by $R^{2c}$ may have include the same groups as those described below, within the description relating to the component (B), for the substituent for $R^{4"}$ in general formula (b-1) or (b-2). Specific examples of the substituent include a halogen atom, a hetero atom, an alkyl group, and a group represented by a formula $X^3$-Q'- (wherein Q' represents a divalent linking group containing an oxygen atom, and $X^3$ represents a hydrocarbon group of 1 to 30 carbon atoms which may have a substituent). However, in $R^{2c}$, the carbon atom adjacent to the S atom in $SO_3^-$ must not be substituted with a fluorine atom. By ensuring that $SO_3^-$ is not adjacent to a fluorine atom, the anion of the compound (C2) becomes an appropriate weakly acidic anion, and the quenching action of the component (C) improves.

Specific examples of preferred anions for the compound (C2) are shown below.

[Chemical Formula 62]

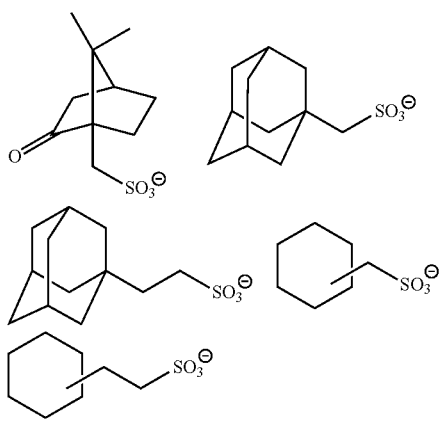

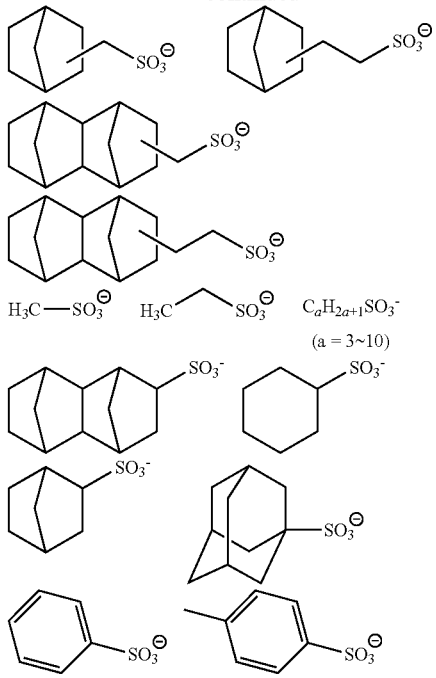

-continued

In formula (c2), $Z^+$ is the same as defined above for $Z^+$ in formula (c1).

As the compound (C2), a single compound may be used alone, or a combination of two or more compounds may be used.

[Compound (C3)]

Anion

In formula (c3), $R^{3c}$ represents an organic group.

There are no particular limitations on the organic group for $R^{3c}$, and examples include an alkyl group, alkoxy group, —O—C(=O)—C($R^{102}$)=$CH_2$ (wherein $R^{102}$ represents a hydrogen atom, an alkyl group of 1 to 5 carbon atoms or a halogenated alkyl group of 1 to 5 carbon atoms) and —O—C(=O)—$R^{103}$ (wherein $R^{103}$ represents a hydrocarbon group).

The alkyl group for $R^{3c}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. A portion of the hydrogen atoms within the alkyl group for $R^{3c}$ may each be substituted with a hydroxyl group or a cyano group or the like.

The alkoxy group for $R^{3c}$ is preferably an alkoxy group of 1 to 5 carbon atoms, and specific examples of such alkoxy groups of 1 to 5 carbon atoms include a methoxy group, ethoxy group, n-propoxy group, iso-propoxy group, n-butoxy group and tert-butoxy group. Among these, a methoxy group or an ethoxy group is the most desirable.

In the formula —O—C(=O)—C($R^{102}$)=$CH_2$, $R^{102}$ represents a hydrogen atom, an alkyl group of 1 to 5 carbon atoms or a halogenated alkyl group of 1 to 5 carbon atoms.

The alkyl group of 1 to 5 carbon atoms for $R^{102}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group for $R^{102}$ is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

$R^{102}$ is preferably a hydrogen atom, an alkyl group of 1 to 3 carbon atoms or a fluorinated alkyl group of 1 to 3 carbon atoms, and in terms of industrial availability, is most preferably a hydrogen atom or a methyl group.

In the formula —O—C(=O)—$R^{103}$, $R^{103}$ represents a hydrocarbon group.

The hydrocarbon group for $R^{103}$ may be either an aromatic hydrocarbon group or an aliphatic hydrocarbon group. Specific examples of the hydrocarbon group for $R^{103}$ include the same hydrocarbon groups as those described above for $R^{1c}$ in formula (c1).

Among these, as the hydrocarbon group for $R^{103}$, a cyclic alkyl group in which one or more hydrogen atoms have been removed from a cycloalkane such as cyclopentane, cyclohexane, adamantane, norbornane, isobornane, tricyclodecane or tetracyclododecane, or an aromatic group such as a phenyl group or a naphthyl group is preferable. When $R^{103}$ is an cyclic alkyl group, the resist composition can be dissolved more favorably in an organic solvent, thereby improving the lithography properties.

Among the above possibilities, $R^{1c}$ is preferably a group represented by —O—C(=O)—C($R^{102'}$)=$CH_2$ (wherein $R^{102'}$ represents a hydrogen atom or a methyl group) or —O—C(=O)—$R^{103'}$ (wherein $R^{103'}$ represents a cyclic alkyl group).

In formula (c3), $Y^3$ represents a linear, branched or cyclic alkylene group or an arylene group.

Examples of the linear or branched alkylene group for $Y^3$ include the same groups as the "linear or branched aliphatic hydrocarbon group" mentioned above within the description of the divalent linking group for $Y^2$ in the aforementioned formula (a1-3).

Examples of the cyclic alkylene group for $Y^3$ include the same groups as the "cyclic aliphatic hydrocarbon group" mentioned above within the description of the divalent linking group for $Y^2$ in formula (a1-3).

Examples of the arylene group for $Y^3$ include the same groups as the "aromatic hydrocarbon group" mentioned above within the description of the divalent linking group for $Y^2$ in formula (a1-3).

Among these groups, $Y^3$ is preferably an alkylene group, more preferably a linear or branched alkylene group, and most preferably a methylene group or an ethylene group.

In formula (c3), $Rf^3$ represents a hydrocarbon group containing a fluorine atom.

The hydrocarbon group containing a fluorine atom for $Rf^3$ is preferably a fluorinated alkyl group, and the same groups as those described above for the fluorinated alkyl group for $R^{1c}$ are particularly desirable.

Specific examples of preferred anions for the compound (C3) are shown below.

[Chemical Formula 63]

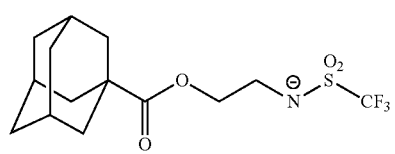

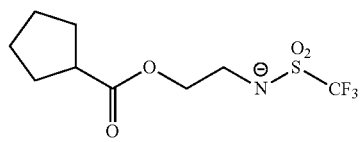

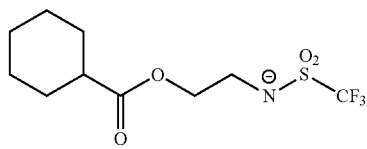

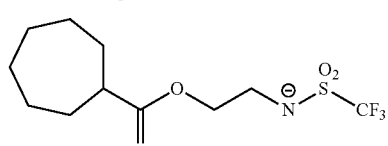

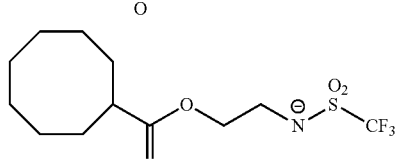

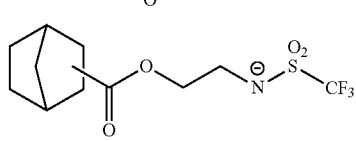

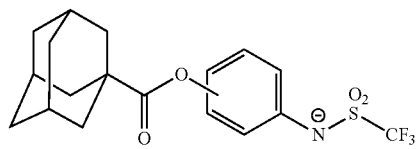

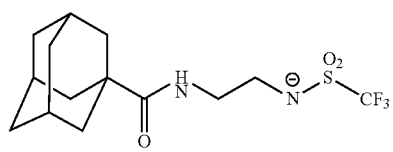

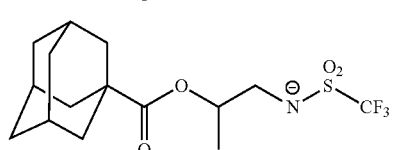

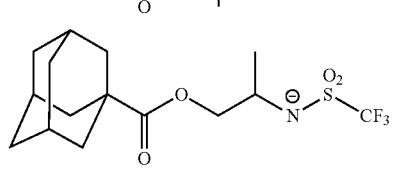

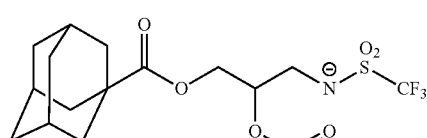

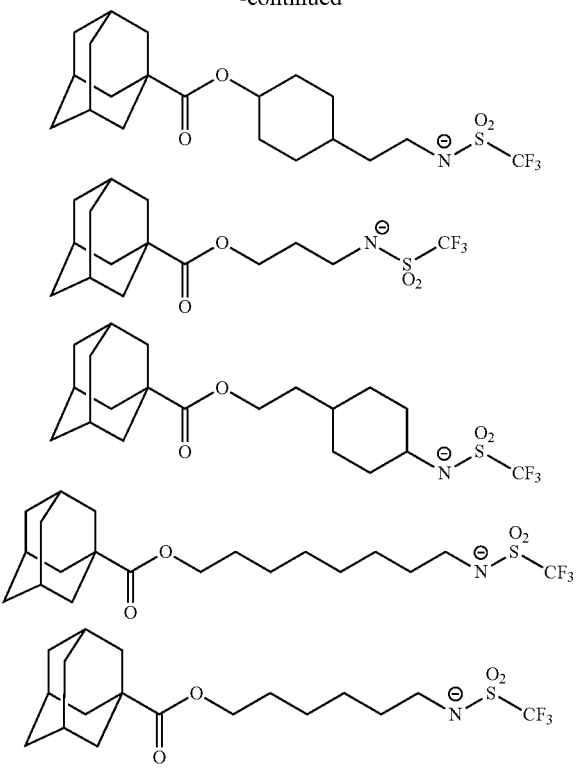

[Chemical Formula 64]

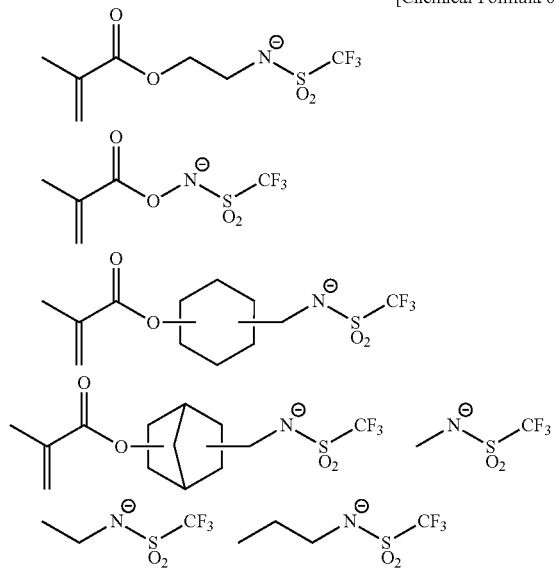

Cation

In formula (c3), $Z^+$ is the same as defined above for $Z^+$ in formula (c1).

As the compound (C3), a single compound may be used alone, or a combination of two or more compounds may be used.

Commercially available compounds may be used for the compounds (C1) to (C3), or the compounds may be synthesized using known production methods.

For example, although there are no particular limitations on the method used for producing the compound (C1), in the case where $R^{1c}$ is the group (I) (namely, the case of the compound (C11)), the compound (C11) can be obtained by subjecting an acid (the compound (G1)) that yields the anion of the compound (C11) and a salt having the desired cation $Z^+$ to a salt exchange reaction.

Although there are no particular limitations on the method used for producing the compound (C3), in the case where $R^{3c}$ in the aforementioned formula (c3) is a group having an oxygen atom at the terminal bonded to $Y^3$, the method described below can be used.

Namely, a compound (i-1) represented by general formula (i-1) shown below is reacted with a compound (i-2) represented by general formula (i-2) shown below to obtain a compound (i-3) represented by general formula (i-3) shown below, and this compound (i-3) is then reacted with a salt having the desired cation $Z^+$ (a compound (i-4) represented by general formula (i-4) shown below), thereby producing the target compound.

[Chemical Formula 65]

$$R^{3a}\text{—OH} + \text{HO—}Y^3\text{—}\underset{H}{N}\text{—}\underset{O_2}{S}\text{—}R^{\beta} \longrightarrow$$
(i-1)      (i-2)

$$R^{3c}\text{—}Y^3\text{—}\underset{H}{N}\text{—}\underset{O_2}{S}\text{—}R^{\beta} + H_2O$$
(i-3)

$$R^{3c}\text{—}Y^3\text{—}\underset{H}{N}\text{—}\underset{O_2}{S}\text{—}R^{\beta} + Z^{\oplus}\ Q^{\ominus} \longrightarrow$$
(i-3)      (i-4)

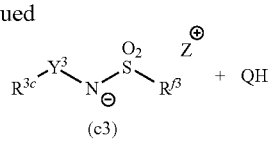

(c3)

In the above formulas, $R^{3c}$, $Y^3$, $Rf^3$ and $Z^+$ are the same as defined above for $R^{3c}$, $Y^3$, $Rf^3$ and $Z^+$ respectively in general formula (c3), $R^{3a}$ represents a group in which the terminal oxygen atom has been removed from $R^{3c}$, and $Q^-$ represents a counter anion.

First, the compound (i-1) is reacted with the compound (i-2) to obtain the compound (i-3).

In formula (i-1), $R^{3a}$ represents a group in which the terminal oxygen atom has been removed from $R^{3c}$. In formula (i-2), $Y^3$ and $Rf^3$ are the same as defined above.

Commercially available compounds may be used as the compound (i-1) and the compound (i-2), or the compounds may be synthesized.

The method for reacting the compound (i-1) with the compound (i-2) to obtain the compound (i-3) is not particularly limited, and can be performed, for example, by reacting the compound (i-1) with the compound (i-2) in an organic solvent in the presence of an appropriate acid catalyst, and then washing the reaction mixture and recovering the reaction product.

There are no particular limitations on the acid catalyst used in the above reaction, and examples include toluenesulfonic acid and the like. The amount used of the acid catalyst is preferably from approximately 0.05 to 5 mol per 1 mol of the compound (i-2).

As the organic solvent used in the above reaction, any organic solvent which is capable of dissolving the raw materials, namely the compound (i-1) and the compound (i-2), can be used, and specific examples include toluene and the like. The amount of the organic solvent is preferably from 0.5 to 100 parts by weight, and more preferably from 0.5 to 20 parts by weight, relative to the compound (i-1). One type of solvent may be used alone, or a combination of two or more types of solvents may be used.

In general, the amount of the compound (i-2) used in the above reaction is preferably from approximately 0.5 to 5 mol, and more preferably from 0.8 to 4 mol, relative to 1 mol of the compound (i-1).

The reaction time for the above reaction varies depending on the reactivity between the compound (i-1) and the compound (i-2), and the reaction temperature and the like, but in most cases, is preferably from 1 to 80 hours, and more preferably from 3 to 60 hours.

The reaction temperature of the above reaction is preferably from 20° C. to 200° C., and more preferably from approximately 20° C. to 150° C.

Next, the obtained compound (i-3) is reacted with the compound (i-4), thereby obtaining the compound (C3).

In formula (i-4), $Z^+$ is the same as defined above, and $Q^-$ represents a counter anion.

The method used for reacting the compound (i-3) with the compound (i-4) to obtain the compound (C3) is not particularly limited, and can be performed, for example, by dissolving the compound (i-3) in an appropriate organic solvent and water in the presence of an appropriate alkali metal hydroxide, and then adding the compound (i-4) and stirring to effect a reaction.

There are no particular limitations on the alkali metal hydroxide used in the above reaction, and examples include sodium hydroxide and potassium hydroxide and the like. The amount used of the alkali metal hydroxide is preferably from approximately 0.3 to 3 mol, per 1 mol of the compound (i-3).

Examples of the organic solvent used in the above reaction include dichloromethane, chloroform, and ethyl acetate and the like. The amount of the organic solvent is preferably from 0.5 to 100 parts by weight, and more preferably from 0.5 to 20 parts by weight, relative to the compound (i-3). One type of solvent may be used alone, or a combination of two or more types of solvents may be used.

In general, the amount of the compound (i-4) used in the above reaction is preferably from approximately 0.5 to 5 mol, and more preferably from approximately 0.8 to 4 mol, relative to 1 mol of the compound (i-3).

The reaction time for the above reaction varies depending on the reactivity between the compound (i-3) and the compound (i-4), and the reaction temperature and the like, but in most cases, is preferably from 1 to 80 hours, and more preferably from 3 to 60 hours.

The reaction temperature of the above reaction is preferably from 20° C. to 200° C., and more preferably from approximately 20° C. to 150° C.

Following completion of the reaction, the compound (C3) contained in the reaction mixture may be isolated and purified. Conventional methods may be used to isolate and purify the product, including concentration, solvent extraction, distillation, crystallization, recrystallization and chromatography, which may be used individually or in combinations of two or more different methods.

The structure of the compound (C3) obtained in the manner described above can be confirmed by typical organic analysis methods such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elemental analysis and X-ray crystal diffraction methods.

As the component (C), a single compound may be used alone, or a combination of two or more compounds may be used.

The amount of the component (C) within the resist composition is preferably within a range from 0.5 to 10.0 parts by weight, more preferably from 0.5 to 8.0 parts by weight, still more preferably from 1.0 to 8.0 parts by weight, and most preferably from 1.5 to 5.5 parts by weight, per 100 parts by weight of the component (A). When the amount of the component (C) is at least as large as the lower limit of the above range, lithography properties such as the resolution, the roughness and the exposure latitude can be improved. Further, a more favorable resist pattern shape can be obtained. On the other hand, when the amount of the component (C) is not more than the upper limit of the above range, sensitivity can be maintained at a satisfactory level, and throughput can be improved.

<Component (B)>

The component (B) is an acid generator component that generates acid upon exposure.

There are no particular limitations on the component (B), and any of the conventional materials that have already been proposed as acid generators for use in chemically amplified resists can be used. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzylsulfonate-based acid generators, iminosulfonate-based acid generators, and disulfone-based acid generators.

Examples of onium salt-based acid generators that may be used include compounds represented by general formula (b-1) or (b-2) shown below.

[Chemical Formula 66]

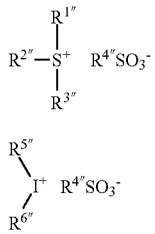

In the formulas, each of $R^{1\prime\prime}$ to $R^{3\prime\prime}$ and $R^{5\prime\prime}$ to $R^{6\prime\prime}$ independently represents an aryl group, alkyl group or alkenyl group which may have a substituent, wherein two of $R^{1\prime\prime}$ to $R^{3\prime\prime}$ in formula (b-1) may be bonded to each other to form a ring in combination with the sulfur atom shown in the formula, and $R^{4\prime\prime}$ represents an alkyl group, halogenated alkyl group, aryl group or alkenyl group which may have a substituent.

In formula (b-1), examples of the aryl group which may have a substituent for $R^{1\prime\prime}$ to $R^{3\prime\prime}$ include an unsubstituted aryl group having 6 to 20 carbon atoms, and a substituted aryl group in which a part or all of the hydrogen atoms of an aforementioned unsubstituted aryl group have each been substituted with a substituent.

The unsubstituted aryl group is preferably an aryl group of 6 to 10 carbon atoms because such groups enable lower cost synthesis. Specific examples include a phenyl group and a naphthyl group.

Examples of the substituent within the substituted aryl group include an alkyl group, alkoxy group, halogen atom, halogenated alkyl group, hydroxyl group, oxo group (=O), cyano group, aryl group, alkoxyalkyloxy group, alkoxycarbonylalkyloxy group, —C(=O)—O—$R^{6\prime}$, —O—C(=O)—$R^{7\prime}$, —O—$R^{8\prime}$, —O—$R^{9\prime}$, halogenated alkylsulfonyloxy group, and —O-$Q^1$-(O—$R^{11\prime\prime}$-S$^+$($R^{21\prime\prime}$)($R^{31\prime\prime}$))$_x$. Each of $R^{6\prime}$, $R^{7\prime}$ and $R^{8\prime}$ represents a linear or branched saturated hydrocarbon group of 1 to 25 carbon atoms, a cyclic saturated hydrocarbon group of 3 to 20 carbon atoms, or a linear or branched, aliphatic unsaturated hydrocarbon group of 2 to 5 carbon atoms. $R^{9\prime}$ represents a nitrogen-containing hydrocarbon group. $R^{11\prime}$ represents an arylene group, alkylene group or alkenylene group which may have a substituent. Each of $R^{21\prime\prime}$ and $R^{31\prime\prime}$ independently represents an aryl group, alkyl group or alkenyl group which may have a substituent, and $R^{21\prime\prime}$ and $R^{31\prime\prime}$ may be bonded to each other to form a ring in combination with the sulfur atom in the formula. x represents 1 or 2, and $Q^1$ represents a linking group having a valency of (x+1).

Among the above substituents, examples of the alkyl group, alkoxy group, halogen atom, halogenated alkyl group, aryl group, alkoxyalkyloxy group, alkoxycarbonylalkyloxy group, —C(=O)—O—$R^{6\prime}$, —O—C(=O)—$R^{7\prime}$ and —O—$R^{8\prime}$ include the same groups and atoms mentioned above as the substituent for the aromatic hydrocarbon group for $R^1$ in the aforementioned formula (c1).

Examples of the nitrogen-containing hydrocarbon group for $R^{9\prime}$ include groups in which part of the carbon atoms in an aforementioned aromatic hydrocarbon group or aliphatic hydrocarbon group have been substituted with a nitrogen atom. Examples of preferred groups include (mono- or di-) alkylaminoalkyl groups in which either one or two of the hydrogen atoms bonded to the nitrogen atom in a linear or branched aminoalkyl group of 1 to 10 carbon atoms have each been substituted with an alkyl group of 1 to 10 carbon atoms.

Examples of the halogenated alkyl group in the halogenated alkylsulfonyloxy group include the same halogenated alkyl groups as those mentioned above as substituents, and a trifluoromethyl group is particularly desirable.

In the formula —O-$Q^1$-(O—$R^{11\prime\prime}$—S$^+$($R^{21\prime\prime}$)($R^{31\prime\prime}$))$_x$, examples of the arylene group, alkylene group or alkenylene group which may have a substituent for $R^{11\prime\prime}$ include groups in which one hydrogen atom has been removed from an aryl group, alkyl group or alkenyl group which may have a substituent described above for $R^{1\prime\prime}$.

Examples of $R^{21\prime\prime}$ and $R^{31\prime\prime}$ includes the same groups as those mentioned above for $R^{2\prime\prime}$ and $R^{3\prime\prime}$ in formula (b-1).

x represents 1 or 2.

$Q^1$ represents a linking group having a valency of (x+1), namely a divalent or trivalent linking group.

Examples of the divalent linking group for $Q^1$ include the same groups as those described above for the divalent linking group for $Y^2$, and although the divalent linking group may be linear, branched or cyclic, a cyclic group is preferable. Among such groups, a group combining two carbonyl groups at the two terminals of an arylene group is particularly desirable. Examples of this arylene group include a phenylene group and a naphthylene group, and a phenylene group is particularly desirable.

Examples of the trivalent linking group for $Q^1$ include groups in which a hydrogen atom has been removed from a divalent linking group, and groups in which an additional divalent linking group is bonded to a divalent linking group. Examples of the divalent linking group include the same groups as those described above for the divalent linking group for $Y^2$. The trivalent linking group for $Q^1$ is preferably a group in which three carbonyl groups are combined with an arylene group.

When the substituted aryl group includes —O-$Q^1$-[O—$R^{11\prime\prime}$—S$^+$($R^{21\prime\prime}$)($R^{31\prime\prime}$)]$_x$ as a substituent, it is preferable that one of $R^{1\prime\prime}$ to $R^{3\prime\prime}$ includes —O-$Q^1$-[O—$R^{11\prime\prime}$—S$^+$($R^{21\prime\prime}$)($R^{31\prime\prime}$)]$_x$ as a substituent.

Specific examples of preferred cations containing —O-$Q^1$-[O—$R^{11\prime\prime}$—S$^+$($R^{21\prime\prime}$)($R^{31\prime\prime}$)]$_x$ as a substituent include cations represented by general formula (ca-0) shown below.

[Chemical Formula 67]

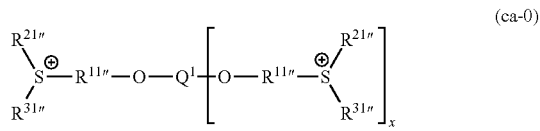

In the formula, $R^{11\prime\prime}$ represents an arylene group, alkylene group or alkenylene group which may have a substituent. Each of $R^{21\prime\prime}$ and $R^{31\prime\prime}$ independently represents an aryl group, alkyl group or alkenyl group which may have a substituent, and $R^{21\prime\prime}$ and $R^{31\prime\prime}$ may be bonded to each other to form a ring in combination with the sulfur atom in the formula. x represents 1 or 2, and $Q^1$ represents a linking group having a valency of (x+1).

Examples of the alkyl group which may have a substituent for $R^{1\prime\prime\prime}$ to $R^{3\prime\prime\prime}$ include unsubstituted alkyl groups, and substituted alkyl groups in which part or all of the hydrogen atoms of an unsubstituted alkyl group have been substituted with a substituent.

The unsubstituted alkyl group may be a linear, branched or cyclic group. From the viewpoint of achieving superior resolution, an alkyl group of 1 to 10 carbon atoms is preferred, and an alkyl group of 1 to 5 carbon atoms is more preferable. Specific examples include a methyl group, ethyl group, n-propyl group, isopropyl group, n-butyl group, isobutyl group, n-pentyl group, cyclopentyl group, hexyl group, cyclohexyl group, nonyl group and decyl group.

Examples of the substituent in the substituted alkyl group include an alkoxy group, halogen atom, halogenated alkyl group, hydroxyl group, oxo group (=O), cyano group, aryl group, alkoxyalkyloxy group, alkoxycarbonylalkyloxy group, —C(=O)—O—$R^{6\prime}$, —O—C(=O)—$R^{7\prime}$, —O—$R^{8\prime}$, —O—$R^{9\prime}$, halogenated alkylsulfonyloxy group, and —O-$Q^1$-[O—$R^{11\prime\prime\prime}$—$S^+$($R^{21\prime\prime\prime}$)($R^{31\prime\prime\prime}$)]$_x$.

Examples of these substituents include the same alkoxy groups, halogen atoms, halogenated alkyl groups, hydroxyl group, oxo group (=O), cyano group, aryl groups, alkoxyalkyloxy groups, alkoxycarbonylalkyloxy groups, groups represented by —C(=O)—O—$R^{6\prime}$, —O—C(=O)—$R^{7\prime}$, —O—$R^{8\prime}$ or —O—$R^{9\prime}$, halogenated alkylsulfonyloxy groups, and groups represented by —O-$Q^1$-[O—$R^{11\prime\prime\prime}$-$S^+$($R^{21\prime\prime\prime}$)($R^{31\prime\prime\prime}$)]$_x$ as those mentioned above as the substituent for the substituted aryl group for $R^{1\prime\prime\prime}$ to $R^{3\prime\prime\prime}$.

Examples of the alkenyl group which may have a substituent for $R^{1\prime\prime\prime}$ to $R^{3\prime\prime\prime}$ include unsubstituted alkenyl groups and substituted alkenyl groups in which part or all of the hydrogen atoms of an unsubstituted alkenyl group have been substituted with a substituent.

The unsubstituted alkenyl group is preferably a linear or branched group, and the alkenyl group preferably contains 2 to 10 carbon atoms, more preferably 2 to 5 carbon atoms, and still more preferably 2 to 4 carbon atoms. Specific examples include a vinyl group, propenyl group (allyl group), butynyl group, 1-methylpropenyl group and 2-methylpropenyl group.

Examples of the substituent in the substituted alkenyl group include the same substituents as those mentioned above as the substituent for the substituted alkyl group for $R^{1\prime\prime\prime}$ to $R^{3\prime\prime\prime}$.

Among the various possibilities for the cation ($S^+$($R^{1\prime\prime\prime}$)($R^{2\prime\prime\prime}$)($R^{3\prime\prime\prime}$)) within formula (b-1), specific examples of preferred cations in those cases where each of $R^{1\prime\prime\prime}$ to $R^{3\prime\prime\prime}$ independently represents an aryl group, alkyl group or alkenyl group which may have a substituent include cations represented by formulas (ca-1-1) to (ca-1-46) shown below.

[Chemical Formula 68]

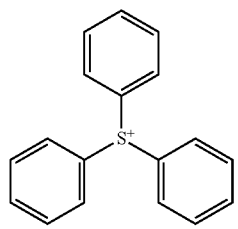
(ca-1-1)

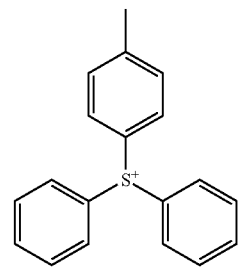
(ca-1-2)

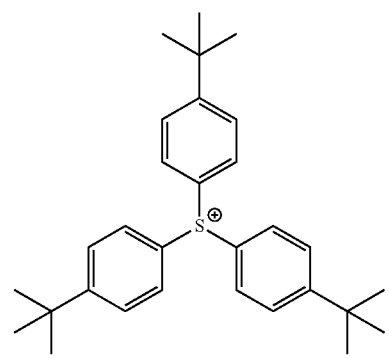
(ca-1-3)

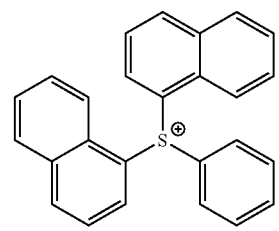
(ca-1-4)

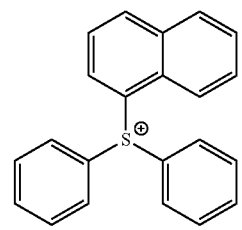
(ca-1-5)

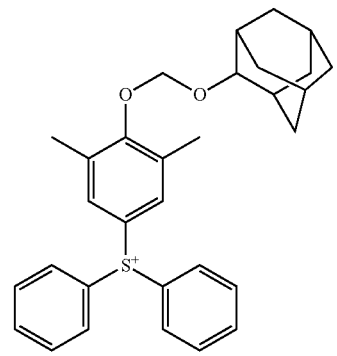
(ca-1-6)

(ca-1-7) 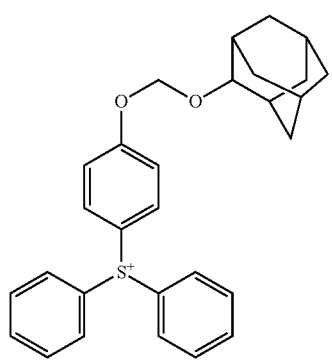
(ca-1-11) 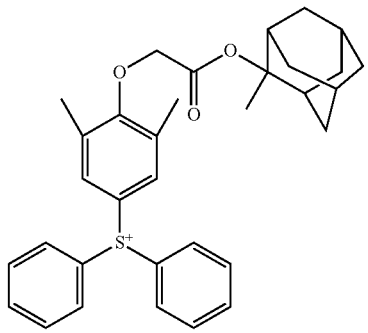
(ca-1-8) 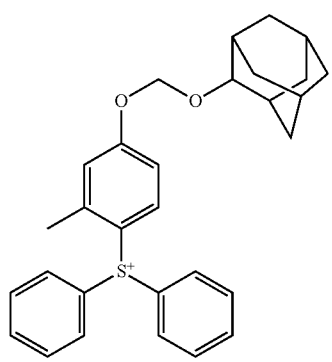
(ca-1-12) 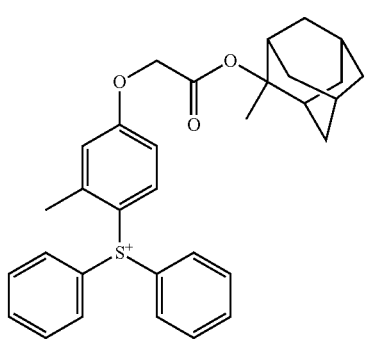
(ca-1-9) 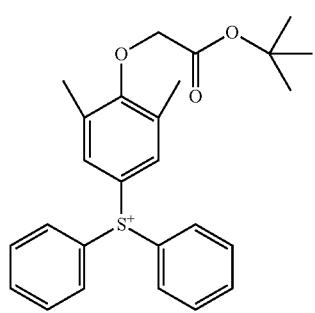
(ca-1-13) 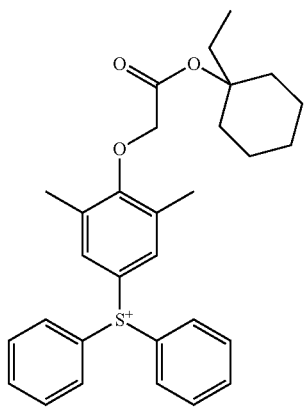
(ca-1-10) 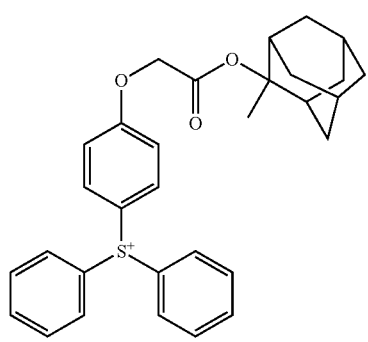
(ca-1-14) 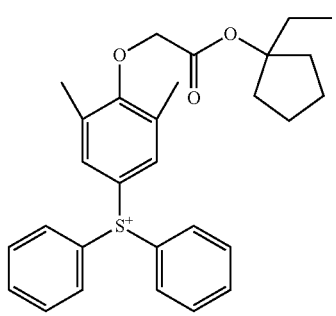

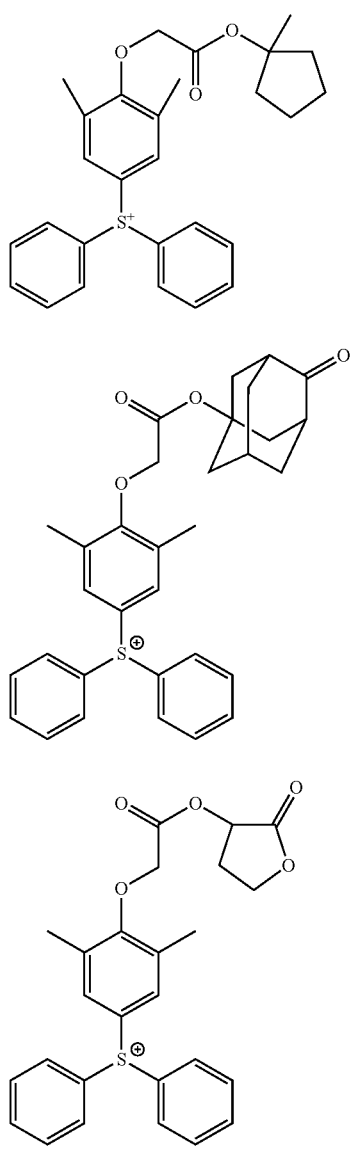
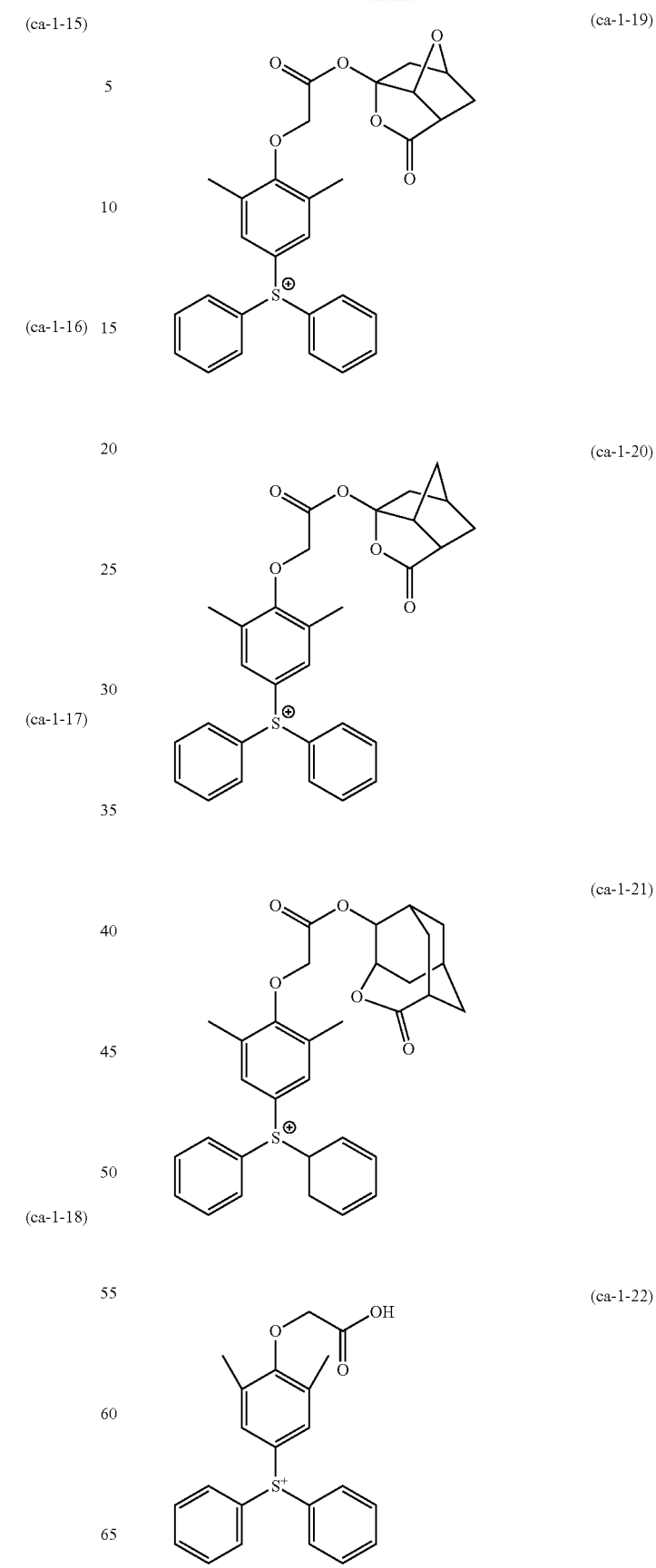

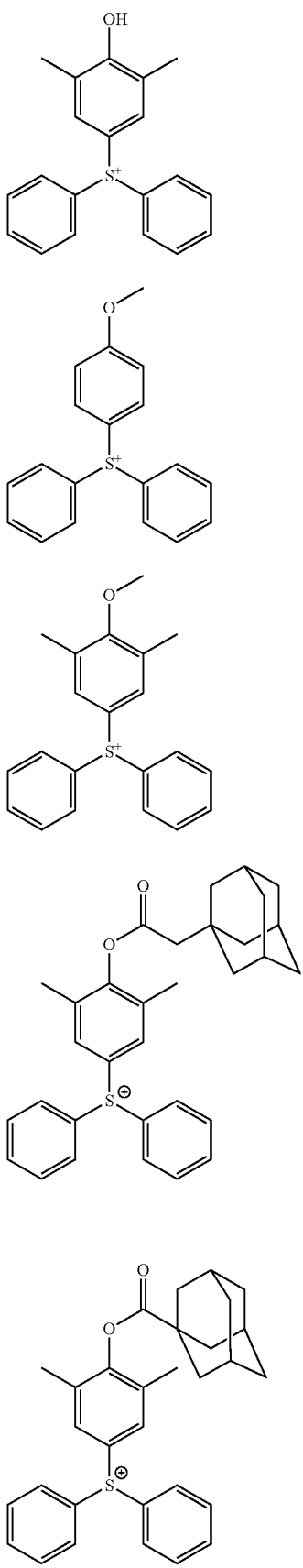
(ca-1-23)
(ca-1-24)
(ca-1-25)
(ca-1-26)
(ca-1-27)
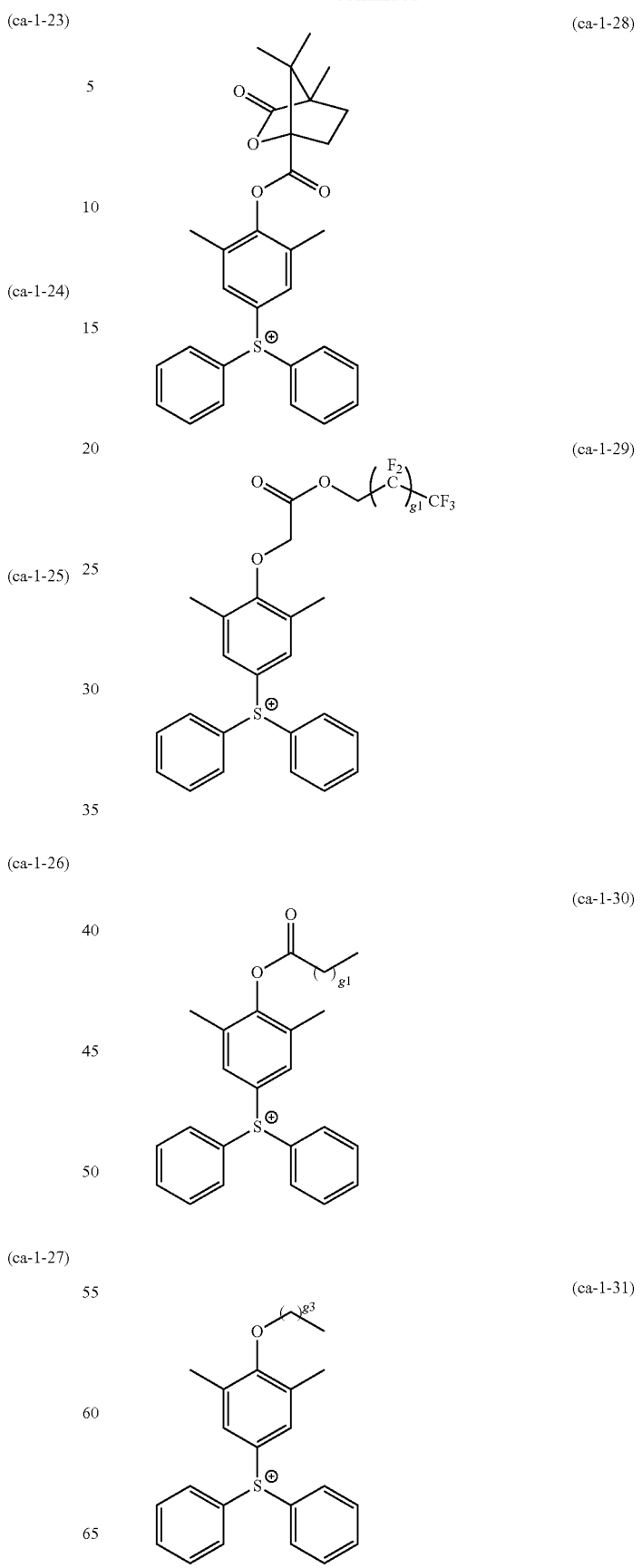
(ca-1-28)
(ca-1-29)
(ca-1-30)
(ca-1-31)

(ca-1-32)
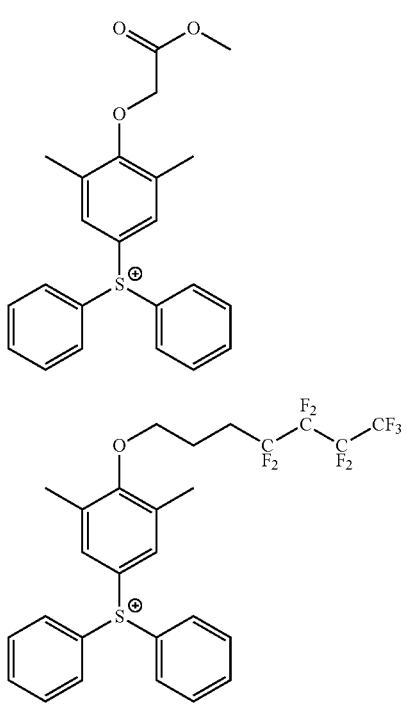
(ca-1-33)
(ca-1-37)
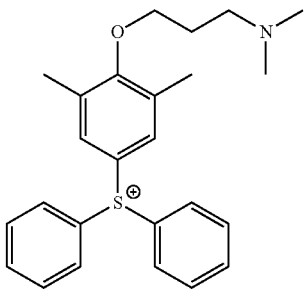
(ca-1-38)
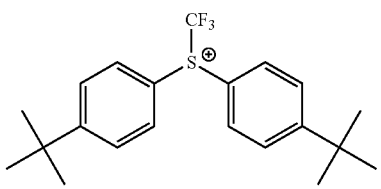
(ca-1-39)
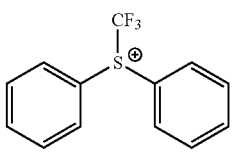
(ca-1-40)
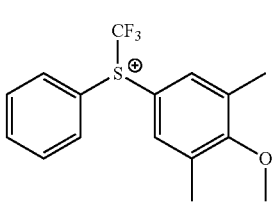
In the above formulas, each of g1, g2 and g3 represents a number of repeating units, wherein g1 represents an integer of 1 to 5, g2 represents an integer of 0 to 20, and g3 represents an integer of 0 to 20.
[Chemical Formula 70]
(ca-1-34)
(ca-1-41)
(ca-1-42)
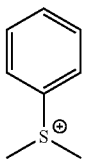
(ca-1-43)
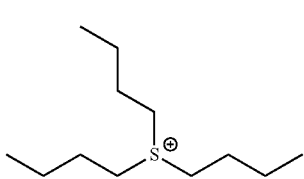
(ca-1-35)
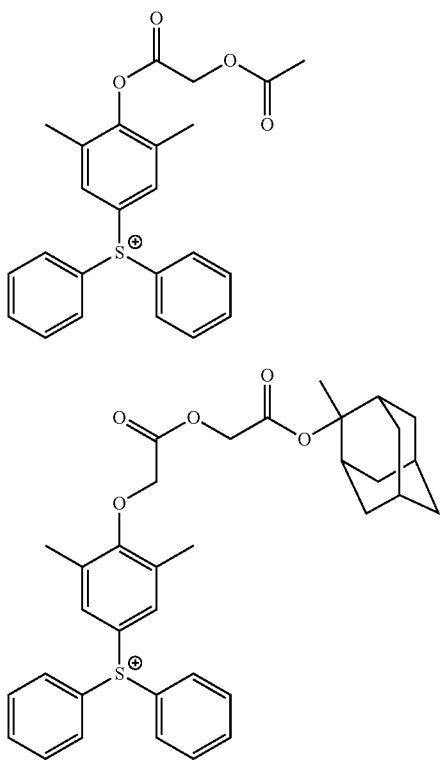
(ca-1-44)
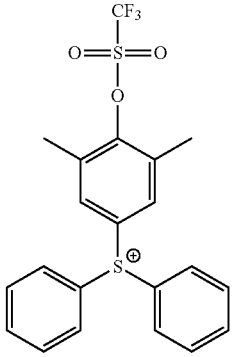

-continued (ca-1-45)

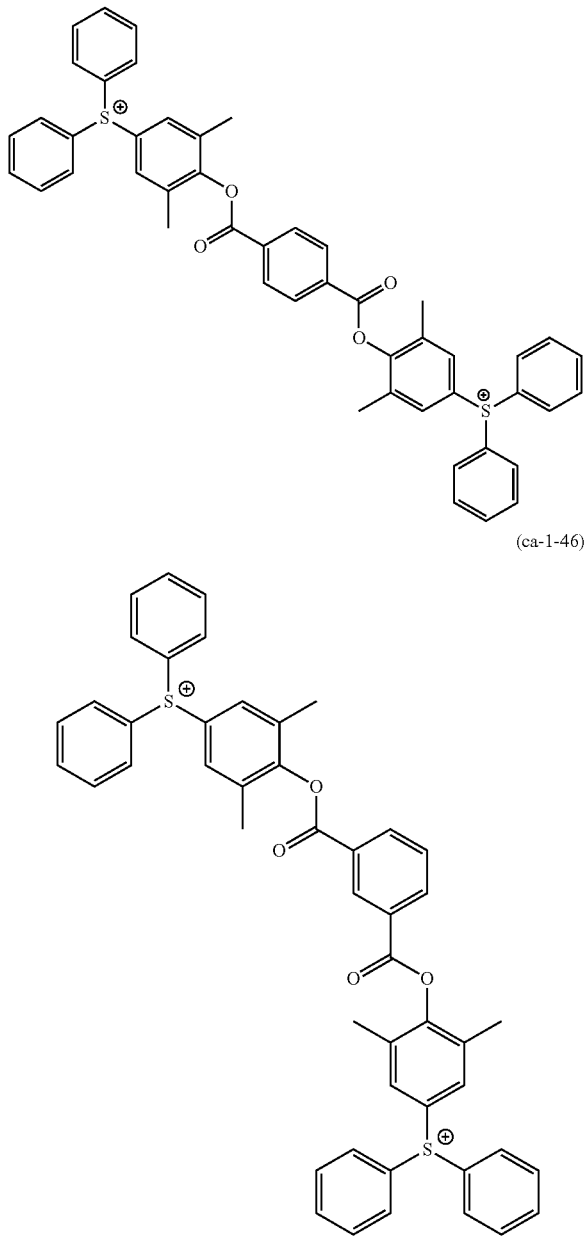

(ca-1-46)

In formula (b-1), two of $R^{1\prime\prime}$ to $R^{3\prime\prime}$ may be bonded to each other to form a ring in combination with the sulfur atom in the formula. In this case, the ring that is formed may be saturated or unsaturated. Further, the ring may be monocyclic or polycyclic. For example, of the two groups of $R^{1\prime\prime}$ to $R^{3\prime\prime}$ that form the cyclic group, if one or both of the two groups is a cyclic group (a cyclic alkyl group or aryl group), then bonding the two groups together forms a polycyclic ring structure (condensed ring structure).

The ring that is formed, which includes the sulfur atom in the formula within the ring structure, is preferably a 3- to 10-membered ring, and more preferably a 5- to 7-membered ring, including the sulfur atom.

The ring may include, among the atoms that constitute the ring structure, a hetero atom other than the sulfur atom that is bonded to $R^{1\prime\prime}$ to $R^{3\prime\prime}$. Examples of this hetero atom include a sulfur atom, an oxygen atom, and a nitrogen atom.

Specific examples of the ring that is formed include a thiophene ring, thiazole ring, benzothiophene ring, thianthrene ring, dibenzothiophene ring, 9H-thioxanthene ring, thioxanthone ring, phenoxathiin ring, tetrahydrothiophenium ring and tetrahydrothiopyranium ring.

Among the various possibilities for the cation ($S^+(R^{1\prime\prime})(R^{2\prime\prime})(R^{3\prime\prime})$) within formula (b-1), specific examples of preferred cations in those cases where two of $R^{1\prime\prime}$ to $R^{3\prime\prime}$ are bonded to each other to form a ring in combination with the sulfur atom in the formula include cations represented by formulas (ca-12) to (ca-15) shown below.

[Chemical Formula 71]

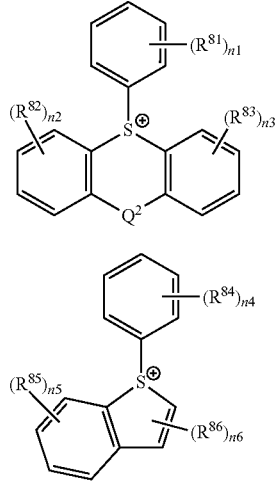

In the formulas, $Q^2$ represents a single bond, methylene group, sulfur atom, oxygen atom, nitrogen atom, carbonyl group, —SO—, —SO$_2$—, —SO$_3$—, —COO—, —CONH— or —N(R$_N$)— (wherein R$_N$ represents an alkyl group of 1 to 5 carbon atoms), each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

[Chemical Formula 72]

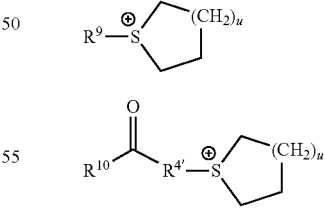

In the formulas, u represents an integer of 1 to 3, $R^9$ represents a phenyl group, naphthyl group or alkyl group which may have a substituent, $R^{10}$ represents a phenyl group, naphthyl group, alkyl group or alkoxy group which may have a substituent, or a hydroxyl group, and $R^{4\prime}$ represents an alkylene group which may have a substituent.

In formulas (ca-12) and (ca-13), the alkyl group for $R^{81}$ to $R^{86}$ is preferably an alkyl group of 1 to 5 carbon atoms, is more preferably a linear or branched alkyl group, and is most preferably a methyl group, ethyl group, propyl group, isopropyl group, n-butyl group or tert-butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably a group in which one or more of the hydrogen atoms within an aforementioned alkyl group have each been substituted with a hydroxyl group, and specific examples include a hydroxymethyl group, hydroxyethyl group and hydroxypropyl group.

When the subscripts $n_1$ to $n_6$ appended to $R^{81}$ to $R^{86}$ represent an integer of 2 or more, the corresponding plurality of $R^{81}$ to $R^{86}$ groups may be the same or different.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Preferred examples of the cation represented by the above formula (ca-12) or (ca-13) are shown below.

[Chemical Formula 73]

(ca-12-1)

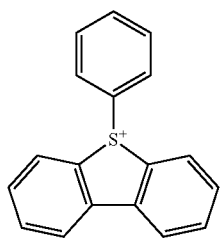

(ca-12-2)

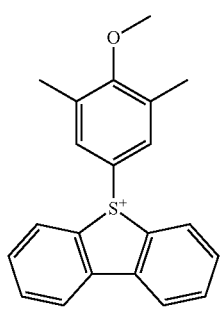

(ca-12-3)

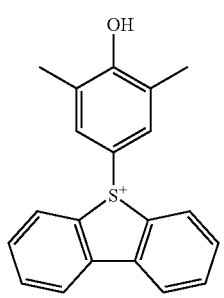

(ca-12-4)

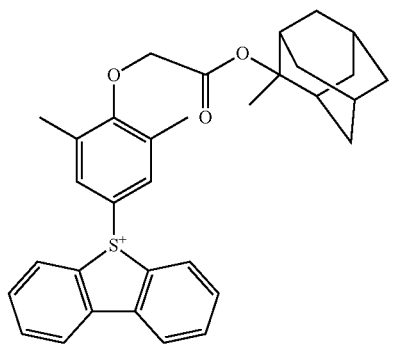

(ca-12-5)

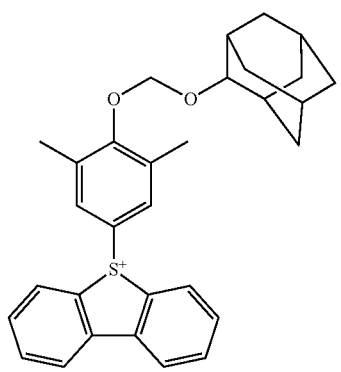

(ca-12-6)

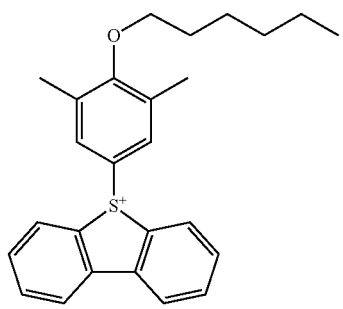

(ca-12-7)

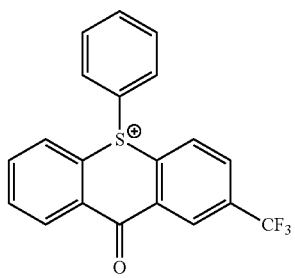

(ca-13-1)

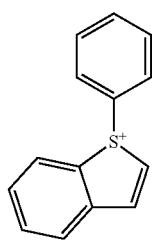

(ca-13-2)

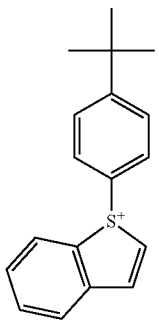

In formulas (ca-14) and (ca-15), u represents an integer of 1 to 3, and is most preferably 1 or 2.

$R^9$ represents a phenyl group, naphthyl group or alkyl group which may have a substituent.

Examples of the substituent which the phenyl group or naphthyl group may have in $R^9$ include the same substituents as those mentioned above for the substituent of the substituted aryl group for $R^{1\prime\prime}$ to $R^{3\prime\prime}$. Specific examples include an alkyl group, alkoxy group, halogen atom, halogenated alkyl group, hydroxyl group, oxo group (=O), cyano group, aryl group, alkoxyalkyloxy group, alkoxycarbonylalkyloxy group, —C(=O)—O—$R^{6\prime}$, —O—C(=O)—$R^{7\prime}$, —O—$R^{8\prime}$, —O—$R^{9\prime}$, halogenated alkylsulfonyloxy group, and —O-$Q^1$-[O—$R^{11\prime\prime}$—

Exam S$^+$($R^{21\prime\prime}$)($R^{31\prime\prime}$)]$_x$. ples of the alkyl group which may have a substituent for $R^9$ include the same groups as those mentioned above for the alkyl group which may have a substituent for $R^{1\prime\prime}$ to $R^{3\prime\prime}$.

$R^{10}$ represents a phenyl group, naphthyl group, alkyl group or alkoxy group which may have a substituent, or a hydroxyl group.

Examples of the substituent which the phenyl group or naphthyl group may have in $R^{10}$ include the same substituents as those that the phenyl group or naphthyl group for $R^9$ may have.

Examples of the alkyl group which may have a substituent, or the alkyl group within the alkoxy group which may have a substituent for $R^{10}$ include the same groups as those mentioned above for the alkyl group which may have a substituent for $R^{1\prime\prime}$ to $R^{3\prime\prime}$.

The alkylene group for $R^{4\prime}$ is preferably a linear or branched alkylene group. The alkylene group preferably contains 1 to 12 carbon atoms, more preferably 1 to 5 carbon atoms, still more preferably 1 to 3 carbon atoms, and most preferably 1 or 2 carbon atoms.

Examples of the substituent which the alkylene group for $R^{4\prime}$ may have include the same substituents as those mentioned above as the substituent for the substituted alkyl group for $R^{1\prime\prime}$ to $R^{3\prime\prime}$. Specific examples of the substituent include an alkoxy group, halogen atom, halogenated alkyl group, hydroxyl group, oxo group (=O), cyano group, aryl group, alkoxyalkyloxy group, alkoxycarbonylalkyloxy group, —C(=O)—O—$R^{6\prime}$, —O—C(=O)—$R^{7\prime}$, —O—$R^{8\prime}$, —O—$R^{9\prime}$, halogenated alkylsulfonyloxy group, and —O-$Q^1$-[O—$R^{11\prime\prime}$—S$^+$($R^{21\prime\prime}$)($R^{31\prime\prime}$)]$_x$.

Preferred examples of the cation represented by the above formula (ca-14) or (ca-15) include the cations shown below.

[Chemical Formula 74]

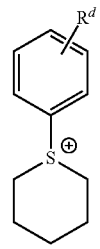
(ca-14-1)

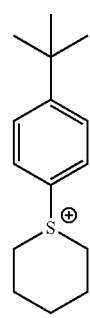
(ca-14-2)

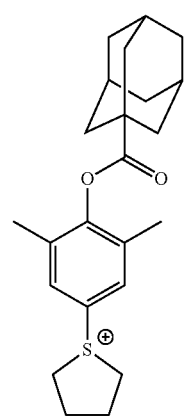
(ca-14-3)

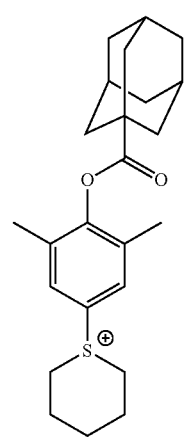
(ca-14-4)

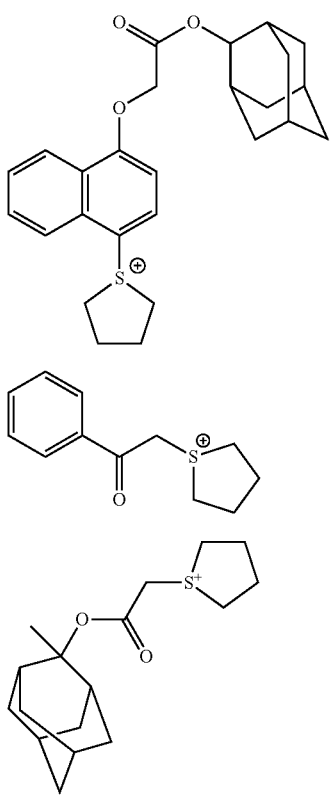

In formula (ca-14-1), $R^d$ represents a substituent. Examples include the same substituents as those that the phenyl group or naphthyl group for $R^9$ may have. Specific examples of the substituent include an alkyl group, alkoxy group, halogen atom, halogenated alkyl group, hydroxyl group, oxo group (=O), cyano group, aryl group, alkoxyalkyloxy group, alkoxycarbonylalkyloxy group, —C(=O)—O—$R^{6\prime\prime}$, —O—C(=O)—$R^{7\prime}$, —O—$R^{8\prime}$, —O—$R^{9\prime}$, halogenated alkylsulfonyloxy group, and —O-$Q^1$-[O—$R^{11\prime\prime}$-$S^+$($R^{21\prime\prime}$)($R^{31\prime\prime}$)]$_x$.

Examples of the aryl group, alkyl group or alkenyl group which may have a substituent for $R^{5\prime\prime}$ and $R^{6\prime\prime}$ in formula (b-2) include the same groups as those described above for the aryl group, alkyl group or alkenyl group which may have a substituent for $R^{1\prime\prime}$ to $R^{3\prime\prime}$.

It is preferable that at least one of $R^{5\prime\prime}$ and $R^{6\prime\prime}$ represents an aryl group which may have a substituent, and more preferable that both of $R^{5\prime\prime}$ and $R^{6\prime\prime}$ are aryl groups which may have a substituent.

Specific examples of preferred cations ($I^+$($R^{5\prime\prime}$)($R^{6\prime\prime}$)) within formula (b-2) include a diphenyliodonium ion and a bis(4-tert-butylphenyl)iodonium ion.

In formulas (b-1) and (b-2), $R^{4\prime\prime}$ represents an alkyl group, halogenated alkyl group, aryl group or alkenyl group which may have a substituent.

The alkyl group for $R^{4\prime\prime}$ may be linear, branched or cyclic.

The linear or branched alkyl group for $R^{4\prime\prime}$ preferably has 1 to 10 carbon atoms, more preferably 1 to 8 carbon atoms, and most preferably 1 to 4 carbon atoms.

The cyclic alkyl group for the aforementioned $R^{4\prime\prime}$ preferably has 4 to 15 carbon atoms, more preferably 4 to 10 carbon atoms, and most preferably 6 to 10 carbon atoms.

When $R^{4\prime\prime}$ represents an alkyl group, examples of $R^{4\prime\prime}SO_3^-$ include alkylsulfonates such as methanesulfonate, n-propanesulfonate, n-butanesulfonate, n-octanesulfonate, 1-adamantanesulfonate, 2-norbornanesulfonate and d-camphor-10-sulfonate.

The halogenated alkyl group for $R^{4\prime\prime}$ is an alkyl group in which part or all of the hydrogen atoms within the group have each been substituted with a halogen atom. The alkyl group is preferably an alkyl group of 1 to 5 carbon atoms, is more preferably a linear or branched alkyl group, and is most preferably a methyl group, ethyl group, propyl group, isopropyl group, n-butyl group, tert-butyl group, tert-pentyl group, or isopentyl group. Examples of the halogen atom which substitutes each hydrogen atom include a fluorine atom, chlorine atom, iodine atom and bromine atom.

In the halogenated alkyl group, it is preferable that 50 to 100% of all the hydrogen atoms within the alkyl group (prior to halogenation) are substituted with halogen atoms, and groups in which all of the hydrogen atoms have been substituted with halogen atoms are particularly desirable.

As the halogenated alkyl group, a fluorinated alkyl group is preferable. The fluorinated alkyl group preferably contains 1 to 10 carbon atoms, more preferably 1 to 8 carbon atoms, and most preferably 1 to 4 carbon atoms.

Furthermore, the fluorination ratio of the fluorinated alkyl group is preferably within a range from 10 to 100%, and more preferably from 50 to 100%. Groups in which all of the hydrogen atoms have been substituted with fluorine atoms are particularly desirable because the acid strength increases.

Specific examples of such fluorinated alkyl groups include a trifluoromethyl group, heptafluoro-n-propyl group and nonafluoro-n-butyl group.

Examples of the aryl group for $R^{4\prime\prime}$ include the same groups as those described above for the aryl group for $R^{1\prime\prime}$ to $R^{3\prime\prime}$, $R^{5\prime\prime}$ and $R^{6\prime\prime}$. Among these groups, aryl groups of 6 to 20 carbon atoms are preferable.

Examples of the alkenyl group for $R^{4\prime\prime}$ include the same groups as those described above for the alkenyl group for $R^{1\prime\prime}$ to $R^{3\prime\prime}$, $R^{5\prime\prime}$ and $R^{6\prime\prime}$. Among these groups, alkenyl groups of 2 to 10 carbon atoms are preferable.

The alkyl group, halogenated alkyl group, aryl group or alkenyl group for $R^{4\prime\prime}$ may each have a substituent.

The expression that these groups "may have a substituent" means that part or all of the hydrogen atoms within the linear, branched or cyclic alkyl group, halogenated alkyl group, aryl group or alkenyl group may each be substituted with a substituent (an atom other than a hydrogen atom, or a group).

$R^{4\prime\prime}$ may have one substituent, or two or more substituents.

Examples of the substituent include a halogen atom, a hetero atom, an alkyl group, and a group represented by the formula $X^3$-Q'- (wherein Q' represents a divalent linking group containing an oxygen atom, and $X^3$ represents a hydrocarbon group of 1 to 30 carbon atoms which may have a substituent).

Examples of the halogen atom and the alkyl group include the same halogen atoms and alkyl groups as those described above with respect to the halogenated alkyl group for $R^{4\prime\prime}$.

Examples of the hetero atom include an oxygen atom, a nitrogen atom, and a sulfur atom.

In the group represented by formula $X^3$-Q'-, Q' represents a divalent linking group containing an oxygen atom.

Q' may contain an atom other than the oxygen atom. Examples of such atoms other than the oxygen atom include a carbon atom, a hydrogen atom, a sulfur atom and a nitrogen atom.

Examples of the divalent linking group containing an oxygen atom include non-hydrocarbon, oxygen atom-containing linking groups such as an oxygen atom (ether linkage: —O—), an ester linkage (—C(=O)—O—), an amide linkage (—C(=O)—NH—), a carbonyl linkage (—C(=O)—) and a carbonate linkage (—O—C(=O)—O—); and combinations of these non-hydrocarbon, oxygen atom-containing linking groups with an alkylene group. Furthermore, the combinations may have a sulfonyl group (—SO$_2$—) bonded thereto.

Specific examples of these combinations include —R$^{91}$—O—, —R$^{92}$—O—C(=O)—, —C(=O)—O—R$^{93}$—O—C(=O)—, —SO$_2$—O—R$^{94}$—O—C(=O)— and —R$^{95}$—SO$_2$—O—R$^{94}$—O—C(=O)— (wherein each of R$^{91}$ to R$^{95}$ independently represents an alkylene group).

The alkylene group for R$^{91}$ to R$^{95}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

Q' is preferably a divalent linking group containing an ester linkage or an ether linkage, and is more preferably a group represented by —R$^{91}$—O—, —R$^{92}$—O—C(=O)— or —C(=O)—O—R$^{93}$—O—C(=O)—.

In the group represented by the formula X$^3$-Q'-, X$^3$ represents a hydrocarbon group of 1 to 30 carbon atoms which may have a substituent.

The hydrocarbon group for X$^3$ may be either an aromatic hydrocarbon group or an aliphatic hydrocarbon group. Examples of the aromatic hydrocarbon group and aliphatic hydrocarbon group for X$^3$ include the same groups as those mentioned above for the aromatic hydrocarbon group and aliphatic hydrocarbon group within the description for Rr$^1$ in the aforementioned general formula (g1).

X$^3$ is preferably a cyclic group which may have a substituent. The cyclic group may be an aromatic hydrocarbon group which may have a substituent, a cyclic alkyl group which may have a substituent, or an aliphatic cyclic group which may have a substituent.

The aromatic hydrocarbon group is preferably a phenyl group which may have a substituent or a naphthyl group which may have a substituent. The substituent is preferably a fluorine atom.

The cyclic alkyl group which may have a substituent is preferably a polycyclic cycloalkyl group which may have a substituent. This polycyclic cycloalkyl group is preferably a group in which one or more hydrogen atoms have been removed from an aforementioned polycycloalkane, or a group represented by one of the aforementioned formulas (L2) to (L7), (S3) and (S4).

Among the various possibilities described above, R$^{4'''}$ is preferably a halogenated alkyl group or a group having X$^3$-Q'- as a substituent.

When the R$^{4'''}$ group has X$^3$-Q'- as a substituent, R$^{4'''}$ is preferably a group represented by the formula X$^3$-Q'-Y'— (wherein Q' and X$^3$ are the same as defined above, and Y$^5$ represents an alkylene group of 1 to 4 carbon atoms which may have a substituent, or a fluorinated alkylene group of 1 to 4 carbon atoms which may have a substituent).

In the group represented by the formula X$^3$-Q'-Y$^5$—, examples of the alkylene group represented by Y$^5$ include those alkylene groups described above for Q' in which the number of carbon atoms is within a range from 1 to 4.

Examples of the fluorinated alkylene group for Y$^5$ include groups in which part or all of the hydrogen atoms of an aforementioned alkylene group have each been substituted with a fluorine atom.

Specific examples of Y$^5$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$—, —CH(CH$_3$) CH$_2$CH$_2$—, —CH$_2$CH(CH$_3$)CH$_2$—, —CH(CH$_3$)CH (CH$_3$)—, —C(CH$_3$)$_2$CH$_2$—, —CH(CH$_2$CH$_3$)CH$_2$—, —CH (CH$_2$CH$_2$CH$_3$)— and —C(CH$_3$)(CH$_2$CH$_3$)—.

Y$^5$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$) CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents which the alkylene group or fluorinated alkylene group may have include an alkyl group of 1 to 4 carbon atoms, an alkoxy group of 1 to 4 carbon atoms, and a hydroxyl group.

Specific examples of groups represented by formula R$^{4'''}$SO$_3^-$ in which R$^{4'''}$ represents X$^3$-Q'-Y$^5$— include anions represented by the following formulas (b1) to (b9).

[Chemical Formula 75]

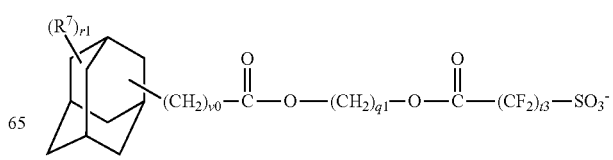

(b1)

-continued

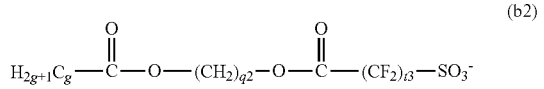
(b2)

(b3)

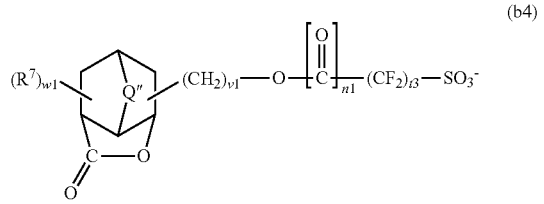
(b4)

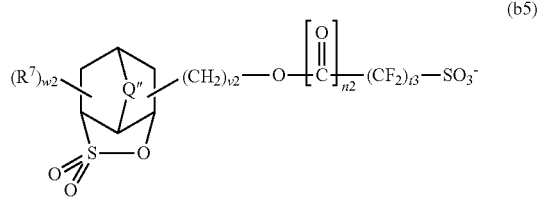
(b5)

[Chemical Formula 76]

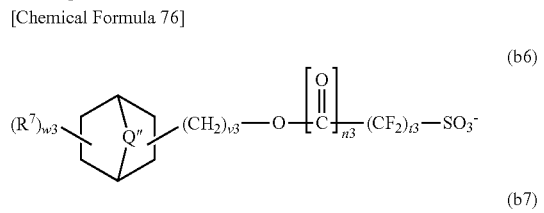
(b6)

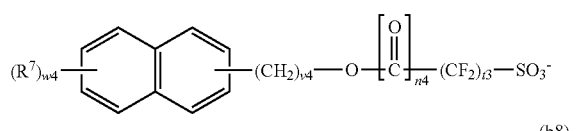
(b7)

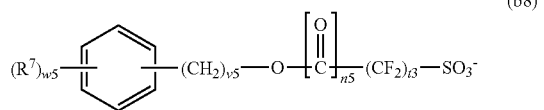
(b8)

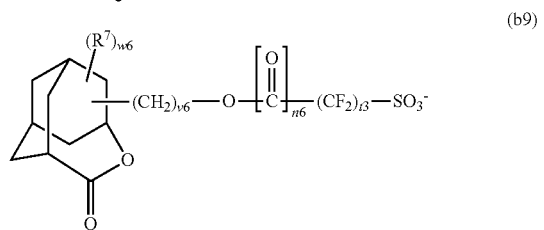
(b9)

In the above formulas, each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, $R^7$ represents a substituent, each of n1 to n6 independently represents 0 or 1, each of v0 to v6 independently represents an integer of 0 to 3, each of w1 to w6 independently represents an integer of 0 to 3, and Q″ is the same as defined above.

Examples of the substituent for $R^7$ include the same groups as those mentioned above, within the description relating to $Rr^1$ in the aforementioned general formula (g1), as substituents that may substitute part of the hydrogen atoms bonded to the carbon atoms that constitute the ring structure of a cyclic alkyl group, or as substituents that may substitute the hydrogen atoms bonded to an aromatic ring within an aromatic hydrocarbon group.

If there are two or more of the $R^7$ group, as indicated by the value of the subscript (r1, r2, or w1 to w6) appended to $R^7$, then the plurality of $R^7$ groups within the compound may be the same or different.

Further, onium salt-based acid generators in which the anion ($R^{4″}SO_3^-$) in the above general formula (b-1) or (b-2) has been replaced with an anion represented by general formula (b-3) or (b-4) shown below (but in which the cation is the same as that shown in formula (b-1) or (b-2)) can also be used as the onium salt-based acid generator.

[Chemical Formula 77]

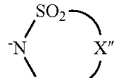
(b-3)

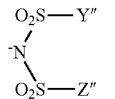
(b-4)

In the formulas, X″ represents an alkylene group of 2 to 6 carbon atoms in which at least one hydrogen atom has been substituted with a fluorine atom, and each of Y″ and Z″ independently represents an alkyl group of 1 to 10 carbon atoms in which at least one hydrogen atom has been substituted with a fluorine atom.

In formula (b-3), X″ represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In formula (b-4), each of Y″ and Z″ independently represents a linear or branched alkyl group in which at least one hydrogen atom has been substituted with a fluorine atom, and the alkyl group preferably has 1 to 10 carbon atoms, more preferably 1 to 7 carbon atoms, and most preferably 1 to 3 carbon atoms.

The smaller the number of carbon atoms in the alkylene group for X″ or the alkyl group for Y″ and Z″ within the aforementioned ranges of the number of carbon atoms, the more the solubility in a resist solvent is improved, and therefore a smaller number of carbon atoms is preferred.

Further, in the alkylene group for X″ or the alkyl group for Y″ and Z″, it is preferable that the number of hydrogen atoms substituted with fluorine atoms is as large as possible, because the acid strength increases and the transparency to high energy radiation of 200 nm or less or an electron beam is improved.

The fluorination ratio of the alkylene group or alkyl group is preferably from 70 to 100%, and more preferably from 90 to 100%. It is particularly desirable that the alkylene group or alkyl group is a perfluoroalkylene group or perfluoroalkyl group in which all the hydrogen atoms are substituted with fluorine atoms.

In the present description, an oxime sulfonate-based acid generator is a compound having at least one group represented by general formula (B-1) shown below, and has a feature of generating acid upon irradiation. Such oxime sulfonate-based acid generators are widely used for chemically amplified resist compositions, and can be selected as appropriate.

[Chemical Formula 78]

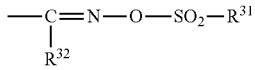

(B-1)

In formula (B-1), each of $R^{31}$ and $R^{32}$ independently represents an organic group.

The organic group for $R^{31}$ and $R^{32}$ refers to a group containing a carbon atom, and may also include atoms other than carbon atoms (such as a hydrogen atom, oxygen atom, nitrogen atom, sulfur atom and halogen atom (such as a fluorine atom and a chlorine atom) and the like).

The organic group for $R^{31}$ is preferably a linear, branched or cyclic alkyl group, or an aryl group. The alkyl group or the aryl group may have a substituent. The substituent is not particularly limited, and examples include a fluorine atom and a linear, branched, or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereafter, sometimes referred to as a "halogenated alkyl group") is particularly desirable. The term "partially halogenated alkyl group" refers to an alkyl group in which part of the hydrogen atoms are substituted with halogen atoms, and the term "completely halogenated alkyl group" refers to an alkyl group in which all of the hydrogen atoms are substituted with halogen atoms. Examples of the halogen atom include a fluorine atom, chlorine atom, bromine atom and iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The term "partially halogenated aryl group" refers to an aryl group in which part of the hydrogen atoms are substituted with halogen atoms, and the term "completely halogenated aryl group" refers to an aryl group in which all of hydrogen atoms are substituted with halogen atoms.

$R^{31}$ is preferably an alkyl group of 1 to 4 carbon atoms which has no substituent or a fluorinated alkyl group of 1 to 4 carbon atoms.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

$R^{32}$ is preferably a cyano group, an alkyl group of 1 to 8 carbon atoms having no substituent or a fluorinated alkyl group of 1 to 8 carbon atoms.

Preferred examples of the oxime sulfonate-based acid generator include compounds represented by general formula (B-2) or (B-3) shown below.

[Chemical Formula 79]

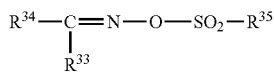

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 80]

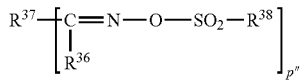

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group and phenanthryl group, and heteroaryl groups in which part of the carbon atoms constituting the ring(s) of these groups are substituted with a hetero atom such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group for the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent or the halogenated alkyl group for $R^{36}$ include the same groups as those described above for the alkyl group having no substituent or the halogenated alkyl group for $R^{33}$.

Examples of the divalent or trivalent aromatic hydrocarbon group for $R^{37}$ include groups in which one or two hydrogen atoms have been removed from the aryl group described above for $R^{34}$.

Examples of the alkyl group having no substituent and the halogenated alkyl group for $R^{38}$ include the same groups as those described above for the alkyl group having no substituent or the halogenated alkyl group for $R^{35}$.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropyl sulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropyl sulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described on pages 65 to 86) may also be used favorably.

Furthermore, the following compounds may also be used as preferred examples.

[Chemical Formula 81]

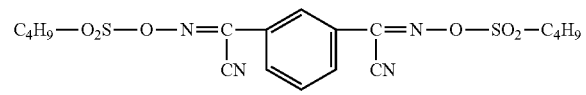

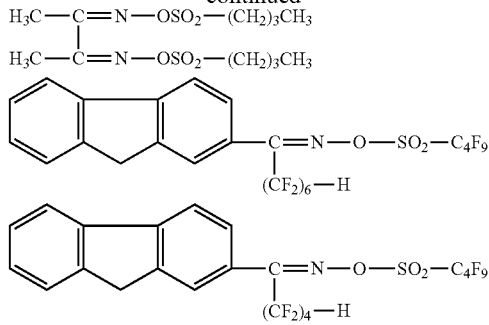

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or a combination of two or more types of acid generators may be used.

The amount of the component (B) within the resist composition is preferably from 0.5 to 60 parts by weight, more preferably from 1 to 50 parts by weight, and still more preferably from 1 to 40 parts by weight, relative to 100 parts by weight of the component (A). When the amount of the component (B) is within the above range, formation of a resist pattern can be performed satisfactorily. Further, when each component of the resist composition is dissolved in an organic solvent, a uniform solution can be obtained, and the storage stability tends to improve, both of which are desirable.

<Other Optional Components>

[Component (D)]

The resist composition of the present aspect may also include, as an optional component, a basic compound (D) (hereafter also referred to as "component (D)") that does not correspond with the aforementioned component (C).

There are no particular limitations on the component (D), and a conventional compound can be used, provided it is a compound that is relatively basic compared with the component (B), functions as an acid diffusion control agent, namely a quencher which traps the acid generated from the aforementioned component (A) and the component (B) and the like upon exposure, and does not correspond with the above definition for the component (C). Examples of the component (D)

include amines such as aliphatic amines and aromatic amines, and of these, an aliphatic amine is preferable, and a secondary aliphatic amine or tertiary aliphatic amine is particularly desirable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), cyclic amines, and other aliphatic amines.

The alkyl group for the above alkylamines may be linear, branched or cyclic.

When the alkyl group is a linear or branched group, the group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Specific examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Examples of the alkyl group in the hydroxyalkyl group within the aforementioned alkyl alcohol amines include the same groups as those mentioned above for the alkyl group within the alkylamines.

Specific examples of the alkylamines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-hexylamine, tri-n-pentylamine, tri-n-heptyl amine, tri-n-octylamine, tri-n-nonyl amine, tri-n-decanyl amine and tri-n-dodecylamine.

Specific examples of the alkyl alcohol amines include diethanolamine, triethanolamine, diisopropanolamine, triisopropanolamine, di-n-octanolamine, tri-n-octanolamine, stearyldiethanolamine and lauryldiethanolamine.

Among the above compounds, trialkylamines of 5 to 10 carbon atoms are preferable, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris {2-(1-methoxyethoxy)ethyl}amine, tris {2-(1-ethoxyethoxy)ethyl}amine, tris {2-(1-ethoxypropoxy) ethyl}amine, tris[2-{2-(2-hydroxyethoxy)ethoxy}ethyl] amine, and triethanolamine triacetate.

Examples of the aromatic amines include aniline, pyridine, 4-dimethylaminopyridine, pyrrole, indole, pyrazole, imidazole, and derivatives of these compounds, as well as diphenylamine, triphenylamine, tribenzylamine, 2,6-diisopropylaniline and N-tert-butoxycarbonylpyrrolidine.

As the component (D), one type of compound may be used alone, or a combination of two or more types of compounds may be used.

When the resist composition of the present invention includes the component (D), the component (D) is typically used in an amount of 0.01 to 5.0 parts by weight, relative to 100 parts by weight of the component (A). By ensuring that the amount of the component (D) is within this range, the shape of the resist pattern and the post exposure stability of the latent image formed by the pattern-wise exposure of the resist layer are improved.

[Component (F)]

A fluorine additive (hereafter referred to as "component (F)") may also be added to the resist composition to impart the resist film with water repellency. For example, the fluorine-containing polymeric compounds disclosed in Japanese Unexamined Patent Application, First Publication No. 2010-002870 can be used as the component (F).

More specific examples of the component (F) include polymers having a structural unit (f1) represented by formula (f1-1) shown below. This polymer is preferably a polymer composed solely of the structural unit (f1) (a homopolymer); a copolymer composed of a structural unit (f1) represented by formula (f1-1) shown below, and the aforementioned structural unit (a1); or a copolymer composed of a structural unit (f1) represented by formula (f1-1) shown below, a structural unit derived from acrylic acid or methacrylic acid, and the aforementioned structural unit (a1). The structural unit (a1) that may be copolymerized with the structural unit (f1) represented by formula (f1-1) shown below is preferably the aforementioned structural unit (a11), is more preferably a structural unit represented by the aforementioned formula (a1-1), and is most preferably a structural unit represented by formula (a1-1-02).

[Chemical Formula 82]

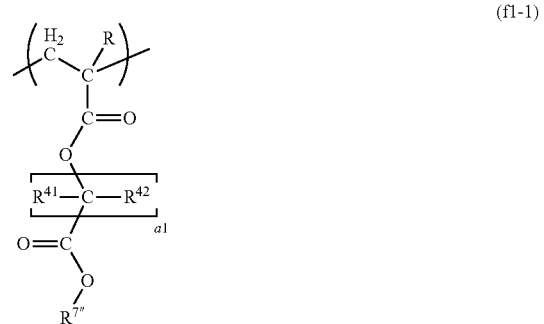

(f1-1)

In the formula, R is the same as defined above, and each of $R^{41}$ and $R^{42}$ independently represents a hydrogen atom, a halogen atom, an alkyl group of 1 to 5 carbon atoms or a halogenated alkyl group of 1 to 5 carbon atoms, wherein the plurality of $R^{41}$ groups or $R^{42}$ groups may be the same or different. a1 represents an integer of 1 to 5, and $R^{7\prime\prime\prime}$ represents an organic group containing a fluorine atom.

In formula (f1-1), R is the same as defined above. R is preferably a hydrogen atom or a methyl group.

In formula (f1-1), examples of the halogen atom for $R^{41}$ and $R^{42}$ include a fluorine atom, chlorine atom, bromine atom and iodine atom, and a fluorine atom is particularly desirable. Examples of the alkyl group of 1 to 5 carbon atoms for $R^{41}$ and $R^{42}$ include the same groups as those mentioned above for the alkyl group of 1 to 5 carbon atoms for R, and a methyl group or ethyl group is preferable. Examples of the halogenated alkyl group of 1 to 5 carbon atoms for $R^{41}$ and $R^{42}$ include groups in which part or all of the hydrogen atoms of an aforementioned alkyl group of 1 to 5 carbon atoms have each been substituted with a halogen atom. Examples of this halogen atom include a fluorine atom, chlorine atom, bromine atom and iodine atom, and a fluorine atom is particularly desirable. Of the various possibilities, each of $R^{41}$ and $R^{42}$ is preferably a hydrogen atom, a fluorine atom or an alkyl group of 1 to 5 carbon atoms, and is more preferably a hydrogen atom, fluorine atom, methyl group or ethyl group.

In formula (f1-1), a1 represents an integer of 1 to 5, and is preferably an integer of 1 to 3, and more preferably 1 or 2.

In formula (f1-1), ), $R^{7\prime\prime}$ represents an organic group containing a fluorine atom, and is preferably a hydrocarbon group containing a fluorine atom.

The hydrocarbon group containing a fluorine atom may be a linear, branched or cyclic group, and preferably contains 1 to 20 carbon atoms, more preferably 1 to 15 carbon atoms, and most preferably 1 to 10 carbon atoms.

Further, in the hydrocarbon group containing a fluorine atom, it is preferable that at least 25% of the hydrogen atoms in the hydrocarbon group are fluorinated, and more preferable that 50% or more of the hydrogen atoms are fluorinated. In terms of enhancing the hydrophobicity of the resist film during immersion exposure, it is particularly desirable that 60% or more of the hydrogen atoms are fluorinated.

Of the various possibilities, $R^{7\prime\prime}$ is preferably a fluorinated hydrocarbon group of 1 to 5 carbon atoms, and most preferably a methyl group, —$CH_2$—$CF_3$, —$CH_2$—$CF_2$—$CF_3$, —$CH(CF_3)_2$, —$CH_2$—$CH_2$—$CF_3$, or —$CH_2$—$CH_2$—$CF_2$—$CF_2$—$CF_2$—$CF_3$.

The weight-average molecular weight (Mw) (the polystyrene equivalent value determined by gel permeation chromatography (GPC)) of the component (F) is preferably within a range from 1,000 to 50,000, more preferably from 5,000 to 40,000, and most preferably from 10,000 to 30,000. When the weight-average molecular weight is not more than the upper limit of the above range, the component (F) exhibits satisfactory solubility in a resist solvent when used as a resist. On the other hand, when the weight-average molecular weight is at least as large as the lower limit of the above range, the dry etching resistance and the cross-sectional shape of the resist pattern are improved.

Further, although there are no particular limitations on the dispersity (Mw/Mn) of the component (F), the dispersity is preferably from 1.0 to 5.0, more preferably from 1.0 to 3.0, and most preferably from 1.2 to 2.5.

The component (F) can be obtained, for example, by polymerizing the monomers corresponding with each of the structural units by a conventional radical polymerization or the like, using a radical polymerization initiator such as dimethyl-2,2-azobis(2-methylpropionate) (V-601) or azobisisobutyronitrile (AIBN). Further, by using a chain transfer agent such as HS—$CH_2$—$CH_2$—$CH_2$—$C(CF_3)_2$—OH during the polymerization, a —$C(CF_3)_2$—OH group may be introduced at the terminals of the polymer. This type of copolymer having an introduced hydroxyalkyl group in which part of the hydrogen atoms of the alkyl group have been substituted with fluorine atoms is effective in reducing defects and line edge roughness (LER: unevenness in the side walls of a line pattern).

As the monomers that yield each of the structural units, commercially available monomers may be used, or monomers that have been synthesized using conventional methods may be used.

As the component (F), a single compound may be used alone, or a combination of two or more compounds may be used.

In those cases where the component (F) is included, the component (F) is typically added in an amount of 0.5 to 10 parts by weight, relative to 100 parts by weight of the component (A).

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes, which may be added in appropriate amounts.

The resist composition of the present invention can be prepared by dissolving the materials for the resist composition in an organic solvent (hereafter frequently referred to as "component (S)").

The component (S) may be any organic solvent which can dissolve the respective components to give a uniform solution, and one or more types of organic solvent can be appropriately selected from those solvents that have been conventionally known as solvents for chemically amplified resists.

Examples of the component (S) include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives, including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents can be used individually, or as a mixed solvent containing two or more solvents.

Among these solvents, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be determined as appropriate, taking into consideration the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as the polar solvents, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of PGMEA, EL or an aforementioned mixed solvent of PGMEA and a polar solvent, with γ-butyrolactone is also preferable. The mixing ratio (former:latter) of such a mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

As a result of including the component (C), the resist composition of the present invention exhibits excellent lithography properties such as resolution and in-plane uniformity of the pattern dimensions.

Further, by using the component (G) in combination with the component (C), the storage stability of the resist composition of the present invention can be improved, and fluctuations in the composition performance caused by differences in the storage temperature or storage period can be minimized.

When a resin component containing the aforementioned structural unit (f1) is included as the component (F), the formed resist film has a high degree of surface hydrophobicity (for example, a receding angle of 65° or greater). As described above, this high degree of hydrophobicity is useful for immersion lithography, but when the component (G) is not used, then the hydrophobicity tends to deteriorate (resulting in a lower receding angle) upon storage, particularly if the storage temperature is high. By also adding the component (G) to the composition, this type of variation in the contact angle can be suppressed.

As described above, the reason that including the component (G) results in improved storage stability is thought to be as follows. When the component (C) is used, and particularly when a salt having an anion with a pKa value exceeding 4 is used as the component (C), the component (C) subjects the other components within the resist composition to nucleophilic attack, increasing the likelihood of a deterioration in the storage stability. By also including the component (G) having a pKa of 4 or less, anion exchange facilitates the conversion of the component (C) to an acid and the component (G) to a salt. The salt generated in this manner is less likely to initiate nucleophilic attack on the other components in the resist composition than the component (C) prior to the anion exchange. It is thought that, as a result, the storage stability of the resist composition improves.

<<Method of Forming Resist Pattern>>

The method of forming a resist pattern according to the present invention includes: using the aforementioned resist composition of the present invention to form a resist film on a substrate, conducting exposure of the resist film, and developing the resist film to form a resist pattern.

The method of forming a resist pattern according to the present invention can be performed, for example, as follows.

First, the resist composition of the present invention is applied onto a substrate using a spinner or the like, and a bake treatment (post applied bake (PAB)) is conducted under temperature conditions of 80 to 150° C. for 40 to 120 seconds, and preferably 60 to 90 seconds, to form a resist film.

Subsequently, the resist film is selectively exposed using an exposure apparatus such as a KrF excimer laser exposure apparatus, an ArF excimer laser exposure apparatus, an EB lithography apparatus or an EUV exposure apparatus, either by irradiation through a mask having a predetermined pattern formed therein (namely, a mask pattern), or by patterning via direct irradiation with EB without using a mask pattern, and the resist film is then subjected to a bake treatment (post exposure bake (PEB)) under temperature conditions of 80 to 150° C. for 40 to 120 seconds, and preferably 60 to 90 seconds.

Next, the resist film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

The substrate is not specifically limited, and a conventionally known substrate can be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (a lower-layer organic film) and at least one layer of a resist film (an upper-layer resist film) are provided on a substrate, and a resist pattern formed on the upper-layer resist film is used as a mask to conduct patterning of the lower-layer organic film. This method is considered as being capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (triple-layer resist method).

The wavelength to be used for exposure is not particularly limited, and the exposure can be conducted using various forms of radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective for use with a KrF excimer laser, ArF excimer laser, EB or EUV.

The exposure of the resist film may employ either a general exposure (dry exposure) conducted in air or an inert gas such as nitrogen, or immersion exposure (liquid immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethyl ammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon-based solvents.

If required, known additives can be added to the organic developing solution. Examples of these additives include surfactants. There are no particular limitations on the surfactants, and ionic and nonionic fluorine-based surfactants and/or silicon-based surfactants can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following the developing treatment in a solvent developing process include those organic solvents among the solvents described above for the organic solvent of the organic developing solution which exhibit poor dissolution of the resist pattern. In general, at least one type of solvent selected from among hydrocarbon-based solvents, ketone-based solvents, ester-based solvents, alcohol-based solvents, amide-based solvents and ether-based solvents is used. Among these, at least one solvent selected from among hydrocarbon-based solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

EXAMPLES

A more detailed description of the present invention is presented below based on a series of examples, but the present invention is in no way limited by these examples.

Synthesis Example 1

Synthesis of N-[2-(adamantan-1-ylcarbonyloxy) ethyl]trifluoromethanesulfonamide

A glass flask fitted with a thermometer and a condenser was charged with 100 g (0.52 mol) of trifluoromethanesulfonamide ethanol, 108.6 g (0.54 mol) of 1-adamantanecarboxylic acid, para-toluenesulfonic acid (0.1 mol) and 500 g of toluene, and a Dean-Stark dehydration apparatus was used to perform dehydration under reflux conditions. Refluxing for 9 hours enabled removal of approximately 9 ml of water. The resulting reaction mixture was dissolved in 500 g of ethyl acetate, and the thus obtained solution was washed twice with a saturated solution of sodium bicarbonate, once with 1N—HCl, and once with a saturated solution of sodium chloride. The organic phase was then dried over sodium sulfate, the solvent was removed by distillation under reduced pressure, and the product was recrystallized in hexane, yielding 140 g of N-[2-(adamantan-1-ylcarbonyloxy)ethyl]trifluoromethanesulfonamide (yield: 75%, purity: 99%).

The obtained compound was analyzed by NMR. The results are shown below.

$^{1}$H NMR (measurement solvent: deuterated chloroform, reference: tetramethylsilane); δ=5.43 to 5.35 (brs, 1H), 4.20 (t, 2H, J=5.2 Hz), 3.53 (td, 2H, J=5.2 Hz), 2.08 to 1.98 (brs, 3H), 1.91 to 1.87 (brs, 6H), 1.75 to 1.67 (brs, 6H).

$^{19}$F NMR (measurement solvent: deuterated chloroform, reference: trichlorofluoromethane); δ=−77.8 (s, 3F).

Based on the above results, it was confirmed that the obtained compound was N-[2-(adamantan-1-ylcarbonyloxy)ethyl]trifluoromethanesulfonamide, having the structure shown below in formula (1).

[Chemical Formula 83]

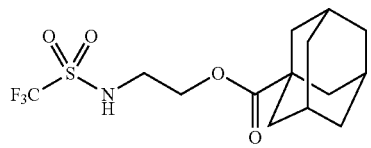

(1)

Synthesis Example 2

Synthesis of triphenylsulfonium N-[2-(adamantan-1-ylcarbonyloxy)ethyl]trifluoromethanesulfonamide A 3 L reactor was charged with 240 g (0.63 mol) of the N-[2-(adamantan-1-ylcarbonyloxy)ethyl]trifluoromethanesulfonamide obtained in the above Synthesis Example 1, 800 mL of water and 800 mL of chloroform, and with the temperature inside the reactor maintained at 0° C., 240 g (0.68 mol) of an 11% NaOH solution was gradually added dropwise to the reactor, and the resulting mixture was then stirred for 30 minutes. Subsequently, 244 g (0.71 mol) of triphenylsulfonium bromide was added to the reactor, and the reaction mixture was stirred at room temperature for 15 hours. A phase separation was then performed, and the obtained organic layer was washed 4 times with 800 mL of water and then concentrated under reduced pressure. The resulting yellow oily product was dissolved in acetonitrile and recrystallized in IPE, yielding 360 g of triphenylsulfonium N-[2-(adamantan-1-ylcarbonyloxy)ethyl]trifluoromethanesulfonamide. The purity of the product was 99% and the yield was 87%.

The obtained compound was analyzed by NMR. The results are shown below.

$^{1}$H NMR (measurement solvent: deuterated DMSO, reference: tetramethylsilane); δ=7.88 to 7.76 (m, 15H, Ph$_3$S$^+$), 3.85 (t, 2H), 3.02 (t, 2H), 2.08 to 1.98 (brs, 3H), 1.91 to 1.87 (brs, 6H), 1.75 to 1.67 (brs, 6H).

$^{19}$F NMR (measurement solvent: deuterated DMSO, reference: trichlorofluoromethane); δ=−75.5 (s, 3F).

Based on the above results, it was confirmed that the obtained compound was triphenylsulfonium N-[2-(adamantan-1-ylcarbonyloxy)ethyl]trifluoromethanesulfonamide, having the structure shown below in formula (2).

[Chemical Formula 84]

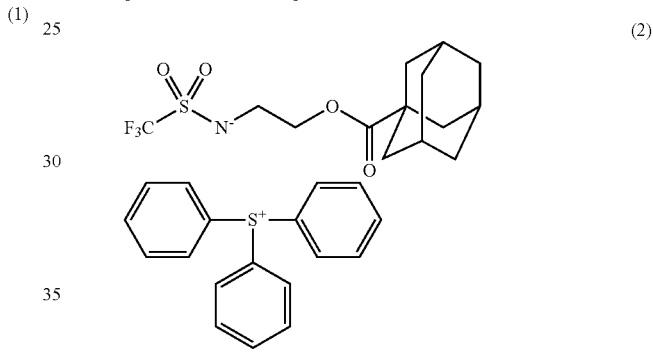

(2)

Examples 1 to 4

Comparative Examples 1 to 3

The components shown in Table 1 were mixed together and dissolved to prepare a series of resist compositions.

TABLE 1

|  | Component (A) | Component (B) | | Component (C) | Component (G) | Component (F) | Component (S) | |
| --- | --- | --- | --- | --- | --- | --- | --- | --- |
| Example 1 | (A)-1 | (B)-1 | (B)-2 | (C)-1 | (G)-1 | (F)-1 | (S)-1 | (S)-2 |
|  | [100] | [11.5] | [1.9] | [3.0] | [1.8] | [2.5] | [10.0] | [2900] |
| Example 2 | (A)-1 | (B)-1 | (B)-2 | (C)-1 | (G)-2 | (F)-1 | (S)-1 | (S)-2 |
|  | [100] | [11.5] | [1.9] | [3.0] | [1.5] | [2.5] | [10.0] | [2900] |
| Example 3 | (A)-1 | (B)-1 | (B)-2 | (C)-1 | (G)-3 | (F)-1 | (S)-1 | (S)-2 |
|  | [100] | [11.5] | [1.9] | [3.0] | [1.2] | [2.5] | [10.0] | [2900] |
| Example 4 | (A)-1 | (B)-1 | (B)-2 | (C)-1 | (G)-4 | (F)-1 | (S)-1 | (S)-2 |
|  | [100] | [11.5] | [1.9] | [3.0] | [0.9] | [2.5] | [10.0] | [2900] |
| Comparative example 1 | (A)-1 | (B)-1 | (B)-2 | (C)-1 | (G')-1 | (F)-1 | (S)-1 | (S)-2 |
|  | [100] | [11.5] | [1.9] | [3.0] | [1.7] | [2.5] | [10.0] | [2900] |
| Comparative example 2 | (A)-1 | (B)-1 | (B)-2 | (C)-1 | (G')-2 | (F)-1 | (S)-1 | (S)-2 |
|  | [100] | [11.5] | [1.9] | [3.0] | [1.7] | [2.5] | [10.0] | [2900] |

TABLE 1-continued

| | Component (A) | Component (B) | | Component (C) | Component (G) | Component (F) | Component (S) | |
|---|---|---|---|---|---|---|---|---|
| Comparative example 3 | (A)-1 [100] | (B)-1 [11.5] | (B)-2 [1.9] | (C)-1 [3.0] | (G')-3 [2.6] | (F)-1 [2.5] | (S)-1 [10.0] | (S)-2 [2900] |

In Table 1, the numerical values in brackets [ ] indicate the amount added (in parts by weight), whereas the reference symbols have the following meanings.
(A)-1: a polymeric compound represented by chemical formula (A)-1 shown below [Mw = 5,500, Mw/Mn = 1.42, polymer composition ratio (molar ratio): l/m/n/o = 45/40/5/10].
(B)-1: a compound represented by chemical formula (B)-1 shown below.
(B)-2: a compound represented by chemical formula (B)-2 shown below.
(C)-1: the compound represented by formula (2) obtained in Synthesis Example 2.
(F)-1: a polymeric compound represented by chemical formula (F)-1 shown below [Mw = 2,400, Mw/Mn = 1.38, polymer composition ratio (molar ratio): l = 100].
(G)-1 to (G)-4, and (G')-1 to (G')-3: compounds represented by chemical formulas (G)-1 to (G)-4, and (G')-1 to (G')-3 respectively shown below, having pKa values as shown. Of these compounds, (G')-3 represents the compound represented by formula (1) obtained in Synthesis Example 1.
(G')-3: the compound obtained in Synthesis Example 1.
(S)-1: γ-butyrolactone.
(S)-2: a mixed solvent of PGMEA/PGME/cyclohexanone = 45/30/25 (weight ratio).

[Chemical Formula 85]

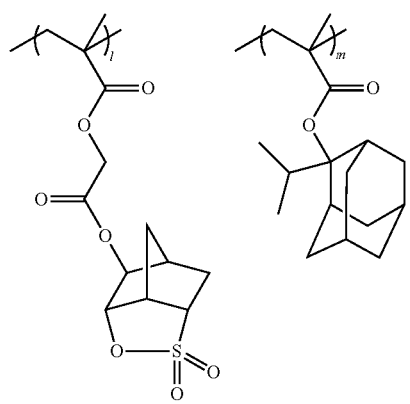

(A)-1

[Chemical Formula 86]

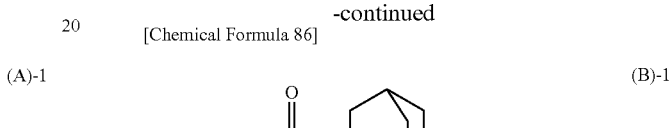

(B)-1

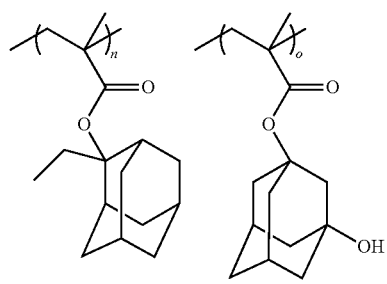

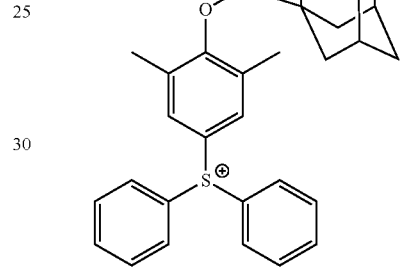

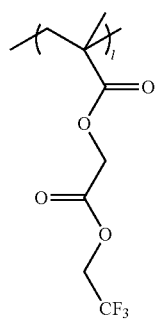

(F)-1

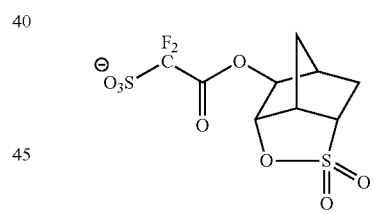

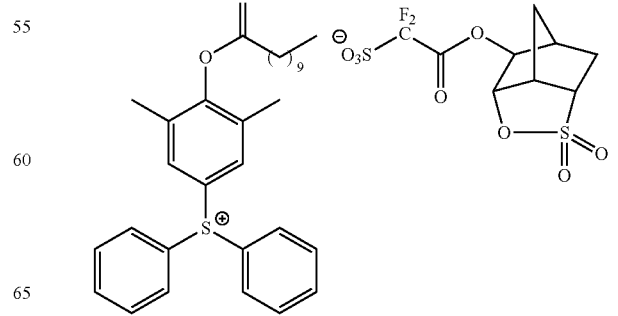

(B)-2

-continued

[Chemical Formula 87]

(G)-1
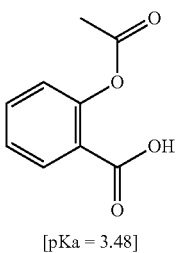
[pKa = 3.48]

(G)-2
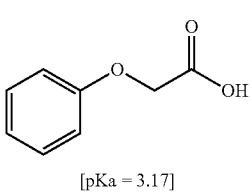
[pKa = 3.17]

(G)-3
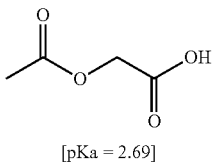
[pKa = 2.69]

(G)-4
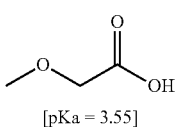
[pKa = 3.55]

(G')-1
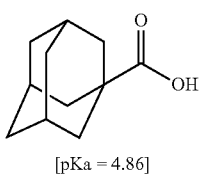
[pKa = 4.86]

(G')-2
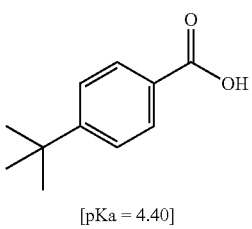
[pKa = 4.40]

(G')-3
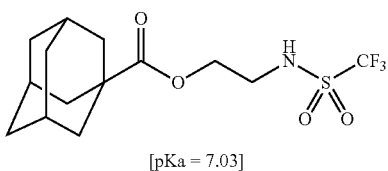
[pKa = 7.03]

The obtained resist compositions were subjected to the evaluations described below.

The inventors of the present invention found that when the receding angle was less than 65°, the component (B) and the like were eluted from the resist film into the immersion medium (water) when immersion exposure was performed, increasing the likelihood of contamination of the exposure apparatus, and therefore for those resist compositions for which the receding angle was less than 65° following storage at 40° C. in the storage stability evaluation described below, resist pattern formation and evaluation of the CDU with respect to resist pattern were not performed.

Resist pattern formation and evaluation of the CDU with respect to resist pattern were performed using resist compositions that had been stored for one month at 40 C.

[Storage Stability]

Following storage of the resist composition of each example at either –20° C. or 40° C. for one month, a resist film was formed using the procedure described below, and the receding angle (°) and the static contact angle (°) were measured. The receding angle is measured by placing a water droplet on the resist film and inclining the resist film until the water droplet begins to fall, and describes the contact angle at the trailing edge of the falling water droplet. The static contact angle is the contact angle when the resist film is horizontal. The results are shown in Table 2.

(Formation of Resist Film)

An organic antireflection film composition ARC29A (a product name, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 89 nm. Each of the resist compositions was applied onto a thus formed antireflection film using a spinner, and was then subjected to a prebake (PAB) treatment and dried on a hotplate at 80° C. for 60 seconds, thereby forming a resist film having a film thickness of 100 nm.

(Measurement of Receding Angle)

A water droplet was dripped onto the surface of the resist film formed using the procedure described above (the resist film prior to exposure), and a DROP MASTER-700 apparatus (a product name, manufactured by Kyowa Interface Science Co., Ltd.) was used to measure the receding angle (measurement of receding angle: 50 μL of water).

(Measurement of Static Contact Angle)

A water droplet was dripped onto the surface of the resist film formed using the procedure described above (the resist film prior to exposure), and a DROP MASTER-700 apparatus (a product name, manufactured by Kyowa Interface Science Co., Ltd.) was used to measure the static contact angle (measurement of contact angle: 2 μL of water).

[Formation of Resist Pattern]

An organic antireflection film composition ARC29A (a product name, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 89 nm.

The resist composition of each example was applied onto a thus formed antireflection film using a spinner, and was then subjected to a prebake (PAB) treatment and dried on a hotplate at 80° C. for 60 seconds, thereby forming a resist film having a film thickness of 100 nm.

Next, using an ArF exposure apparatus for immersion lithography (product name: NSR-S609B, manufactured by Nikon Corporation, NA (numerical aperture)=1.07, Annular (Out-0.97/In-0.78) w/XY-Pol., immersion medium: water), the resist film was selectively irradiated with an ArF excimer laser (193 nm) through a photomask (binary).

Subsequently, a PEB treatment was conducted at 80° C. for 60 seconds, and the resist film was then developed for 20 seconds at 23° C. in a 2.38% by weight aqueous solution of TMAH (product name: NMD-W, manufactured by Tokyo Ohka Kogyo Co., Ltd.), subsequently rinsed for 30 seconds with pure water, and then dried by shaking. The resist film was then subjected to a post bake by heating on a hotplate at 100° C. for 45 seconds.

As a result, in each of the examples, a contact hole pattern (hereafter referred to as a "CH pattern") was formed on the resist film in which holes having a hole diameter of 70 nm were arranged with uniform spacing therebetween at a pitch of 122.50 nm.

[CDU (In-plane Uniformity of Pattern Dimension)]

For the CH pattern of the target size obtained in the aforementioned "Formation of Resist Pattern", 100 holes within the CH pattern were inspected from above using a measuring SEM (scanning electron microscope, accelerating voltage: 300 V, product name: S-9380, manufactured by Hitachi High-Technologies Corporation), and the hole diameter (nm) of each hole was measured. The value of 3 times the standard deviation (σ) calculated from the measurement results (namely, 3σ) was determined. The result is shown in Table 2 as the CDU value.

The smaller the value of 3σ determined in this manner, the higher the degree of dimensional (CD) uniformity for the plurality of holes formed in the resist film.

TABLE 2

| | Receding angle (°) | | Static contact angle (°) | | |
|---|---|---|---|---|---|
| | −20° C. | 40° C. | −20° C. | 40° C. | CDU |
| Example 1 | 68.2 | 68.3 | 85.5 | 85.0 | 4.0 |
| Example 2 | 67.8 | 68.4 | 85.5 | 85.5 | 4.2 |
| Example 3 | 67.7 | 68.1 | 85.9 | 84.7 | 4.0 |
| Example 4 | 67.2 | 67.4 | 85.1 | 83.6 | 4.0 |
| Comparative example 1 | 64.9 | 47.5 | 84.9 | 74.2 | — |
| Comparative example 2 | 68.3 | 38.9 | 85.3 | 75.0 | — |
| Comparative example 3 | 70.1 | 59.9 | 56.2 | 84.4 | — |

As is evident from the above results, for each of the resist compositions of Examples 1 to 4, the contact angles (receding angle and static contact angle) for the resist film formed following storage of the composition for one month at 40° C. were substantially the same as the contact angles for the resist film formed following storage of the composition for one month at −20° C., indicating excellent storage stability. Further, the resist compositions also exhibited superior lithography properties, and a fine pattern was able to be formed with favorable CDU.

In contrast, for each of the resist compositions of Comparative Examples 1 to 3, the contact angles for the resist film formed following storage of the composition for one month at 40° C. were considerably lower than the contact angles for the resist film formed following storage of the composition for one month at −20° C. It is thought that this is because the component (F) had been decomposed by the component (C) during storage.

What is claimed is:

1. A resist composition comprising a base component (A) that exhibits changed solubility in a developing solution under action of acid;
    a photoreactive quencher (C);
    an acid generator component (B) that generates acid upon exposure, wherein said acid generator component (B) comprises a compound represented by formula (b-1) shown below;

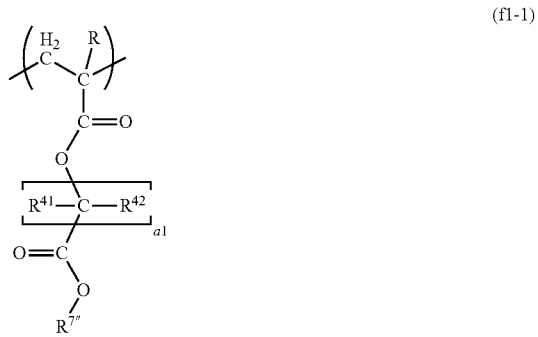

(b-1)

wherein each of $R^{1''}$ to $R^{3''}$ independently represents an aryl group, alkyl group or alkenyl group which may have a substituent, wherein two of $R^{1''}$ to $R^{3''}$ may be bonded to each other to form a ring in combination with the sulfur atom shown in the formula, and $R^{4''}$ represents an alkyl group, halogenated alkyl group, aryl group or alkenyl group, and has a group $X^3$-Q' as a substituent; Q' represents a divalent linking group containing an oxygen atom; and $X^3$ represents a hydrocarbon group of 1 to 30 carbon atoms which may have a substituent, and a fluorine additive (F) containing a polymer having a structural unit represented by formula (f1-1) shown below;

(f1-1)

wherein R represents a hydrogen atom, an alkyl group of 1 to 5 carbon atoms or a halogenated alkyl group of 1 to 5 carbon atoms; each of $R^{41}$ and $R^{42}$ independently represents a hydrogen atom, a halogen atom, an alkyl group of 1 to 5 carbon atoms or a halogenated alkyl group of 1 to 5 carbon atoms, wherein the plurality of $R^{41}$ groups or $R^{42}$ groups may be the same or different; a1 represents an integer of 1 to 5; and $R^{7''}$ represents an organic group containing a fluorine atom;

an acid (G) having a pKa of 4 or less, wherein the acid (G) comprises at least one compound selected from the group consisting of a compound (G1) represented by general formula (g1) shown below, a compound (G2) represented by general formula (g2) shown below, and a compound (G3) represented by general formula (g3) shown below:

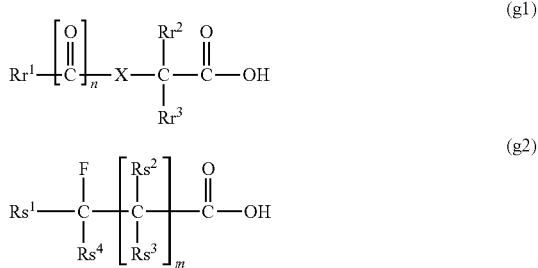

(g1)

(g2)

-continued (g3)

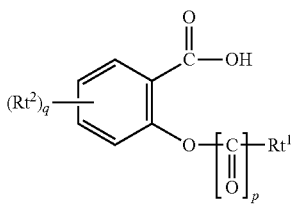

wherein Rr¹ represents a hydrogen atom or a hydrocarbon group of 1 to 20 carbon atoms which may have a substituent, each of Rr² and Rr³ independently represents a hydrogen atom or a hydrocarbon group of 1 to 20 carbon atoms which may have a substituent, and two or three of Rr¹ to Rr³ may be bonded to each other to form a ring, X represents an oxygen atom or a sulfur atom, n represents 0 or 1, Rs¹ represents a hydrogen atom, a fluorine atom, or a hydrocarbon group of 1 to 20 carbon atoms which may have a substituent, each of Rs² and Rs³ independently represents a hydrogen atom or a hydrocarbon group of 1 to 20 carbon atoms which may have a substituent, and two or three of Rs¹ to Rs³ may be bonded to each other to form a ring, Rs⁴ represents a fluorine atom or a fluorinated alkyl group, m represents 0 or 1, Rt¹ represents a chain-like alkyl group of 1 to 15 carbon atoms or a cyclic alkyl group of 3 to 20 carbon atoms, Rt² represents a halogen atom, hydroxyl group, alkoxy group, or alkyl group of 1 to 5 carbon atoms, p represents 0 or 1, and q represents an integer of 0 to 4.

2. The resist composition according to claim 1, wherein the photoreactive quencher (C) comprises at least one compound selected from the group consisting of a compound (C1) represented by general formula (c1) shown below, a compound (C2) represented by general formula (c2) shown below, and a compound (C3) represented by general formula (c3) shown below:

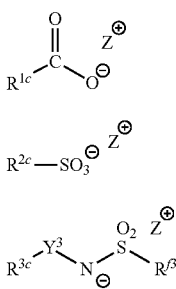

wherein R¹ᶜ represents a hydrocarbon group which may have a substituent, R²ᶜ represents a hydrocarbon group of 1 to 30 carbon atoms which may have a substituent, provided that a carbon atom adjacent to S is not substituted with a fluorine atom, R³ᶜ represents an organic group, Y³ represents a linear, branched or cyclic alkylene group or an arylene group, Rf³ represents a hydrocarbon group containing a fluorine atom, and each Z⁺ independently represents an organic cation.

3. The resist composition according to claim 1, wherein the base component (A) is a base component (A0) that exhibits increased polarity under action of acid.

4. A method of forming a resist pattern, the method comprising: forming a resist film on a substrate using the resist composition according to claim 1, conducting exposure of the resist film, and developing the resist film to form a resist pattern.

5. The resist composition according to claim 1, wherein the acid generator component (B) comprises at least one anion moiety selected from the group consisting of anion moieties represented by formulae (b1) to (b9) shown below:

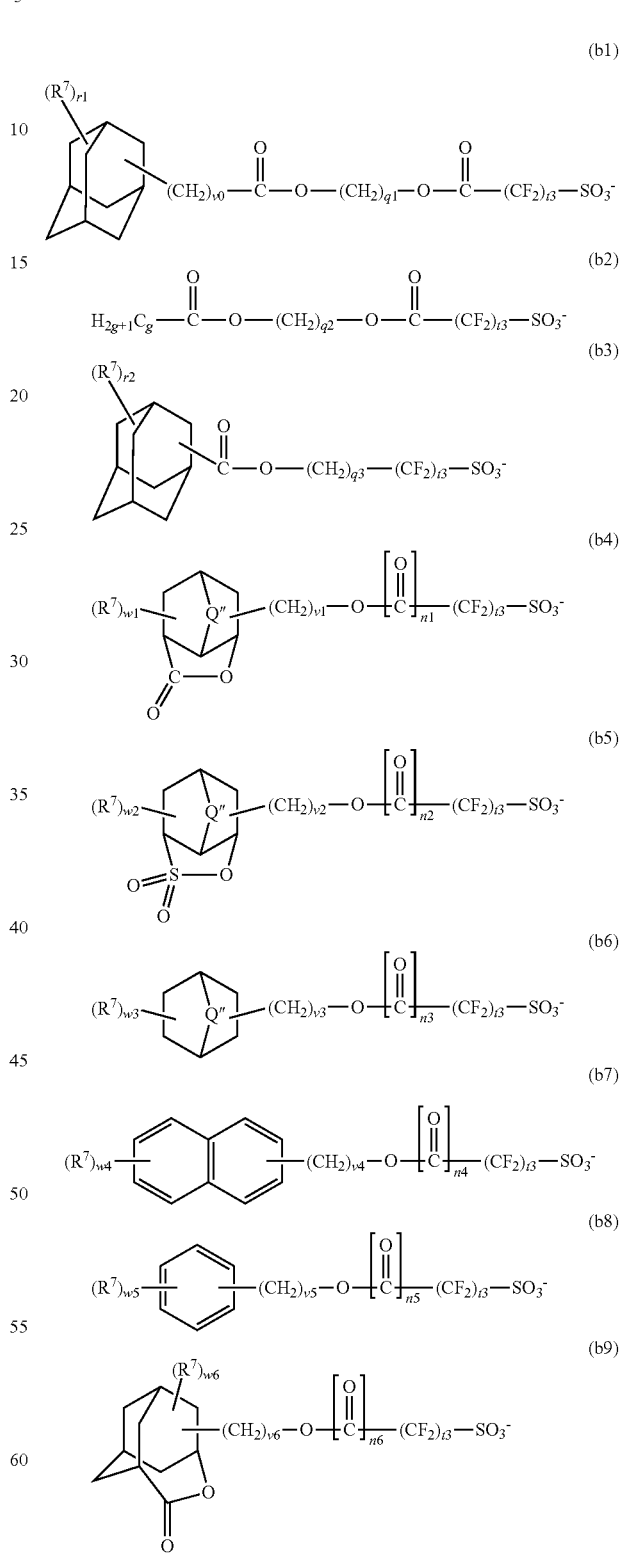

wherein each of q1 and q2 independently represents an integer of 1 to 5, q3 represents an integer of 1 to 12, t3 represents an integer of 1 to 3, each of r1 and r2 independently represents an integer of 0 to 3, g represents an integer of 1 to 20, $R^7$ represents a substituent, each of n1 to n6 independently represents 0 or 1, each of v0 to v6 independently represents an integer of 0 to 3, each of w1 to w6 independently represents an integer of 0 to 3, and Q" represents an alkylene group of 1 to 5 carbon atoms, —O—, —S—, —O—$R^{94'}$— or —S—$R^{95'}$—, wherein each of $R^{94'}$ and $R^{95'}$ independently represents an alkylene group of 1 to 5 carbon atoms.

6. The resist composition according to claim 1, wherein the base component (A) comprises a resin component (A1) that exhibits increased polarity under the action of acid, and the resin component (A1) comprises a structural unit (a1) containing an acid-decomposable group that exhibits increased polarity under the action of acid, and a structural unit containing an —$SO_2$-containing cyclic group.

* * * * *